US008709836B2

(12) United States Patent
Miyairi et al.

(10) Patent No.: US 8,709,836 B2
(45) Date of Patent: Apr. 29, 2014

(54) METHOD FOR MANUFACTURING THIN FILM TRANSISTOR AND METHOD FOR MANUFACTURING DISPLAY DEVICE

(75) Inventors: Hidekazu Miyairi, Kanagawa (JP); Takafumi Mizoguchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 186 days.

(21) Appl. No.: 13/175,990

(22) Filed: Jul. 5, 2011

(65) Prior Publication Data

US 2011/0263060 A1 Oct. 27, 2011

Related U.S. Application Data

(63) Continuation of application No. 12/695,802, filed on Jan. 28, 2010, now Pat. No. 7,989,234.

(30) Foreign Application Priority Data

Feb. 16, 2009 (JP) .................................. 2009-032939

(51) Int. Cl.
*H01L 21/00* (2006.01)

(52) U.S. Cl.
USPC ........ 438/22; 438/151; 438/29; 257/E21.411; 257/E21.414; 257/E33.053

(58) Field of Classification Search
USPC .................. 257/232, 279, E21.532, E21.411, 257/E21.414, E33.053; 438/22, 29, 38, 45, 438/151, 158, 704, 728, 754
See application file for complete search history.

(56) References Cited

U.S. PATENT DOCUMENTS

| 4,409,134 | A | 10/1983 | Yamazaki |
| 6,008,065 | A | 12/1999 | Lee et al. |
| 6,485,997 | B2 | 11/2002 | Lee et al. |
| 6,493,048 | B1 | 12/2002 | Baek et al. |

(Continued)

FOREIGN PATENT DOCUMENTS

| JP | 61-225869 A | 10/1986 |
| JP | 64-084669 A | 3/1989 |

(Continued)

OTHER PUBLICATIONS

Kim et al.; "A Novel Four-Mask-Count Process Architecture for TFT-LCDs"; SID Digest '00 : SID International Symposium Digest of Technical Papers; 2000; pp. 1006-1009; vol. 31.

(Continued)

*Primary Examiner* — Mark A Laurenzi
(74) *Attorney, Agent, or Firm* — Fish & Richardson P.C.

(57) ABSTRACT

An object is to provide a method for manufacturing a thin film transistor and a display device with reduced number of masks, in which adverse effects of optical current are suppressed. A manufacturing method comprises forming a stack including, from bottom to top, a light-blocking film, a base film, a first conductive film, a first insulating film, a semiconductor film, an impurity semiconductor film, and a second conductive film; performing first etching on the whole thickness of the stack using a first resist mask formed over it; forming a gate electrode layer by side etching the first conductive film in a second etching; forming a second resist mask over the stack; and performing third etching down to the semiconductor film, and partially etching it, using the second resist mask to form a source and drain electrode layer, a source and drain region, and a semiconductor layer.

19 Claims, 45 Drawing Sheets

(56) References Cited

U.S. PATENT DOCUMENTS

| | | |
|---|---|---|
| 6,635,581 B2 | 10/2003 | Wong |
| 7,223,643 B2 | 5/2007 | Ohnuma et al. |
| 7,749,820 B2 | 7/2010 | Miyairi |
| 7,790,483 B2 | 9/2010 | Miyairi et al. |
| 7,883,943 B2 | 2/2011 | Miyairi et al. |
| 7,985,605 B2 | 7/2011 | Komori et al. |
| 7,989,275 B2 | 8/2011 | Miyairi et al. |
| 7,993,991 B2 | 8/2011 | Miyairi et al. |
| 8,035,107 B2 | 10/2011 | Mizoguchi et al. |
| 8,049,221 B2 | 11/2011 | Komori |
| 8,101,442 B2 | 1/2012 | Miyairi et al. |
| 2001/0049064 A1 | 12/2001 | Lee et al. |
| 2006/0290867 A1 | 12/2006 | Ahn et al. |
| 2007/0002249 A1 | 1/2007 | Yoo et al. |
| 2007/0126969 A1 | 6/2007 | Kimura et al. |
| 2007/0139571 A1 | 6/2007 | Kimura |
| 2007/0146591 A1 | 6/2007 | Kimura et al. |
| 2007/0222936 A1 | 9/2007 | Shih |
| 2009/0152559 A1 | 6/2009 | Miyairi et al. |
| 2009/0212296 A1 | 8/2009 | Mizoguchi et al. |
| 2009/0212300 A1 | 8/2009 | Komori |
| 2009/0224249 A1 | 9/2009 | Miyairi et al. |
| 2009/0227051 A1 | 9/2009 | Miyairi et al. |
| 2009/0227076 A1 | 9/2009 | Miyairi |
| 2009/0233389 A1 | 9/2009 | Miyairi et al. |
| 2009/0261369 A1 | 10/2009 | Komori et al. |
| 2009/0311809 A1 | 12/2009 | Miyairi et al. |
| 2010/0187535 A1 | 7/2010 | Suzawa et al. |
| 2010/0210078 A1 | 8/2010 | Miyairi et al. |

FOREIGN PATENT DOCUMENTS

| | | |
|---|---|---|
| JP | 03-011744 A | 1/1991 |
| JP | 03-161938 A | 7/1991 |
| JP | 03-271720 A | 12/1991 |
| JP | 64-084669 A | 3/1998 |
| JP | 2003-179069 A | 6/2003 |
| JP | 2007-133371 A | 5/2007 |
| WO | WO 2008/099528 A1 | 8/2008 |

OTHER PUBLICATIONS

Kim et al.; "A Novel Four-Mask-Count Process Architecture for TFT-LCDs"; SID Digest '00; SID International Symposium Digest of Technical Papers; 2000; pp. 1006-1009; vol. 31.

International Search Report (PCT Patent Application No. PCT/JP2008/071746) dated Dec. 22, 2008.

Written Opinion (PCT Patent Application No. PCT/JP2008/071746) dated Dec. 22, 2008.

C1  50 51 52 53  102 104 106  C2

C1  54 55 114  C2

C1  116B  d₁  C2

50 51 52 53 102 104 106    108 110 112

54 55 114

116C

METHOD FOR MANUFACTURING THIN FILM TRANSISTOR AND METHOD FOR MANUFACTURING DISPLAY DEVICE

CROSS-REFERENCE TO RELATED APPLICATIONS

This application is a continuation of U.S. application Ser. No. 12/695,802, filed Jan. 28, 2010, now allowed, which claims the benefit of a foreign priority application filed in Japan as Serial No. 2009-032939 on Feb. 16, 2009, both of which are incorporated by reference.

BACKGROUND OF THE INVENTION

1. Field of the Invention

The present invention relates to a manufacturing method of a thin film transistor and a display device.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as integrated circuits (ICs) and electro-optical devices. Thin film transistors are rapidly developed as switching elements, particularly for image display devices typified by liquid crystal display devices, electroluminescence (EL) display devices, and the like. In an active matrix liquid crystal display device, a voltage is applied between a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements. An active matrix EL display device means an EL display device which employs a method in which a display pattern is formed on a screen by driving pixels arranged in matrix using switching elements.

The application range of active matrix display devices is expanding and demand for larger screen size, higher definition, and higher aperture ratio is increasing. In addition, it is demanded that the active matrix display devices have high reliability and that a production method of the active matrix display devices offers a high fabrication yield and reduces production cost. As a method for increasing a fabrication yield and reducing production cost, simplification of the process can be given.

In active matrix display devices, thin film transistors are mainly used as switching elements. In manufacturing thin film transistors, reduction in the number of photomasks used in photolithography is important for simplification of the process. For example, when one photomask is added, the following steps are further needed: resist application, prebaking, light exposure, development, postbaking, and the like and, moreover, steps before and after the aforementioned steps, such as film formation, etching, resist removal, cleaning, drying, and the like. The number of steps is significantly increased only by adding one photomask in the manufacturing process. Therefore, many techniques for reducing the number of photomasks in a manufacturing process have been developed.

Thin film transistors are broadly classified into top gate thin film transistors in which a channel formation region is provided below a gate electrode, and bottom gate thin film transistors in which a channel formation region is provided above a gate electrode. It is known that the number of photomasks used in a process for manufacturing a bottom gate thin film transistor is smaller than that in a process for manufacturing a top gate thin film transistor. A bottom gate thin film transistor is generally manufactured using three photomasks.

Many conventional techniques for reducing the number of photomasks use a complicated technique such as backside light exposure, resist reflow, or a lift-off method, which requires a special apparatus. The fabrication yield or the like can decrease due to various problems caused by usage of such a complicated technique. Moreover, electric characteristics of thin film transistors have to be sacrificed in many cases.

As a typical way for reducing the number of photomasks in a manufacturing process of a thin film transistor, a technique using a multi-tone mask (referred to as a half-tone mask or a gray-tone mask) is widely known. As a technique for reducing the number of manufacturing steps by using a multi-tone mask, Patent Document 1 is disclosed, for example.

REFERENCE

Patent Document 1

Japanese Patent Laid-Open No. 2003-179069

It is difficult to further reduce the number of photomasks with the use of the conventional techniques.

For example, even when a bottom gate thin film transistor is manufactured using a multi-tone mask by the technique disclosed in Patent Document 1, at least two multi-tone masks and one general photomask are required. Further, dry etching is performed to remove a metal film (a second metal film) provided over a transparent conductive film of a display device, so that the transparent conductive film is damaged and transmissivity thereof decreases; otherwise, part of the metal film remains over the transparent conductive film without being etched, thereby decreasing the transmissivity.

Therefore, an object of an embodiment of the present invention is to provide a method for manufacturing a thin film transistor using the smaller number of photomasks without using an additional photomask in patterning a gate electrode layer.

Further, an embodiment of the present invention can be particularly applied to a method for manufacturing a thin film transistor used in a pixel of a display device (also referred to as a pixel TFT). Therefore, an object of an embodiment of the present invention is to provide a method for manufacturing a display device in which the number of photomasks used in photolithography is reduced as compared to the conventional technique without using a complicated technique.

Furthermore, an object of an embodiment of the present invention is to provide a thin film transistor which is manufactured using a reduced number of photomasks and which is, in addition, little influenced by light, and a display device. In particular, an object of an embodiment of the present invention is to reduce an adverse effect on a semiconductor layer due to light from a back light side in a liquid crystal display device.

SUMMARY OF THE INVENTION

In a method for manufacturing a thin film transistor according to an embodiment of the present invention, a light-blocking film, a base film, a first conductive film which forms a gate electrode, a first insulating film which forms a gate insulating film, a semiconductor film, an impurity semiconductor film, and a second conductive film which forms a source and drain electrode are stacked in this order, a resist mask is formed over the second conductive film, and first etching is performed to pattern these films into desired shapes. After that, second etching is performed on the first conductive film, so that the first conductive film is selectively side-etched to have a desired shape.

Here, as the first etching, dry etching or wet etching may be employed, but a highly anisotropic etching method (physical etching) is preferably employed. By employing a highly anisotropic etching method as the first etching, processing accuracy of a pattern can be improved. Note that the first etching can be performed in one step when dry etching is employed. Alternatively, the first etching is performed in several steps when wet etching is employed. Therefore, dry etching is preferably employed as the first etching.

As the second etching, dry etching or wet etching may be employed, but a highly isotropic etching method (chemical etching) is preferably employed. By employing a highly isotropic etching method (chemical etching) as the second etching, the first conductive film can be side-etched. The second etching is performed while the second conductive film and the light-blocking film (or a light-blocking layer) are exposed; therefore, the etching is preferably performed under the condition where these films are not easily etched.

The gate electrode, a gate wiring, a capacitor electrode, and a capacitor wiring can be formed by processing the first conductive film into the desired shapes as described above. Note that "the pattern of the first conductive film" means a top view layout of a metal wiring which forms a gate electrode, a gate wiring, a capacitor electrode, a capacitor wiring, and the like.

Note that the light-blocking film may be formed using a material having a light-blocking property. As an example of the material having a light-blocking property, metal can be given, and chromium, chromium oxide, or the like is preferably used. In addition, the light-blocking layer formed by etching the light-blocking film is provided so as to overlap with at least the semiconductor film. Preferably, the light-blocking layer is formed larger than a thin-film stack body. Here, the thin-film stack body means a stack body of the first insulating film, the semiconductor film, the impurity semiconductor film, and the second conductive film, which are patterned by the first etching.

One embodiment of the present invention is a method for manufacturing a thin film transistor, including the steps of: stacking a light-blocking film, a base film, a first conductive film, a first insulating film, a semiconductor film, an impurity semiconductor film, and a second conductive film in this order; forming a first resist mask over the second conductive film; performing first etching on the second conductive film, the impurity semiconductor film, the semiconductor film, the first insulating film, the first conductive film, the base film, and the light-blocking film using the first resist mask; performing second etching in which part of the first conductive film is side-etched to form a gate electrode layer; forming a second resist mask over the second conductive film; and performing third etching on the second conductive film, the impurity semiconductor film, and part of the semiconductor film using the second resist mask to form a source and drain electrode layer, a source and drain region, and a semiconductor layer.

One embodiment of the present invention is a method for manufacturing a thin film transistor, including the steps of: stacking a light-blocking film, a base film, a first conductive film, a first insulating film, a semiconductor film, an impurity semiconductor film, and a second conductive film in this order; forming a first resist mask over the second conductive film; performing first etching on the second conductive film, the impurity semiconductor film, the semiconductor film, the first insulating film, the first conductive film, the base film, and the light-blocking film using the first resist mask; forming a second resist mask over the second conductive film; performing second etching in which part of the first conductive film is side-etched to form a gate electrode layer; and performing third etching on the second conductive film, the impurity semiconductor film, and part of the semiconductor film using the second resist mask to form a source and drain electrode layer, a source and drain region, and a semiconductor layer.

One embodiment of the present invention is a method for manufacturing a thin film transistor, including the steps of: stacking a light-blocking film, a base film, a first conductive film, a first insulating film, a semiconductor film, an impurity semiconductor film, and a second conductive film in this order; forming a first resist mask having a depressed portion over the second conductive film; performing first etching on the second conductive film, the impurity semiconductor film, the semiconductor film, the first insulating film, the first conductive film, the base film, and the light-blocking film using the first resist mask; performing second etching in which part of the first conductive film is side-etched to form a gate electrode layer; making the first resist mask recede (reduce) to expose a region of the second conductive film, region which overlaps with the depressed portion of the first resist mask, thereby forming a second resist mask; and performing third etching on the second conductive film, the impurity semiconductor film, and part of the semiconductor film using the second resist mask to form a source and drain electrode layer, a source and drain region, and a semiconductor layer.

One embodiment of the present invention is a method for manufacturing a thin film transistor, including the steps of: stacking a light-blocking film, a base film, a first conductive film, a first insulating film, a semiconductor film, an impurity semiconductor film, and a second conductive film in this order; forming a first resist mask having a depressed portion over the second conductive film; performing first etching on the second conductive film, the impurity semiconductor film, the semiconductor film, the first insulating film, the first conductive film, the base film, and the light-blocking film using the first resist mask; making the first resist mask recede (reduce) to expose a region of the second conductive film, region which overlaps with the depressed portion of the first resist mask, and to form a second resist mask; performing second etching in which part of the first conductive film is side-etched to form a gate electrode layer; and performing third etching on the second conductive film, the impurity semiconductor film, and part of the semiconductor film using the second resist mask to form a source and drain electrode layer, a source and drain region, and a semiconductor layer.

One embodiment of the present invention is a method for manufacturing a display device, including the steps of forming a second insulating film so as to cover the thin film transistor formed by the above-described manufacturing method; forming an opening portion in the second insulating film so as to expose part of the source and drain electrode layer; and selectively forming a pixel electrode over the opening portion and the second insulating film.

In the method for manufacturing a thin film transistor or the method for manufacturing a display device, the first resist mask is preferably formed using a multi-tone mask. With the use of a multi-tone mask, a resist mask having a depressed portion can be formed through a simple process.

In the method for manufacturing a thin film transistor or the method for manufacturing a display device, the light-blocking film is preferably formed over an insulating film.

By application of the method for manufacturing a thin film transistor or the method for manufacturing a display device, an element region is formed through the first etching, and a side surface of the gate electrode layer is provided more on the inside than a side surface of the element region by a roughly uniform distance through the second etching.

In the method for manufacturing a thin film transistor or the method for manufacturing a display device, the first etching is preferably dry etching, and the second etching is preferably wet etching.

In the method for manufacturing a display device, the second insulating film is preferably formed by stacking an insulating film formed by a CVD method or a sputtering method and an insulating film formed by a spin coating method. In particular, a silicon nitride film is preferably formed by a CVD method or a sputtering method and an organic resin film is preferably formed by a spin coating method. An insulating film to be a protective film is thus formed, whereby the thin film transistor is protected from an impurity element or the like which might adversely affect electric characteristics of the thin film transistor, and planarity of a surface over which a pixel electrode is formed can be improved; accordingly, reduction in fabrication yield can be prevented.

Further, the thin film transistor which is one embodiment of the present invention includes an insulating film over a light-blocking film, a gate electrode layer over the insulating film, a gate insulating film over the gate electrode layer, a semiconductor layer over the gate insulating film, an impurity semiconductor layer including source and drain regions over the semiconductor layer, source and drain electrodes over the source and drain regions, and cavity in contact with a side surface of the gate electrode layer. Further, the gate insulating film is provided only over the gate electrode layer, so that the side surface of the gate electrode layer is not covered with the gate insulating film.

Note that etching is preferably performed under such conditions as to cause unintentional etching as little as possible.

Note that a phrase "a film has heat resistance" means that the film can keep its shape as a film and required function and characteristics even under a temperature rise during a later manufacturing step.

Note that a "gate wiring" means a wiring connected to a gate electrode of a thin film transistor. The gate wiring is formed using a gate electrode layer. Further, the gate wiring is sometimes referred to as a scanning line.

Note that a "source wiring" means a wiring connected to one of a source electrode and a drain electrode of a thin film transistor. The source wiring is formed using a source and drain electrode layer. Further, the source wiring is sometimes referred to as a signal line.

Note that a "power supply line" means a wiring which is connected to a power source and held at a fixed potential.

An additional photomask is not required for patterning a gate electrode, and thus, the number of steps of manufacturing a thin film transistor can be significantly reduced. In addition, the thin film transistor can be applied to a display device, so that the number of steps of manufacturing a display device can significantly be reduced as well. Accordingly, manufacturing cost can also be significantly reduced.

Further, since a complicated step such as backside light exposure, resist reflow, and a lift-off method is not used, the number of steps of manufacturing a thin film transistor can be significantly reduced while a fabrication yield is not reduced and electric characteristics of the thin film transistor is maintained. Accordingly, the number of steps of manufacturing a display device can be significantly reduced without sacrificing display quality and the like of the display device.

Furthermore, since a thin film transistor can be manufactured using one photomask, misalignment can be prevented in photomask alignment.

Accordingly, since the semiconductor layer can be shielded from light, a thin film transistor having favorable electric characteristics, in which light leakage current is reduced, can be manufactured. In addition, a display device including the thin film transistor can have a high contrast ratio.

DETAILED DESCRIPTION OF THE INVENTION

Figure 1A:
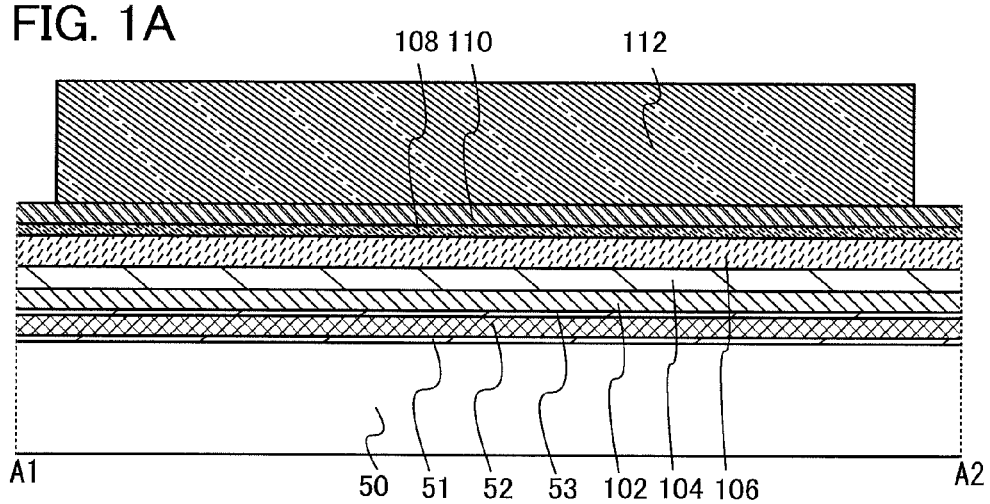
FIGS. 1A to 1C illustrate an example of a method for manufacturing a thin film transistor and a display device.
Figure 1B:
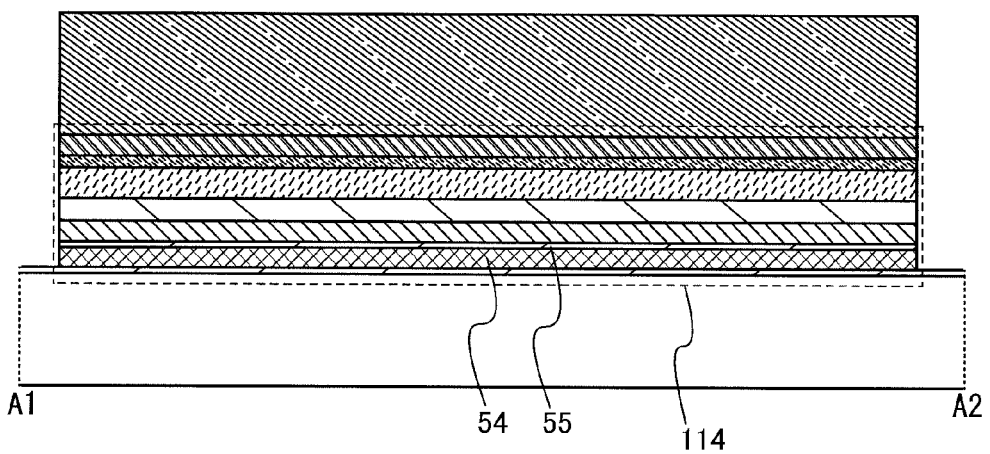

Hereinafter, embodiments of the present invention will be described in detail with reference to the accompanying drawings. Note that the present invention is not limited to the following description and it is easily understood by those skilled in the art that modes and details thereof can be variously modified without departing from the spirit and scope of the present invention. Accordingly, the present invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. Note that a base film, a first insulating film, and a second insulating film are not illustrated in top views.

Embodiment 1

In Embodiment 1, an example of a method for manufacturing a thin film transistor and a method for manufacturing a display device in which the thin film transistors are arranged in matrix will be described with reference to FIG. 1A to FIG. 26D.

Figure 21:
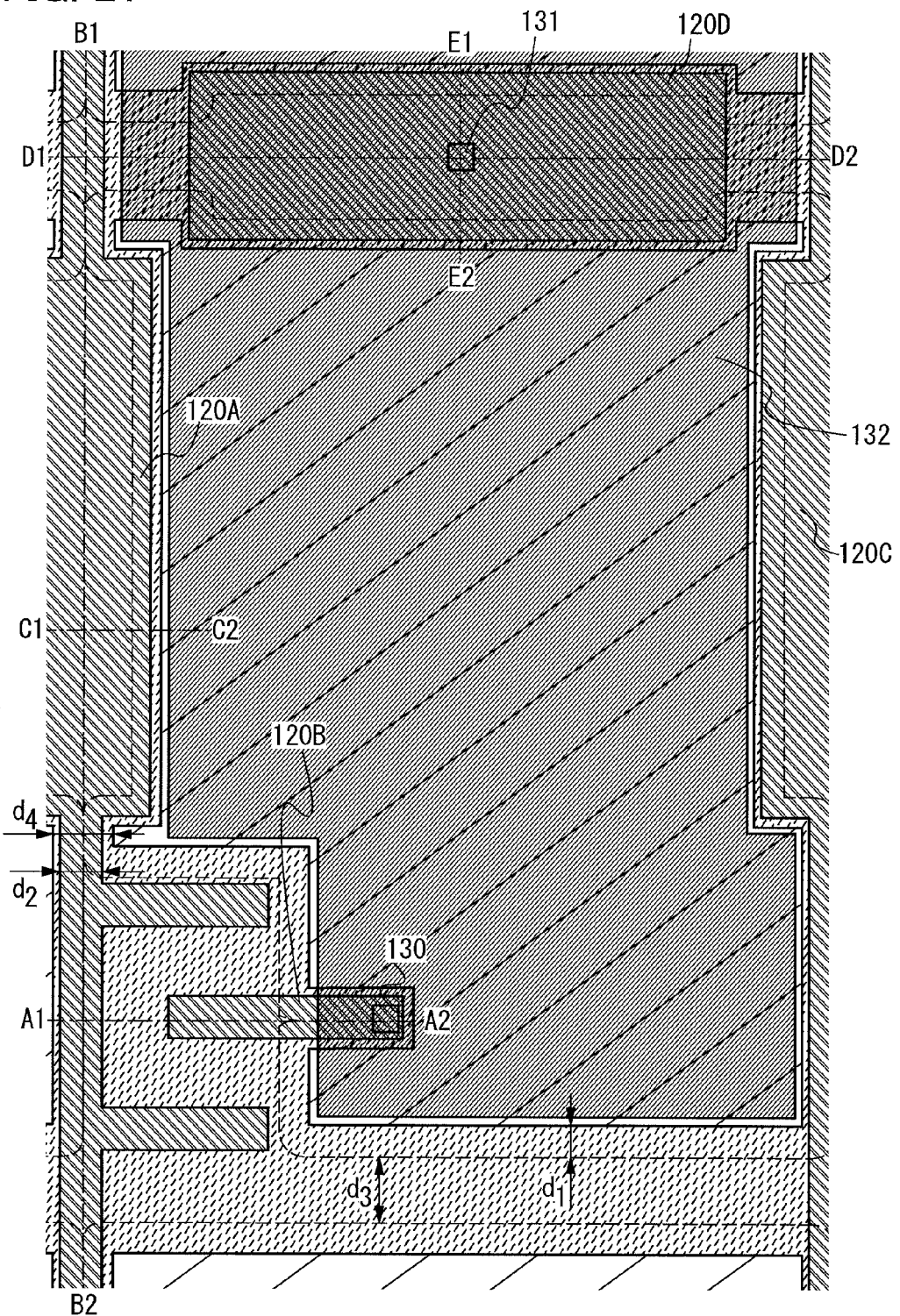
FIG. 21 illustrates an example of a method for manufacturing the thin film transistor and the display device.

Note that FIG. 16, FIG. 17, FIG. 18, FIG. 19, FIG. 20, and FIG. 21 are top views of a thin film transistor according to Embodiment 1, and FIG. 21 is a completion drawing in the situation that formation of a pixel electrode is finished. FIGS. 1A to 1C, FIGS. 2A to 2C, and FIGS. 3A to 3C are cross-sectional views taken along the line A1-A2 in FIG. 16, FIG. 17, FIG. 18, FIG. 19, FIG. 20, and FIG. 21. FIGS. 4A to 4C, FIGS. 5A to 5C, and FIGS. 6A to 6C are cross-sectional views taken along the line B1-B2 in FIG. 16, FIG. 17, FIG. 18, FIG. 19, FIG. 20, and FIG. 21. FIGS. 7A to 7C, FIGS. 8A to 8C, and FIGS. 9A to 9C are cross-sectional views taken along the line C1-C2 in FIG. 16, FIG. 17, FIG. 18, FIG. 19, FIG. 20, and FIG. 21. FIGS. 10A to 10C, FIGS. 11A to 11C, and FIGS. 12A to 12C are cross-sectional views taken along the line D1-D2 in FIG. 16, FIG. 17, FIG. 18, FIG. 19, FIG. 20, and FIG. 21. FIGS. 13A to 13C, FIGS. 14A to 14C, and FIGS. 15A to 15C are cross-sectional views taken along the line E1-E2 in FIG. 16, FIG. 17, FIG. 18, FIG. 19, FIG. 20, and FIG. 21.

First, a light-blocking film 52, a base film 53, a first conductive film 102, a first insulating film 104, a semiconductor film 106, an impurity semiconductor film 108, and a second conductive film 110 are stacked in this order over a substrate 50. These films may be formed using a single layer or a stacked film including a plurality of films.

Note that it is preferable to provide an additional base film 51 between the substrate 50 and the light-blocking film 52. In Embodiment 1, a case where the additional base film 51 is provided is described. This is because there is a concern that the substrate 50 is etched in an etching step of forming the light-blocking film 52. The additional base film 51 may be formed using a material and a formation method which are similar to those of a base film 53 to be described later. The additional base film 51 is provided between the substrate 50 and the light-blocking film 52, whereby an impurity metal element included in the substrate 50 can be prevented from attaching to and entering a semiconductor layer.

The substrate 50 is an insulating substrate. In the case where an embodiment of the present invention is applied to a display device, a glass substrate or a quartz substrate can be used as the substrate 50. In Embodiment 1, a glass substrate is used.

The light-blocking film 52 is provided in order to block external light incident from a surface opposite to a main surface of the substrate 50, stray light incident from other surfaces, or the like. The light-blocking film 52 may be formed using a film of a material capable of blocking light and the material of the light-blocking film 52 is not limited to a specific material. As an example of the film of material capable of blocking light, a film of a material containing chromium as its main component, a resin film containing carbon black, and the like can be given. A film of a material containing chromium as its main component is preferably used because of its high heat resistance. As an example of the material containing chromium as its main component, chromium, chromium oxide, chromium nitride, chromium fluoride, and the like can be given. The light-blocking film 52 may be formed by a sputtering method, a CVD method (including a thermal CVD method, a plasma CVD method, and the like), for example and there is no particular limitation.

The base film 53 is formed using an insulating material. The base film 53 can be formed using, for example, a silicon oxide film, a silicon nitride film, a silicon oxynitride film, a silicon nitride oxide film, or the like. Note that the base film 53 needs to have heat resistance to withstand heat in a later step (formation of a first insulating film 104 or the like). In addition, a material which is not unintentionally etched or eroded in a later step (etching of a second conductive film 110 or the like) is selected as the material of the base film 53. Note that when an electric potential of the light-blocking layer is different from that of a gate electrode layer, the base film 53 is preferably thick. This is for the purpose of suppressing parasitic capacitance generated between the light-blocking layer and the gate electrode layer.

In the case where a glass substrate is used as the substrate 50, a silicon nitride film or a silicon nitride oxide film is preferably used as the base film 53. Nitrogen is contained in the base film 53, so that an impurity metal element included in the substrate 50 can be effectively prevented from entering a semiconductor layer. Further, a halogen (fluorine, chlorine, or bromine) is preferably contained in the base film 53. A halogen is contained in the base film 53, so that an impurity metal element included in the substrate 50 can be effectively prevented from entering a semiconductor layer. In order that a halogen is contained in the base film 53, a gas used in base film formation may contain a halogen gas or a gas formed using a halogen compound. Note that the base film 53 can be formed by a CVD method (including a thermal CVD method, a plasma CVD method, and the like), or a sputtering method, for example and there is no particular limitation. Further, the base film 53 may be formed using a single layer or a plurality of stacked layers.

The first conductive film 102 is formed using a conductive material. The first conductive film 102 can be formed using; for example, a metal such as molybdenum or tungsten or an alloy including any of these metal materials as its main component can be used. Note that the material of the first conductive film 102 needs to have heat resistance to withstand heat in a later step (formation of the first insulating film 104 or the like). In addition, a material which is not unintentionally etched or eroded in a later step is selected. Further, a material which can be etched in a second etching step is used. Provided that it satisfies the conditions given above, the material of the first conductive film 102 is not limited to a particular material. The first conductive film 102 may be formed by a sputtering method, a CVD method (including a thermal CVD method, a plasma CVD method, and the like), or the like and there is no particular limitation.

The first insulating film 104 functions as a gate insulating film and is formed using an insulating material. The first insulating film 104 can be formed using a silicon oxide film, a silicon nitride film, a silicon oxynitride film, a silicon nitride oxide film, or the like. Note that as in the case of the first conductive film 102, the material of the first insulating film 104 needs to have heat resistance to withstand heat in a later step (formation of a semiconductor film 106 or the like) and a material which is not unintentionally etched or eroded in a later step is selected. Provided that it satisfies the conditions given above, the material of the first insulating film 104 is not limited to a particular material. The first insulating film 104 may be formed by a CVD method (including a thermal CVD method, a plasma CVD method, and the like), a sputtering method, or the like and there is no particular limitation.

The semiconductor film 106 is formed using a semiconductor material. For example, the semiconductor film 106 can be formed using amorphous silicon or the like formed using a silane gas. Note that as in the case of the first conductive film 102 and the like, the material of the semiconductor film 106 needs to have heat resistance to withstand heat in a later step (formation of a second conductive film 110 or the like) and a material which is not unintentionally etched or eroded in a later step is selected. Provided that it satisfies the conditions given above, the material of the semiconductor film 106 is not limited to a particular material. Accordingly, germanium or the like can be used. Note that there is also no particular limitation to the crystallinity of the semiconductor film 106. The semiconductor film 106 may be formed by a CVD method (including a thermal CVD method, a plasma CVD method, and the like), a sputtering method, or the like and there is no particular limitation.

The impurity semiconductor film 108 is a semiconductor film containing an impurity element imparting one conductivity type and is formed using a gas such as a gas for forming a semiconductor material to which an impurity element imparting one conductivity type is added. For example, the impurity semiconductor film 108 can be formed using a silicon film containing phosphorus or boron, which is formed using a silane gas containing phosphine (chemical formula: $PH_3$) or diborane (chemical formula: $B_2H_6$). Note that as in the case of the first conductive film 102 and the like, the material of the impurity semiconductor film 108 needs to have heat resistance to withstand heat in a later step (formation of a second conductive film 110 or the like) and a material which is not unintentionally etched or eroded in a later step is selected. Provided that it satisfies the conditions given above, the material of the impurity semiconductor film 108 is not limited to a particular material. In the case of manufacturing an n-channel thin film transistor, phosphorus, arsenic, or the like may be used as an impurity element imparting one conductivity type. That is, a silane gas used for formation of the impurity semiconductor film 108 may contain phosphine, arsine (chemical formula: $AsH_3$), or the like at a desired concentration. On the other hand, in the case of manufacturing a p-channel thin film transistor, boron or the like may be added as an impurity element imparting one conductivity type. That is, a silane gas used for formation of the impurity semiconductor film 108 may contain diborane or the like at a desired concentration. Note that the impurity semiconductor film 108 may be formed by a CVD method (including a thermal CVD method, a plasma CVD method, and the like), or the like and there is no particular limitation to the fabrication method. There is also no particular limitation to the crystallinity of the impurity semiconductor film 108. Further, in the case where a region capable of an ohmic contact with source and drain electrode layers are provided in part of the semiconductor layer, which is formed using the semiconductor film 106 by doping or the like, the impurity semiconductor film 108 is not necessarily provided.

The second conductive film 110 is formed using a conductive material (the material mentioned as the material of the first conductive film 102 or the like), which is different from the material used for the first conductive film 102. Here, the "different material" means a material having another main component. Specifically, a material which is not easily etched by second etching to be described later is preferably selected. Further, as in the case of the first conductive film 102 and the like, the material of the second conductive film 110 needs to have heat resistance to withstand heat in a later step (formation of a first protective film 126 or the like) and a material which is not unintentionally etched or eroded in a later step is selected. Accordingly, provided that it satisfies the conditions given above, the material of the second conductive film 110 is not limited to a particular material. The second conductive film 110 may be formed by a sputtering method, a CVD method (including a thermal CVD method, a plasma CVD method, and the like), or the like and there is no particular limitation.

Note that among the light-blocking film 52, the base film 53, the first conductive film 102, the first insulating film 104, the semiconductor film 106, the impurity semiconductor film 108, and the second conductive film 110, the highest heat resistance is required for the light-blocking film 52. The required heat resistance is higher in the order mentioned above and the heat resistance required for the second conductive film 110 is the lowest. For example, in the case where the semiconductor film 106 is an amorphous semiconductor film containing hydrogen, hydrogen in the semiconductor film 106 is removed at or above about 300° C. and then electric characteristics are changed. Therefore, for example, steps after the formation of the semiconductor film 106 are preferably performed at or below about 300° C.

Next, a first resist mask 112 is formed over the second conductive film 110 (see FIG. 1A, FIG. 4A, FIG. 7A, FIG. 10A, FIG. 13A, and FIG. 16).

Then, first etching is performed using the first resist mask 112. That is, the light-blocking film 52, the base film 53, the first conductive film 102, the first insulating film 104, the semiconductor film 106, the impurity semiconductor film 108, and the second conductive film 110 are patterned by the etching to form a light-blocking layer 54, a base layer 55, and a thin-film stack body 114 (see FIG. 1B, FIG. 4B, FIG. 7B, FIG. 10B, FIG. 13B, and FIG. 17). In this specification, this etching process is referred to as first etching. As the first etching, dry etching or wet etching may be used. The first etching can be performed in one step when dry etching is used, while the first etching may be performed in several steps when wet etching is used. This is because in the wet etching, the etching rates vary depending on the kind of etched film and it is difficult to etch all films in one step. Therefore, dry etching is preferably used as the first etching.

As the first etching, dry etching may be performed in three stages. First, etching is performed using a mixed gas of a $Cl_2$ gas, a $CF_4$ gas, and an $O_2$ gas. Then, etching is performed using only a $Cl_2$ gas, and lastly, etching is performed using only a $CHF_3$ gas. Further, dry etching may be performed in four stages by further performing etching using a mixed gas of a $Cl_2$ gas, a $CF_4$ gas, and an $O_2$ gas in addition to the three stages.

Next, the first conductive film 102 is patterned by selective side-etching to form a gate electrode layer 116 (see FIG. 1C, FIG. 4C, FIG. 7C, FIG. 10C, FIG. 13C, and FIG. 18). This etching process is referred to as second etching.

Note that the gate electrode layer 116 forms a gate electrode of a thin film transistor, a gate wiring, one electrode of a capacitor, a capacitor wiring, and a supporting portion. When a gate electrode layer is referred to as a gate electrode layer 116A, the gate electrode layer forms a gate wiring and a gate electrode of a thin film transistor. When a gate electrode layer is referred to as a gate electrode layer 116B or a gate electrode layer 116D, the gate electrode layer forms a supporting portion. When a gate electrode layer is referred to as a gate electrode layer 116C, the gate electrode layer forms a capacitor wiring and one electrode of a capacitor. These gate electrode layers are collectively referred to as the gate electrode layer 116.

The second etching is performed under such etching conditions that a side surface of the gate electrode layer 116 formed using the first conductive film 102 is provided more on the inside than a side surface of the thin-film stack body 114. In other words, the second etching is performed so that side surfaces of the gate electrode layer 116 are formed in contact with a bottom surface of the thin-film stack body 114 (the second etching is performed so that the width of the gate electrode layer 116 is narrower than that of the semiconductor film 106 or the like in the cross section taken along the line A1-A2 of FIG. 18, FIG. 19, FIG. 20, and FIG. 21). Accordingly, the second etching is performed under such conditions that the etching rate with respect to the first conductive film 102 is high and the etching rates with respect to other films are low. In particular, the second etching may be performed under such conditions that the etching rate with respect to the second conductive film 110 is low and the etching rate with respect to the first conductive film 102 is high. In other words, the second etching may be performed under the conditions such that the etching selectivity of the first conductive film 102 with respect to the second conductive film 110 is high. By performing the second etching under such conditions, the gate electrode layer 116 can be formed.

Note that there is no particular limitation on a shape of the side surface of the gate electrode layer 116. For example, the side surface of the gate electrode layer 116 may be tapered. The shape of the side surface of the gate electrode layer 116 is determined depending on the conditions such as a chemical used in the second etching.

Here, the phrase "the conditions that the etching rate with respect to the second conductive film 110 is low and the etching rate with respect to the first conductive film 102 is high" or "the conditions that the etching selectivity of the first conductive film 102 with respect to the second conductive film 110 is high" means conditions satisfying the following first requirement and second requirement.

Figure 1C:
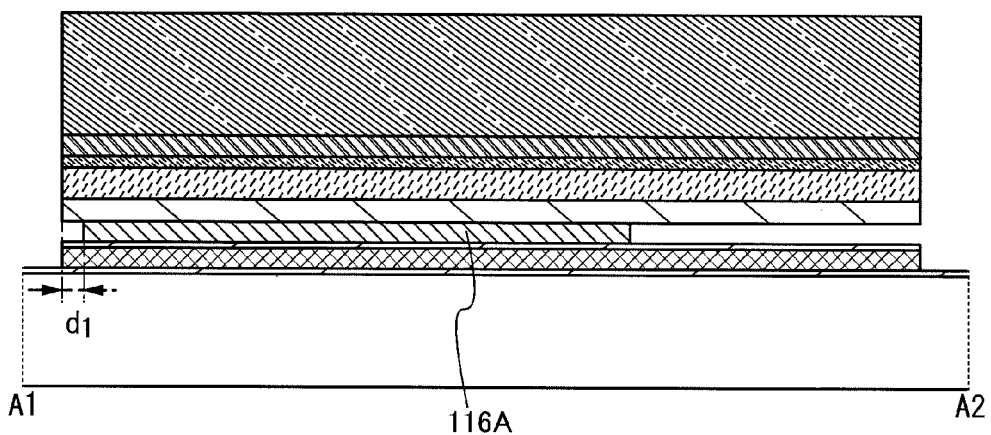

The first requirement is that the gate electrode layer 116 has to be left in places where its presence is necessary. The places necessarily provided with the gate electrode layer 116 are regions indicated by dotted lines in the resist masks in FIG. 18. That is, after the second etching, the gate electrode layer 116 may be left so as to form a gate electrode, a gate wiring, a capacitor electrode, a capacitor wiring, and a supporting portion. In order that the gate electrode layer forms the gate wiring and the capacitor wiring, the second etching needs to be performed so as not to cut these wirings. As illustrated in FIG. 1C and the like, the side surface of the gate electrode layer 116 is preferably more on the inside than the side surface of the thin-film stack body 114 by a distance $d_1$, and the distance $d_1$ may be set as appropriate by a practitioner according to the layout.

The second requirement is that a minimum width $d_3$ of the gate wiring or the capacitor wiring formed using the gate electrode layer 116 and a minimum width $d_2$ of a source wiring formed using source and drain electrode layers 120A have appropriate values (see FIG. 21). This is because as the second conductive film 110 is etched by the second etching, the minimum width $d_2$ of the source wiring is reduced; accordingly, the current density of the source wiring becomes excessive and electric characteristics are degraded. Therefore, the second etching is performed under conditions such that the etching rate of the first conductive film 102 is not too high and the etching rate of the second conductive film 110 is as low as possible.

It is acceptable as long as there is at least one portion where the width of the semiconductor layer overlapping with the source wiring is the minimum width $d_4$ between the gate wiring and the capacitor wiring which is adjacent to the gate wiring. It is preferable that the width of the semiconductor layer in a region adjacent to the gate wiring (such as a region between the gate wiring and the supporting portion) and in a region adjacent to the capacitor wiring (such as a region between the capacitor wiring and the supporting portion) be the minimum width $d_4$ as illustrated in FIG. 21. Note that the minimum width $d_4$ of the semiconductor layer is set smaller than about twice the distance $d_1$. In other words, the distance $d_1$ is set larger than about half the minimum width $d_4$ of the semiconductor layer.

In addition, the width of the electrode in a portion connected to a pixel electrode layer, which is formed of the source and drain electrode layers, is preferably equal to the minimum width $d_2$ of the source wiring.

As described above, it is fundamental that the second etching is performed under the condition in which side-etching is performed. This is because by the second etching in which the first conductive film 102 is side-etched, the gate wiring and the capacitor wiring, which are adjacent to each other and are formed of the gate electrode layer 116, can be formed to be insulated from each other (see FIG. 18). Here, since the second etching is etching in which side-etching is performed, the second etching proceeds in a substantially isotropic manner.

Here, "side-etching" means etching in which a film is etched in not only a thickness direction of the film (a direction perpendicular to the substrate surface or a direction perpendicular to the surface of a base film of the film to be etched) but also in a direction perpendicular to the thickness direction (a direction parallel to the substrate surface or a direction parallel to the surface of the base film of the film to be etched). An end portion of the film subjected to side-etching can have various shapes depending on the etching rate of an etching gas or a chemical used in the etching with respect to the film. The end portion of the film is, in many cases, formed with a curved surface.

By forming the gate electrode layer 116 using side-etching, an additional photomask does not have to be used in formation of the gate electrode layer 116.

Figure 18:
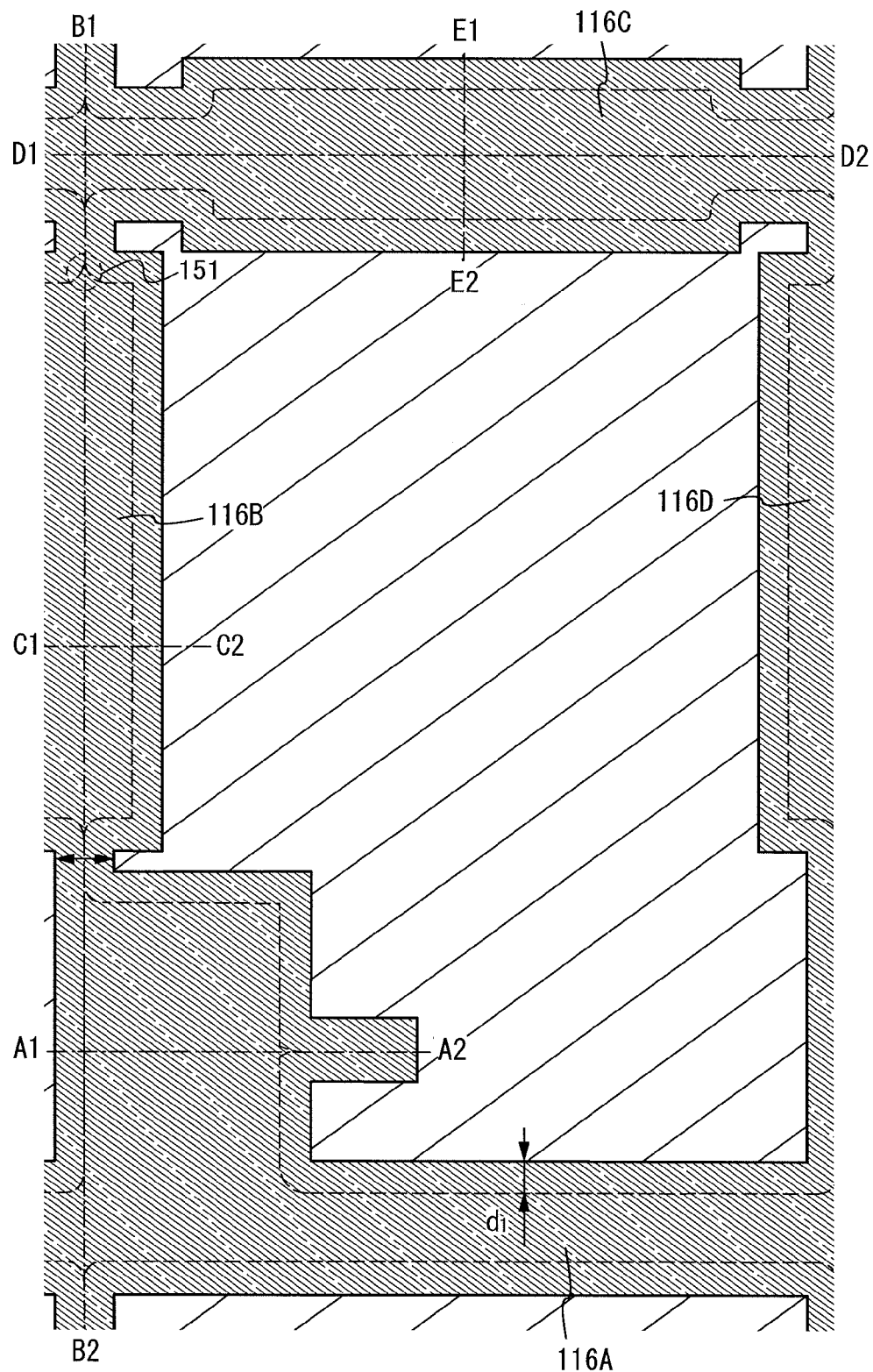
FIG. 18 illustrates an example of a method for manufacturing the thin film transistor and the display device.
Figure 19:
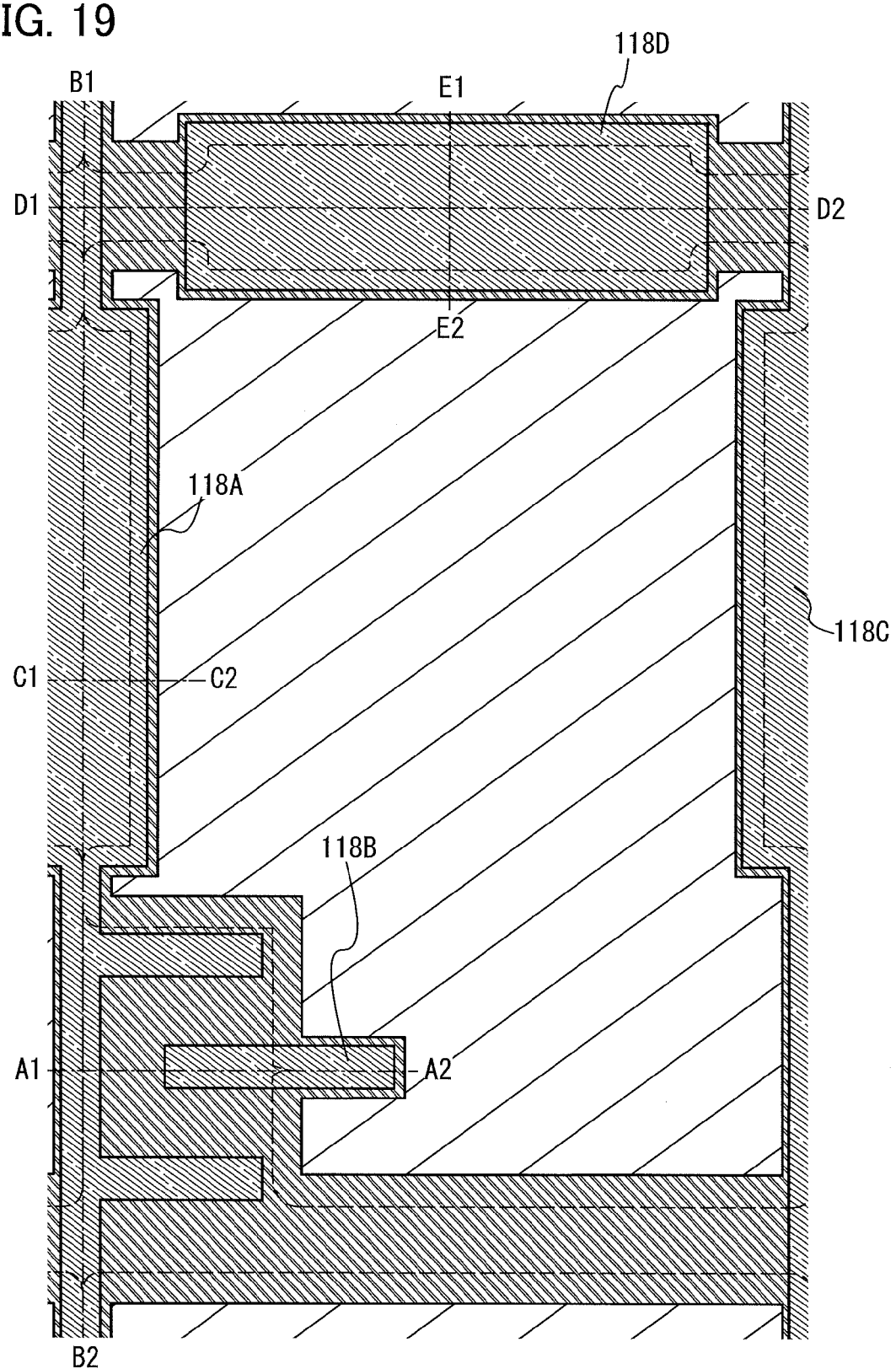
FIG. 19 illustrates an example of a method for manufacturing the thin film transistor and the display device.
Figure 20:
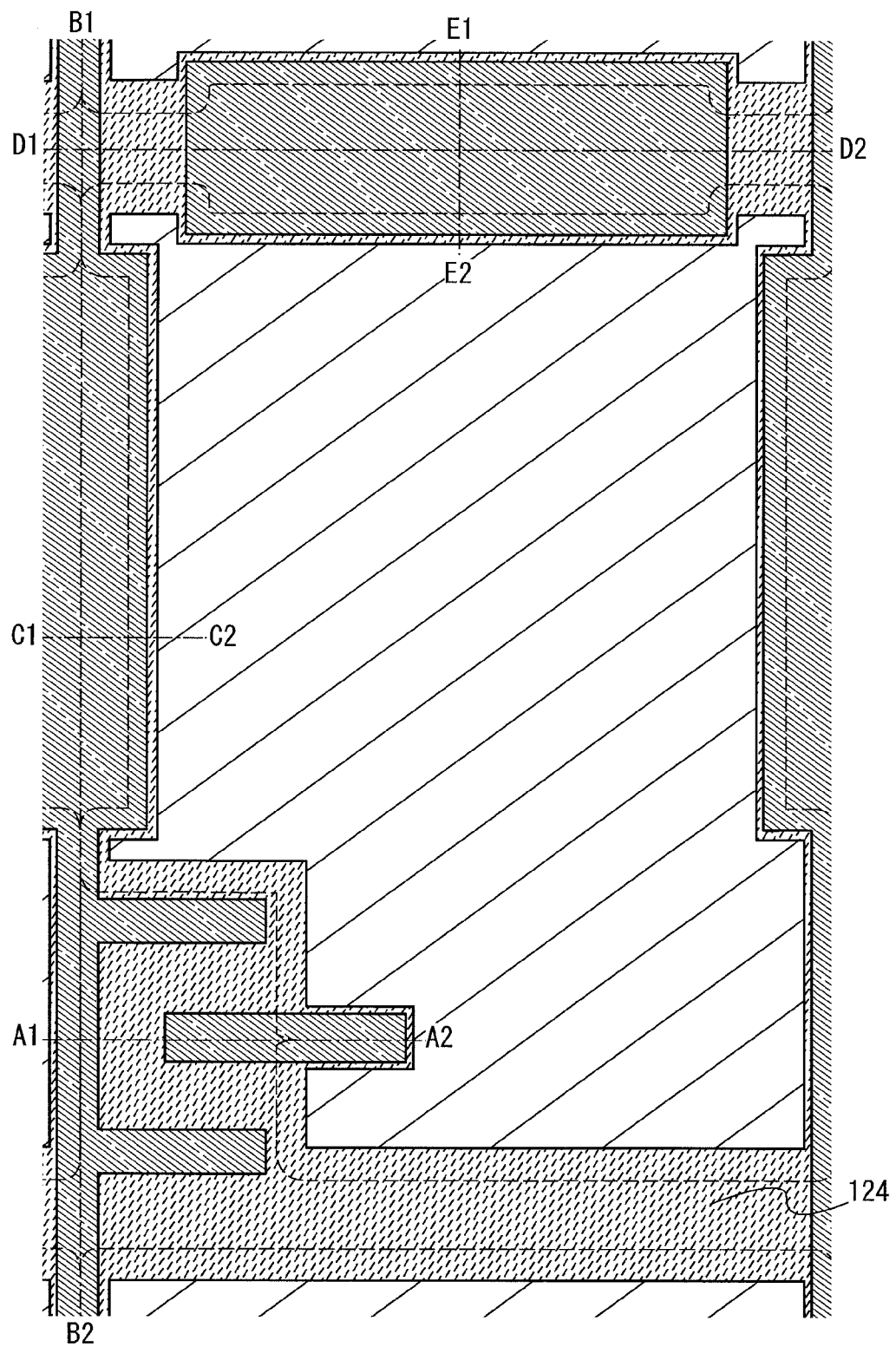
FIG. 20 illustrates an example of a method for manufacturing the thin film transistor and the display device.

As illustrated in FIG. 18, the thin-film stack body 114 formed by the first etching is designed to be narrow in a portion in contact with a supporting portion which is formed by the gate electrode layer 116B or the gate electrode layer 116D (the portion indicated by a two-headed arrow in FIG. 18). With this structure, the gate electrode layer 116A and the gate electrode layer 116B or the gate electrode layer 116D can be disconnected to be insulated from each other by the second etching.

Figure 22:
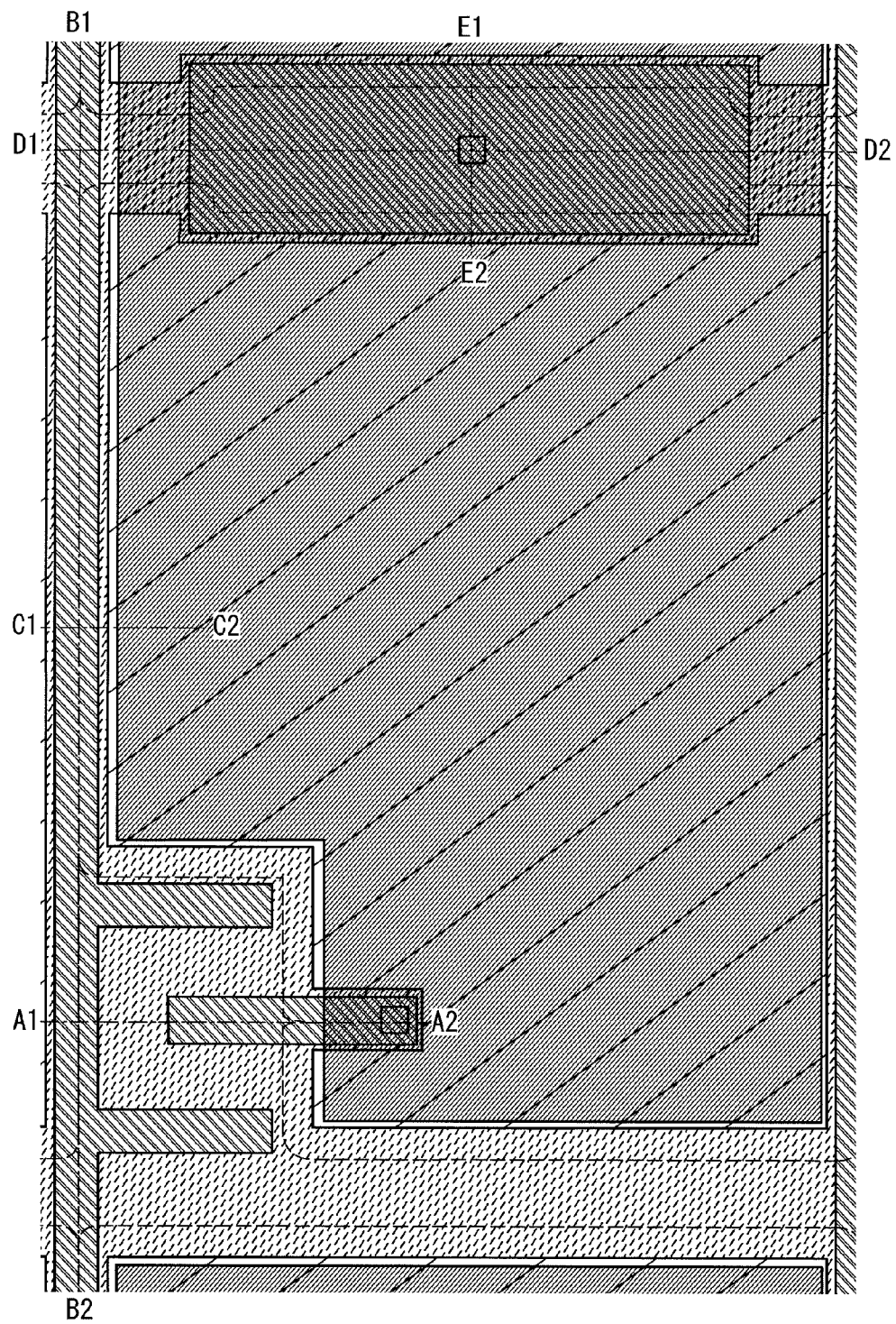
FIG. 22 illustrates an example of a method for manufacturing a thin film transistor and a display device.

The gate electrode layer 116B and the gate electrode layer 116D illustrated in FIG. 18 each serve as a supporting portion which supports the thin-film stack body 114. By the existence of the supporting portion, peeling of a film such as the first insulating film 104 formed over the gate electrode layer can be prevented. In addition, by the existence of the supporting portion, a cavity region formed in contact with the gate electrode layer 116 by the second etching can be prevented from being larger than necessary. Further, it is preferable to provide the supporting portion because the thin-film stack body 114 can be prevented from being broken or damaged due to its own weight and, accordingly, a fabrication yield is increased. However, there is no limitation, and the supporting portion is not necessarily provided. An example of a top view in the case where the supporting portion is not provided supporting portion (corresponding to FIG. 21) is illustrated in FIG. 22.

Next, an etchant or an etching gas, which can be used in the second etching, and a combination of the first conductive film 102 and the second conductive film 110 are described.

In the case where the second etching is performed by wet etching, for example, the light-blocking film 52 is formed using a material containing tungsten as its main component, the first conductive film 102 is formed using a material containing aluminum as its main component, a material containing titanium as its main component, or a stack of films of these materials, and the second conductive film 110 is formed using a material containing copper as its main component. As the etchant, dilute sulfuric acid, concentrated phosphoric acid, concentrated hydrochloric acid, dilute phosphoric acid, or oxalic acid is used. Note that when dilute sulfuric acid, dilute phosphoric acid, or oxalic acid is used as the etchant, the temperature thereof may be higher than room temperature (50° C. to 100° C., preferably 60° C. to 75° C.). Note that the second conductive film 110 is preferably formed by stacking a material containing copper including calcium and oxygen as its main component, a material containing copper including calcium as its main component, and a material containing copper including magnesium as its main component. Alternatively, the second conductive film 110 is preferably formed by stacking a material containing copper including calcium and oxygen as its main component, a material containing copper including magnesium and oxygen as its main component, and a material containing copper including magnesium as its main component. Note that a mixture of a material containing copper including calcium as its main component and a material containing copper including magnesium and oxygen as its main component may be sandwiched between a material containing copper including calcium and oxygen as its main component and a material containing copper including magnesium as its main component. However, there is no limitation on the combination.

Further, in the case where the second etching is performed by wet etching, for example, the light-blocking film 52 may be formed using a material containing tungsten as its main component, the first conductive film 102 may be formed using a material containing aluminum as its main component or a material containing titanium as its main component or using a stack of these films, and the second conductive film 110 may be formed using a material containing molybdenum as its main component. As the etchant, hydrofluoric acid, dilute hydrochloric acid, concentrated hydrochloric acid, dilute sulfuric acid, concentrated sulfuric acid, dilute phosphoric acid, concentrated phosphoric acid, or oxalic acid is used. Note that when dilute hydrochloric acid, dilute sulfuric acid, dilute phosphoric acid, or oxalic acid is used as the etchant, the temperature thereof may be higher than room temperature (50° C. to 100° C., preferably 60° C. to 75° C.). However, in the case of using concentrated sulfuric acid, since molybdenum, which is the main component of the second conductive film 110, has etched at high temperature, the temperature of concentrated sulfuric acid is set to about room temperature. The etchant is not limited to the above-described chemical solutions and can be appropriately selected as necessary.

Among the aforementioned etchants, concentrated sulfuric acid, dilute phosphoric acid, and concentrated phosphoric acid cause dehydrating action against a resist mask; therefore, the resist mask is removed in advance at least in the case of using these etchants.

As for the aforementioned material containing aluminum as its main component, which forms the first conductive film 102, aluminum to which neodymium is added is preferably used. With the use of aluminum to which neodymium is added as the first conductive film 102, generation of a hillock can be prevented while high resistance of aluminum can be suppressed.

Further, as the aforementioned material containing molybdenum as its main component, which form's the second conductive film 110, molybdenum to which niobium is added may be used.

Alternatively, the second etching may be performed by dry etching. For example, the light-blocking film 52 is formed using a material containing aluminum as its main component or a material containing titanium as its main component, or using a stack of these materials, the first conductive film 102 is formed using a material containing tungsten as its main component, and the second conductive film 110 is formed using a material containing aluminum as its main component or a material containing titanium as its main component, or using a stack of these materials. The second etching can be performed with the use of a chlorine trifluoride (chemical formula: ClF$_3$) gas as the etching gas. Note that when the semiconductor film 106 is formed using silicon, the semiconductor film 106 is etched by the chlorine trifluoride gas; therefore, an oxidation step may be performed before the second etching. An oxidation step may be performed by a method in which a surface of the thin-film stack body 114 can be oxidized, and there is no particular limitation on a method. This oxidation step can be performed by plasma treatment using oxygen plasma or water plasma, treatment using ozone water, or thermal treatment.

As illustrated in FIG. 18, the gate electrode layer 116 exhibits "horns" (e.g., a horn 151) when seen from the above. This is because since the second etching for forming the gate electrode layer 116 is performed substantially isotropically, etching is performed so that the distance $d_1$ between the side surface of the gate electrode layer 116 and the side surface of the thin-film stack body 114 is roughly uniform.

Next, a second resist mask 118 is formed (see FIG. 2A, FIG. 5A, FIG. 8A, FIG. 11A, FIG. 14A, and FIG. 19). Note that the case where the second resist mask 118 is formed after the second etching has been described here; however, there is no limitation and the second etching may be performed after formation of the second resist mask 118.

Note that the second resist mask 118A overlaps with the source and drain electrode layer 120A, the second resist mask 118B overlaps with the source and drain electrode layer 120B, the second resist mask 118C overlaps with the source and drain electrode layer 120C, and the second resist mask 118D overlaps with the source and drain electrode layer 120D. These second resist masks are collectively referred to as the second resist mask 118.

Next, the second conductive film 110 of the thin-film stack body 114 is etched using the second resist mask 118, so that a source and drain electrode layer 120 is formed. Here, as the etching conditions, the conditions under which films other than the second conductive film 110 are not unintentionally etched or eroded are selected. In particular, it is important that etching be performed under conditions such that the gate electrode layer 116 is not unintentionally etched or eroded.

Note that the source and drain electrode layer 120 forms the source electrode and the drain electrode of a thin film transistor, the source wiring, the electrode which connects the thin film transistor and the pixel electrode to each other, and the other electrode of a capacitor functioning as a storage capacitor. When a source and drain electrode layer is referred to as the source and drain electrode layer 120A or a source and drain electrode layer 120C, the source and drain electrode layer forms one of a source electrode and a drain electrode of a thin film transistor or a source wiring. When a source and drain electrode layer is referred to as a source and drain electrode layer 120B, the source and drain electrode layer forms the other of the source electrode and the drain electrode of the thin film transistor or an electrode which connects the thin film transistor and the pixel electrode to each other. When a source and drain electrode layer is referred to as a source and drain electrode layer 120D, the source and drain electrode layer forms the other electrode of the capacitor. These source and drain electrode layers are collectively referred to as the source and drain electrode layer 120.

Note that for etching the second conductive film 110, either wet etching or dry etching may be performed.

Then, the impurity semiconductor film 108 and an upper portion of the semiconductor film 106 (back channel portion) in the thin-film stack body 114 are etched to form a source and drain region 122 and a semiconductor layer 124 (see FIG. 2B, FIG. 5B, FIG. 8B, FIG. 11B, FIG. 14B, and FIG. 20). Here, as the etching conditions, the conditions under which films other than the impurity semiconductor film 108 and the semiconductor film 106 are not easily unintentionally etched or eroded are selected. In particular, it is important that etching be performed under conditions such that the gate electrode layer 116 is not easily unintentionally etched or eroded.

Note that a source and drain region 122A overlaps with the source and drain electrode layer 120A, a source and drain region 122B overlaps with the source and drain electrode layer 120B, a source and drain region 122C overlaps with the source and drain electrode layer 120C, and a source and drain region 122D overlaps with the source and drain electrode layer 120D. These regions are collectively referred to as the source and drain region 122.

Note that the impurity semiconductor film 108 and the upper portion of the semiconductor film 106 (the back channel portion) can be etched by either dry etching or wet etching.

Then, the second resist mask 118 is removed; accordingly, a thin film transistor is completed (see FIG. 2C, FIG. 5C, FIG. 8C, FIG. 11C, and FIG. 14C).

Figure 2A:
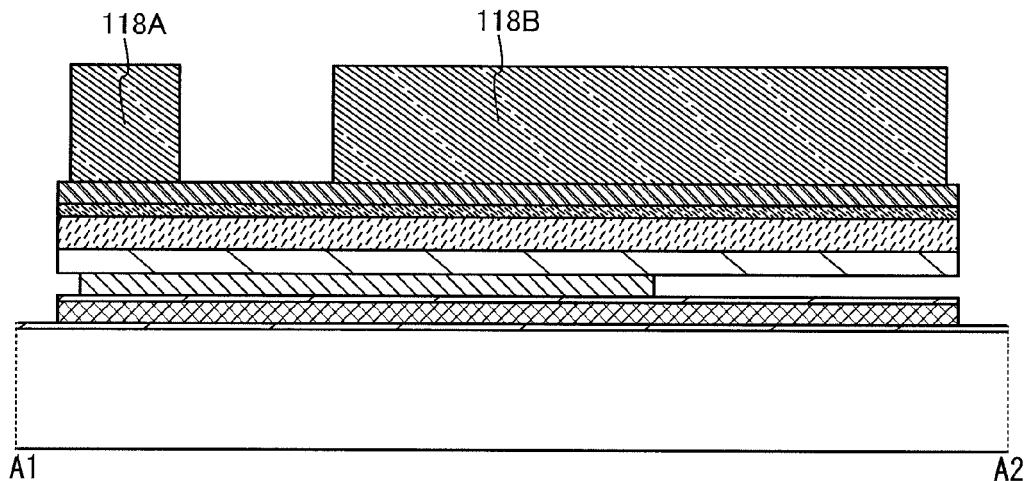
FIGS. 2A to 2C illustrate an example of a method for manufacturing the thin film transistor and the display device.
Figure 2B:
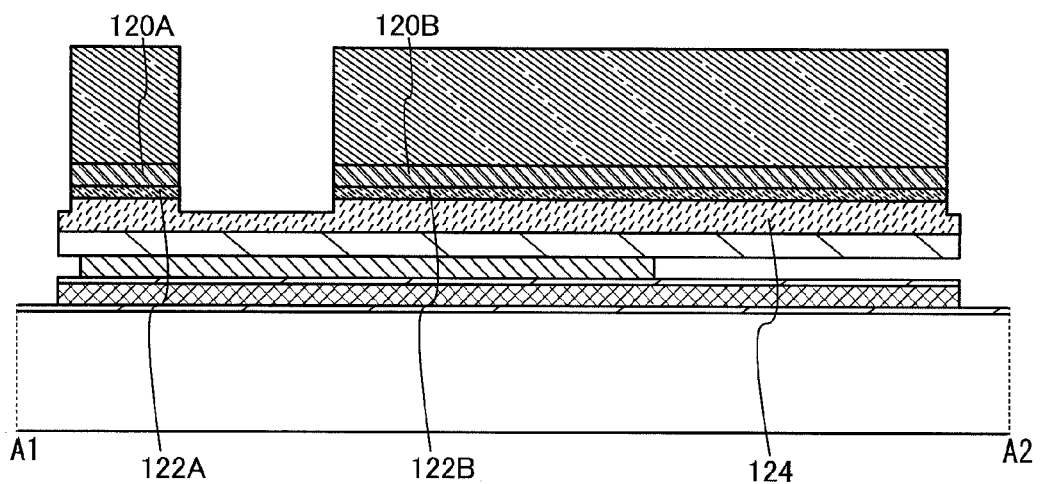
Figure 2C:
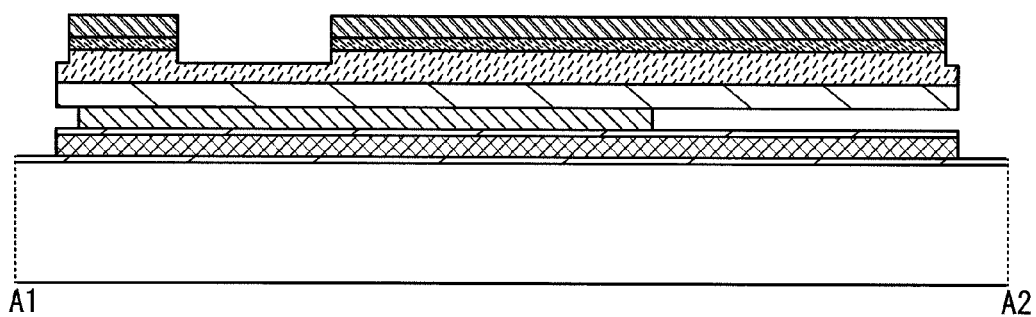

Note that the steps described with reference to FIG. 2B and the like are collectively referred to as "third etching." The third etching may be performed in several steps as described above or may be performed in a single step.

A second insulating film is formed to cover the thus formed thin film transistor. The second insulating film may be formed of only a first protective film 126; however, here, the second insulating film is formed of the first protective film 126 and a second protective film 128 (see FIG. 3A, FIG. 6A, FIG. 9A, FIG. 12A, and FIG. 15A). The first protective film 126 may be formed in a manner similar to that of the first insulating film 104.

The second protective film 128 is formed by a method by which the surface thereof becomes roughly planar. This is because when the surface of the second protective film 128 is roughly planar, defective formation or the like of a pixel electrode layer 132 formed over the second protective film 128 can be prevented. Accordingly, the phrase "roughly planar" means planar in such an extent that the aforementioned aim can be achieved, and does not mean that high planarity is required.

The second protective film 128 can be formed, for example, by a spin coating method or the like using photosensitive polyimide, acrylic, epoxy resin, or the like. Note that the material and the formation method of the second protective film 128 are not limited to the above-described materials and formation method.

Next, a first opening portion 130 and a second opening portion 131 are formed in the second insulating film (see FIG. 3B, FIG. 6B, FIG. 9B, FIG. 12B, and FIG. 15B). The first opening portion 130 and the second opening portion 131 are formed so as to reach at least the surface of the source and drain electrode layer 120. The formation method of the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed by dry etching using photolithography.

Note that in the case of forming the opening portions by photolithography, one photomask is used.

Figure 3A:
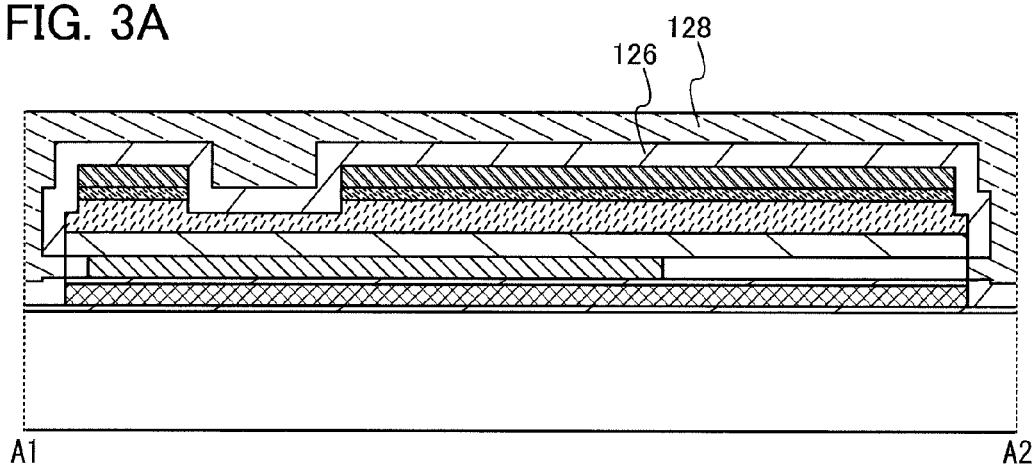
FIGS. 3A to 3C illustrate an example of a method for manufacturing the thin film transistor and the display device.
Figure 3B:
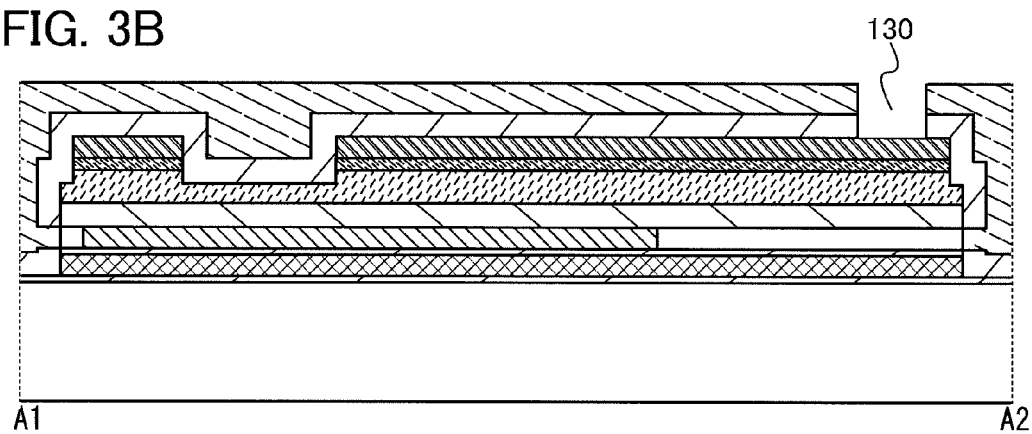
Figure 3C:
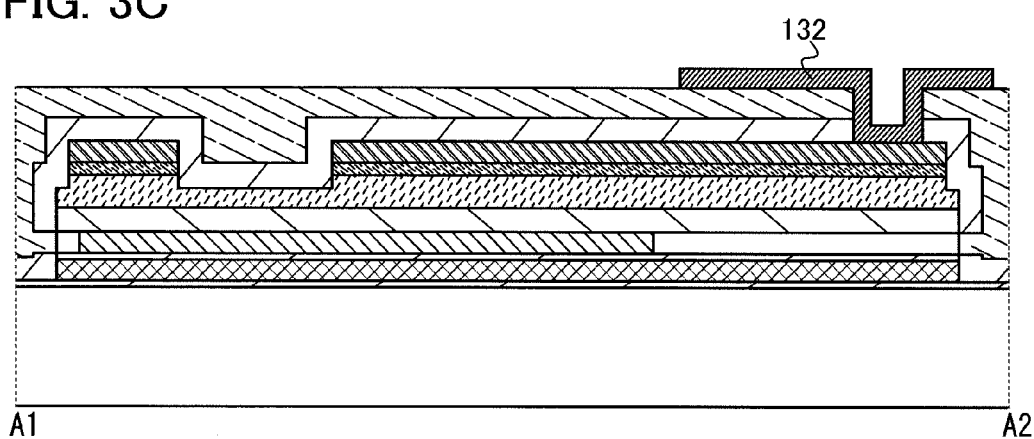
Figure 4A:
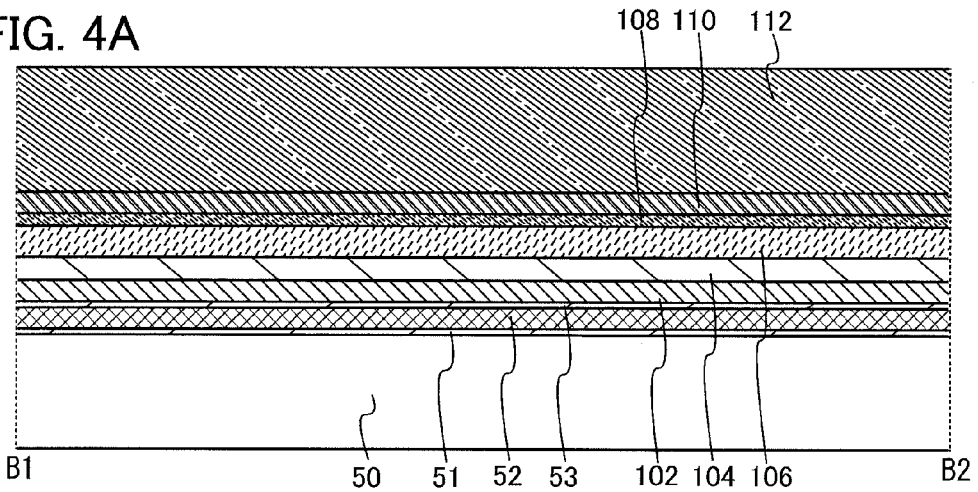
FIGS. 4A to 4C illustrate an example of a method for manufacturing the thin film transistor and the display device.
Figure 4B:
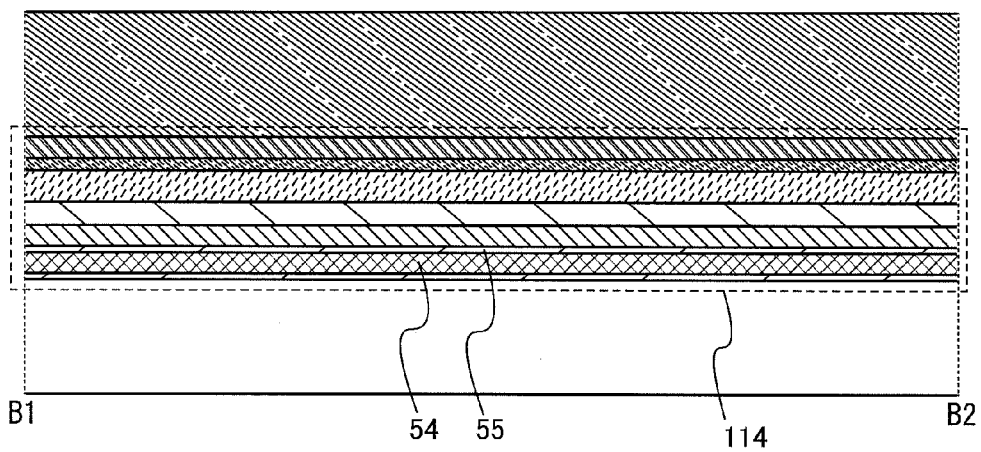
Figure 4C:
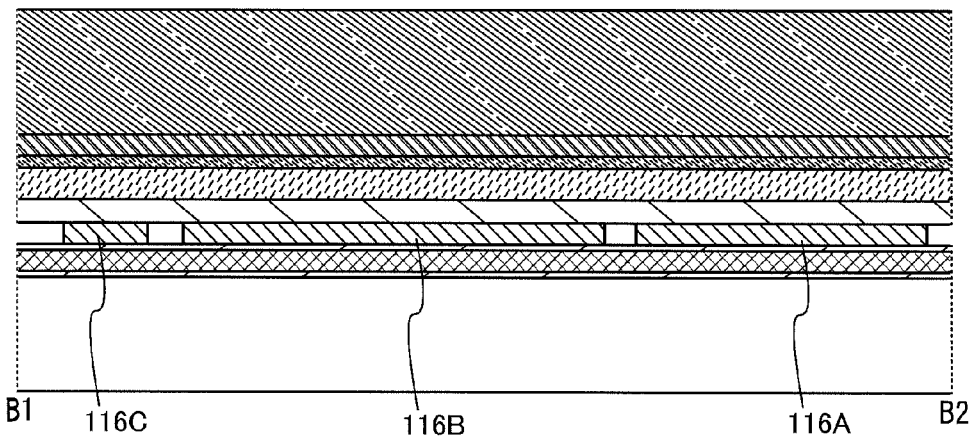
Figure 5A:
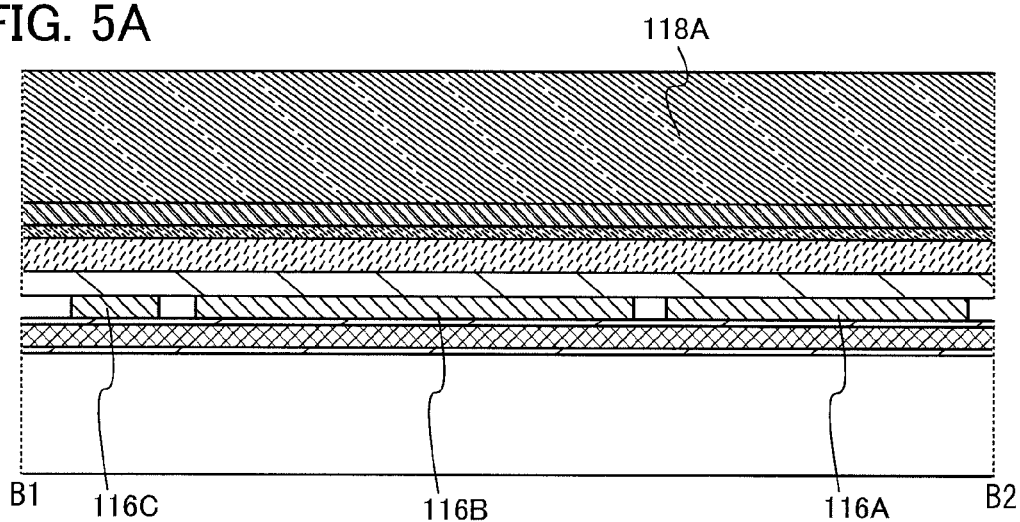
FIGS. 5A to 5C illustrate an example of a method for manufacturing the thin film transistor and the display device.
Figure 5B:
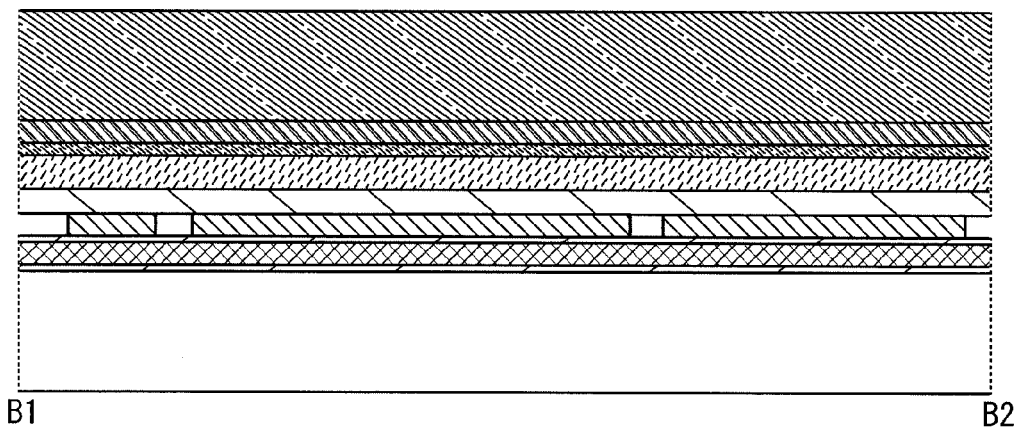
Figure 5C:
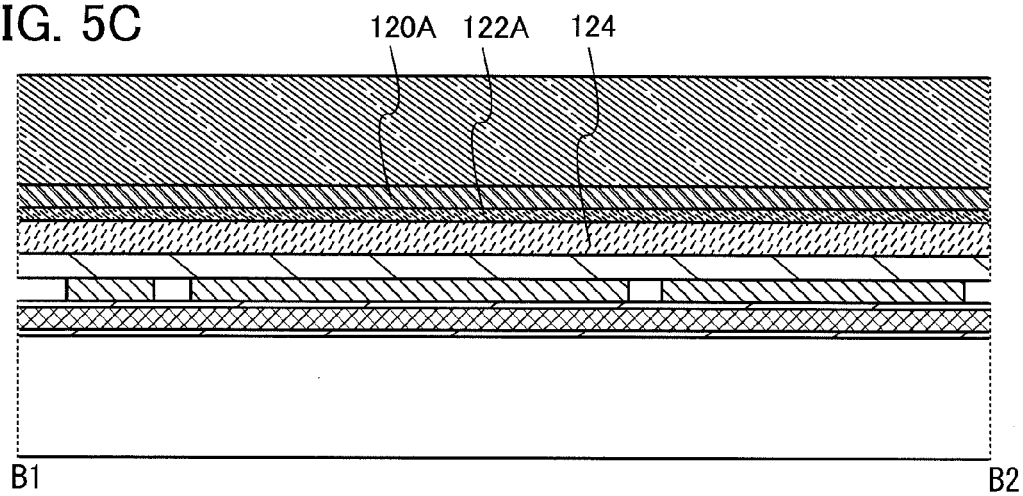
Figure 6A:
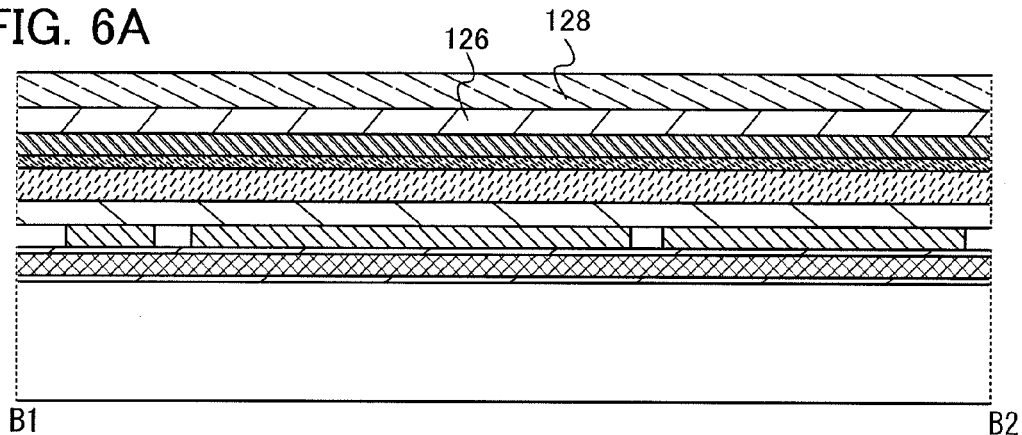
FIGS. 6A to 6C illustrate an example of a method for manufacturing the thin film transistor and the display device.
Figure 6B:
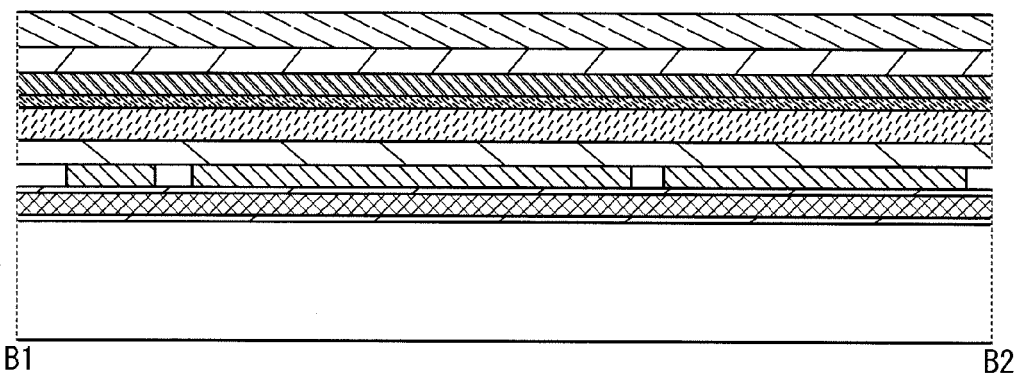
Figure 6C:
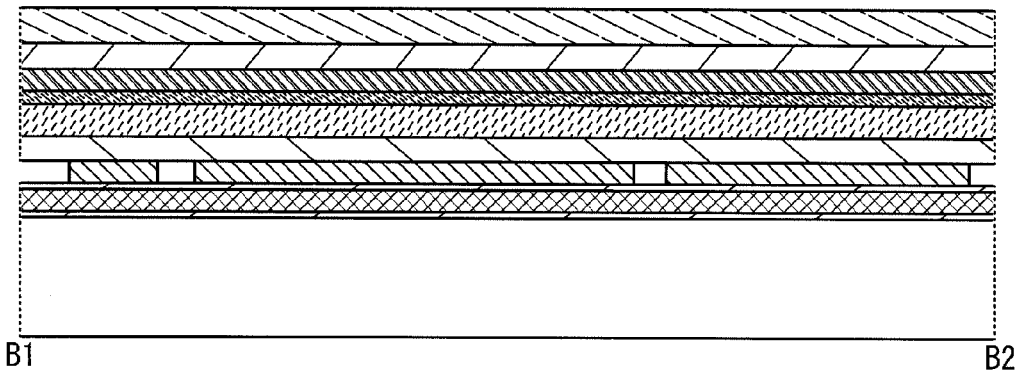
Figure 7A:
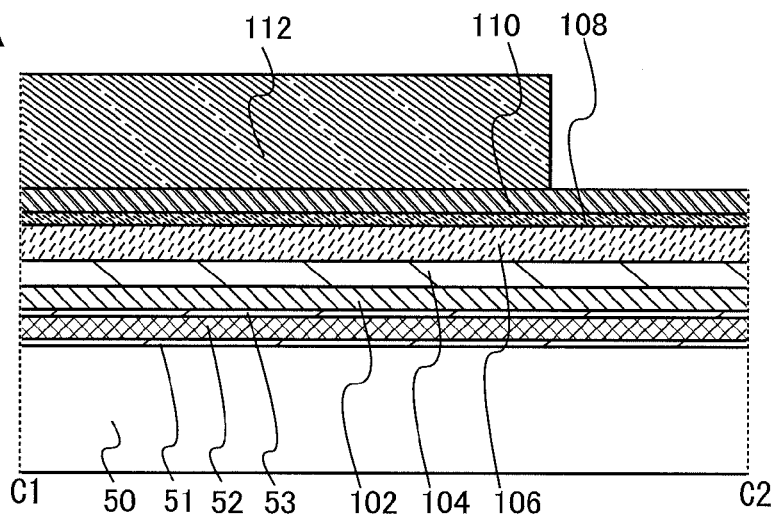
FIGS. 7A to 7C illustrate an example of a method for manufacturing the thin film transistor and the display device.
Figure 7B:
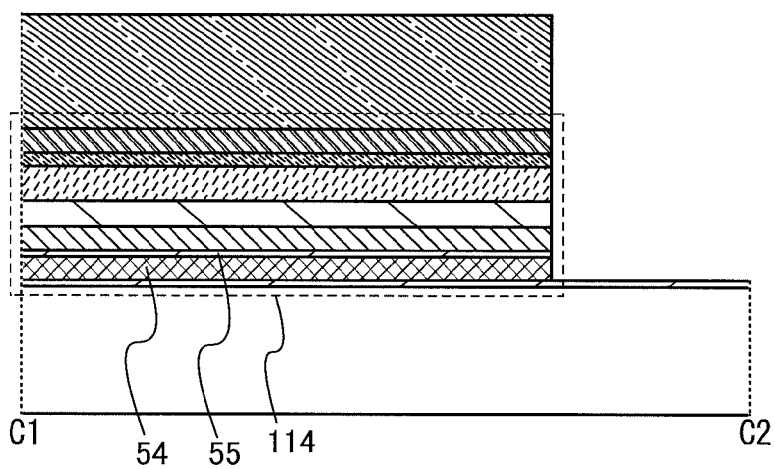
Figure 7C:
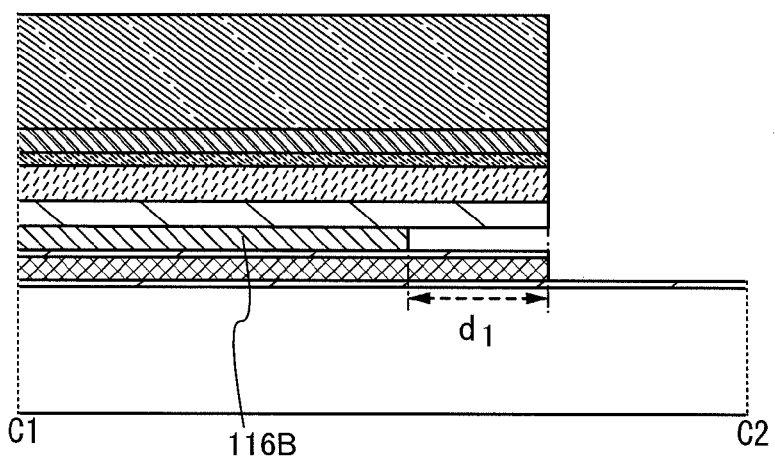
Figure 8A:
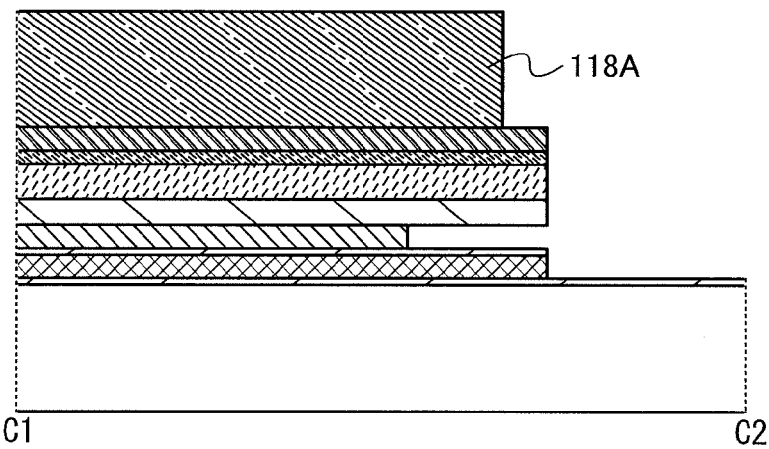
FIGS. 8A to 8C illustrate an example of a method for manufacturing the thin film transistor and the display device.
Figure 8B:
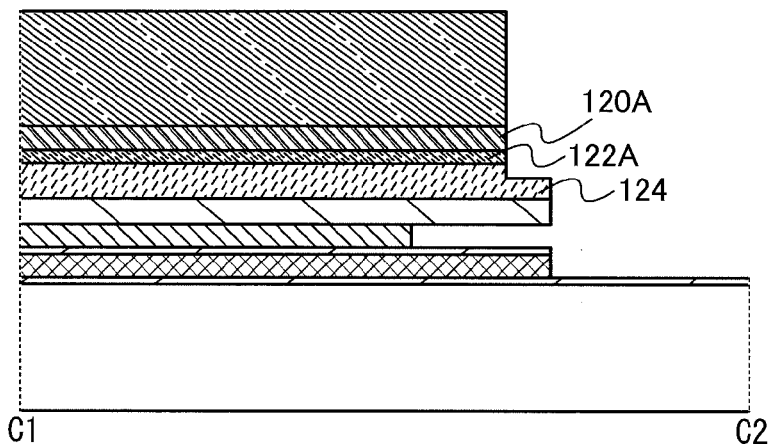
Figure 8C:
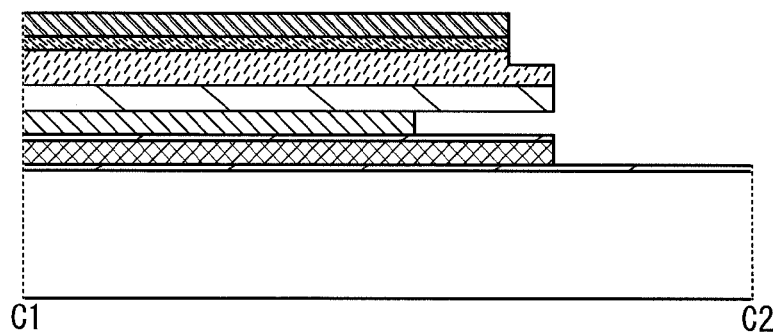
Figure 9A:
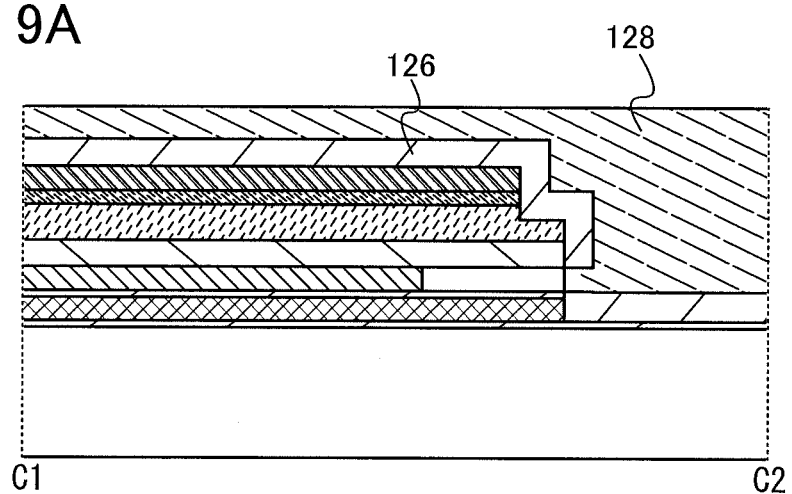
FIGS. 9A to 9C illustrate an example of a method for manufacturing the thin film transistor and the display device.
Figure 9B:
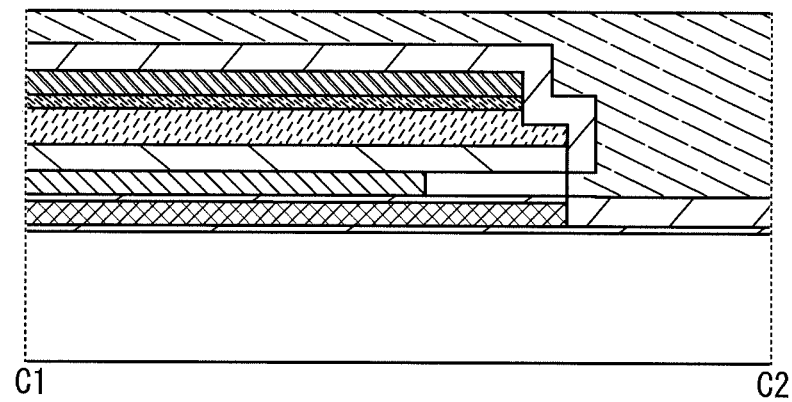
Figure 9C:
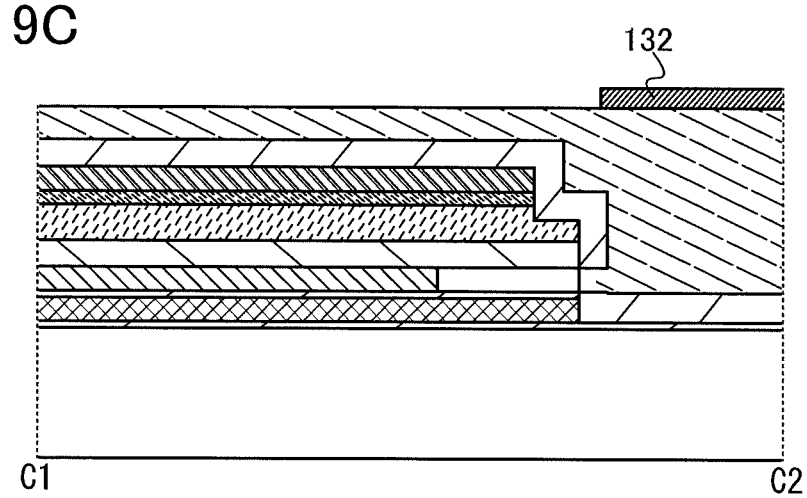
Figure 10A:
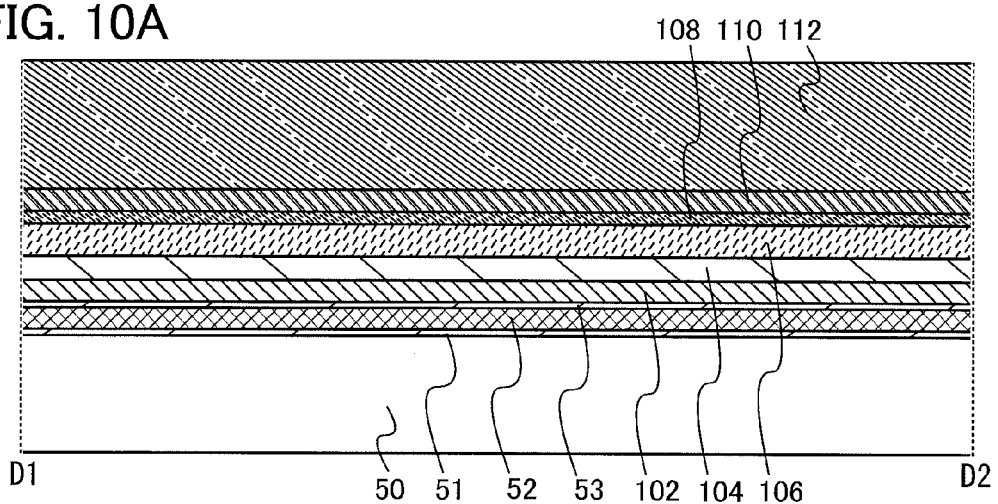
FIGS. 10A to 10C illustrate an example of a method for manufacturing the thin film transistor and the display device.
Figure 10B:
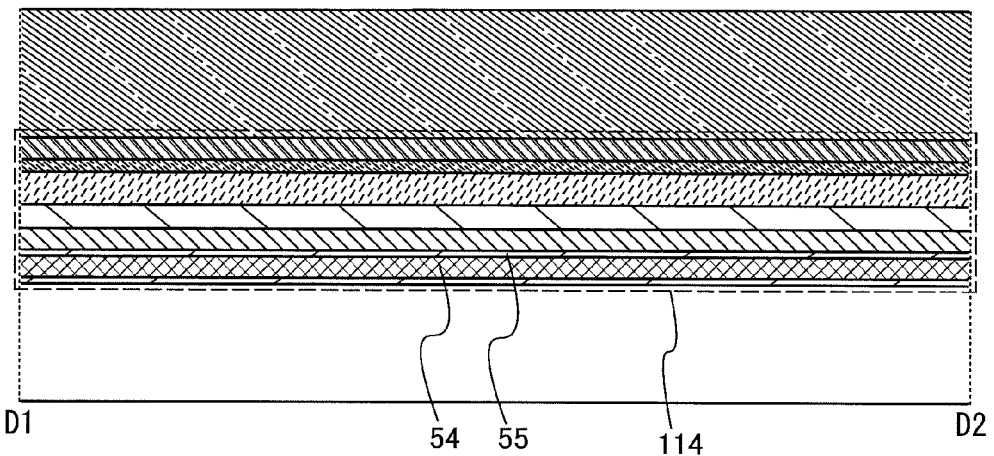
Figure 10C:
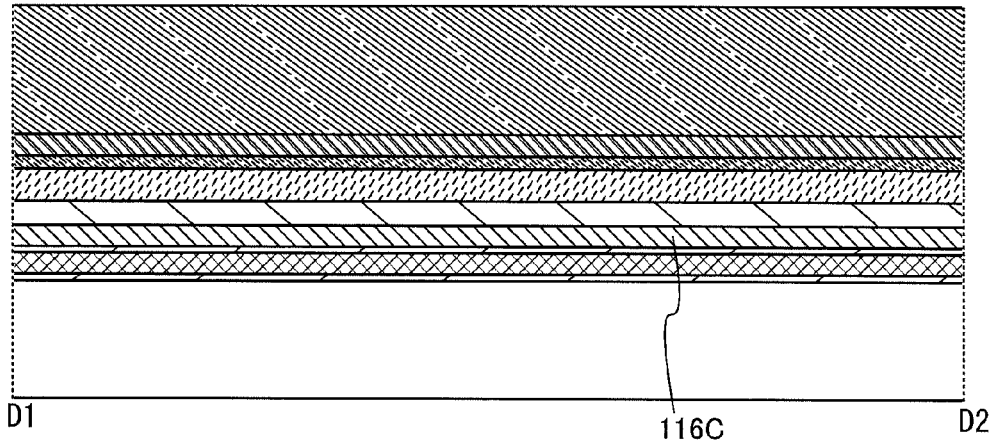
Figure 11A:
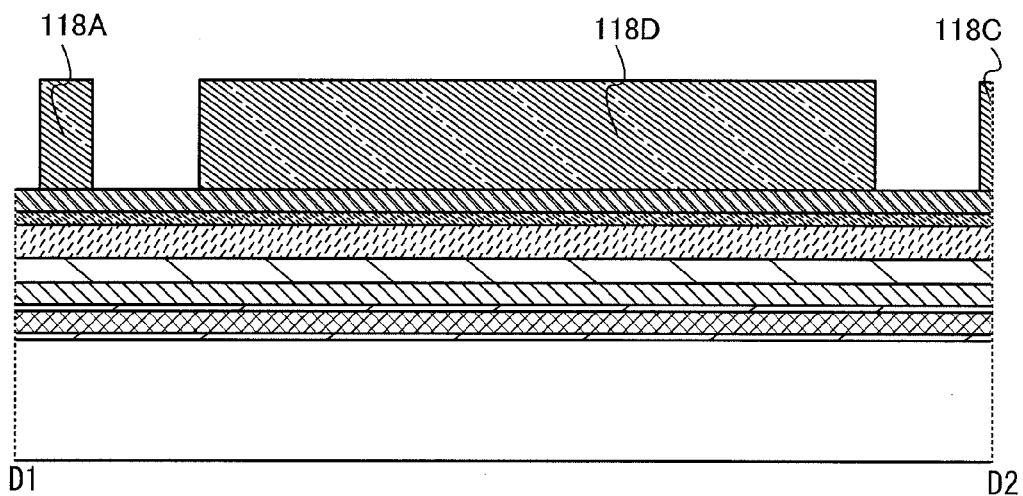
FIGS. 11A to 11C illustrate an example of a method for manufacturing the thin film transistor and the display device.
Figure 11B:
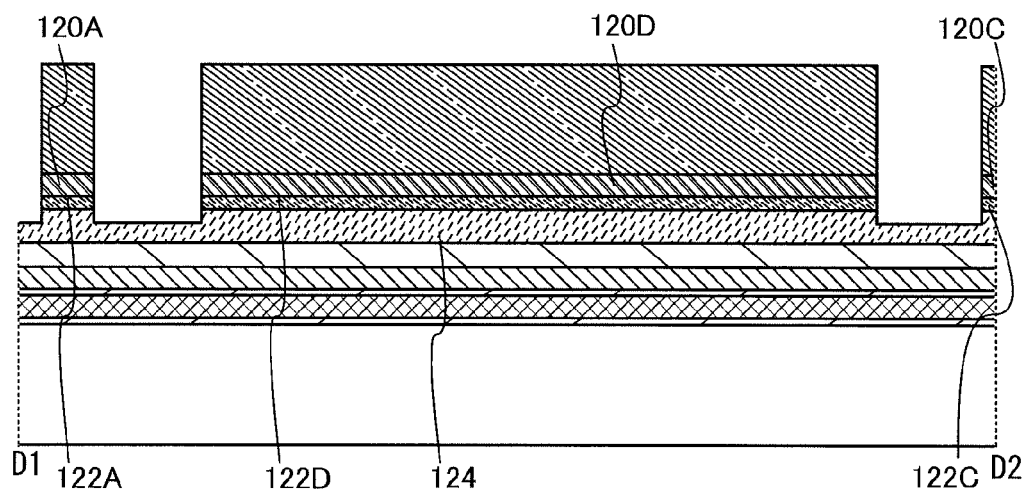
Figure 11C:
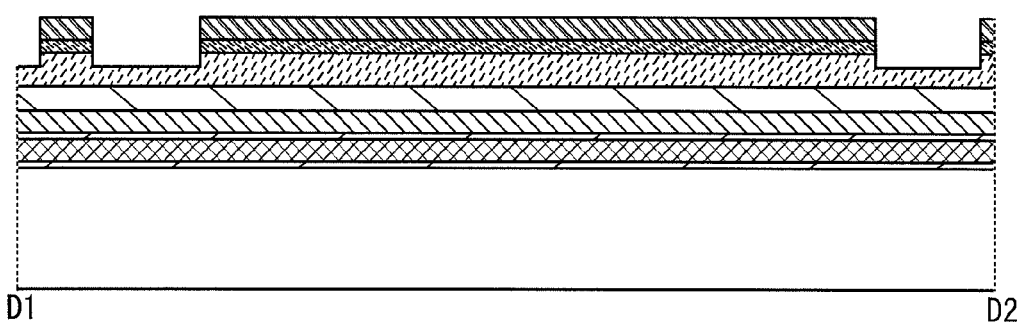
Figure 12A:
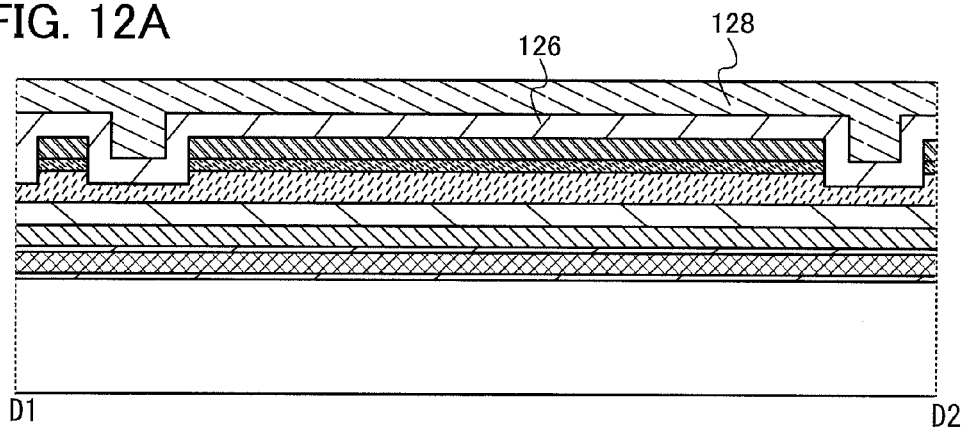
FIGS. 12A to 12C illustrate an example of a method for manufacturing the thin film transistor and the display device.
Figure 12B:
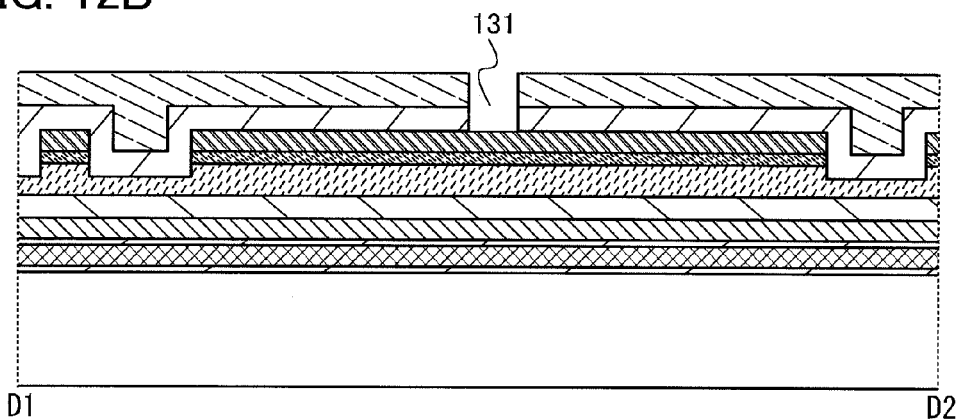
Figure 12C:
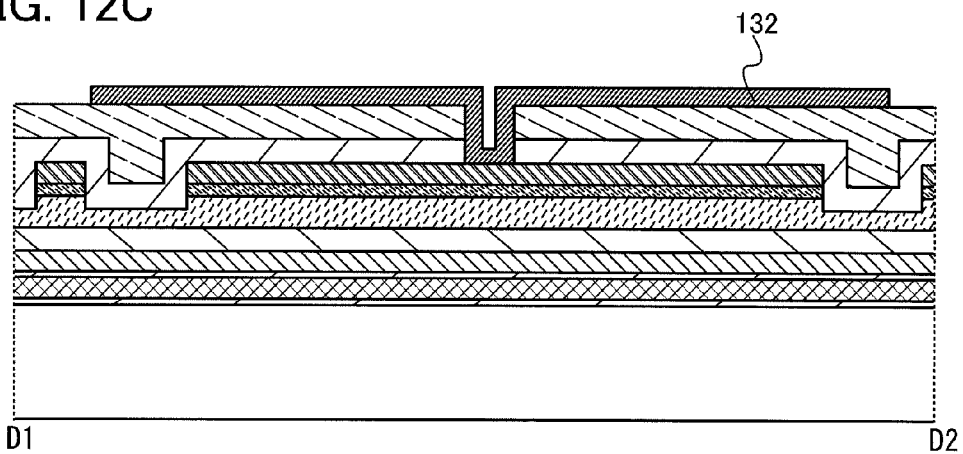
Figure 13A:
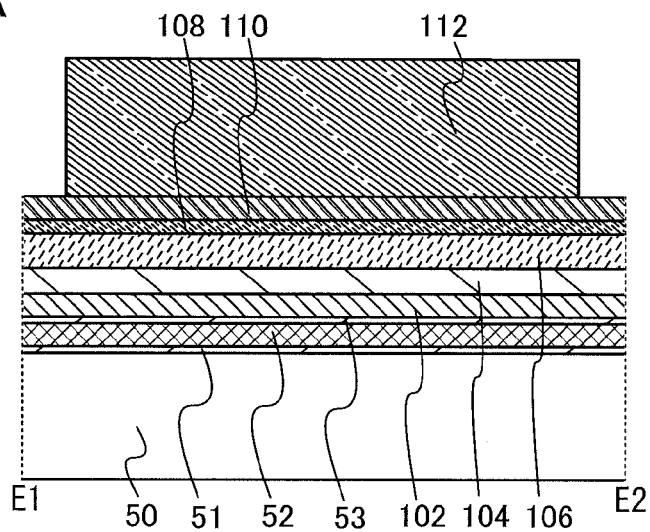
FIGS. 13A to 13C illustrate an example of a method for manufacturing the thin film transistor and the display device.
Figure 13B:
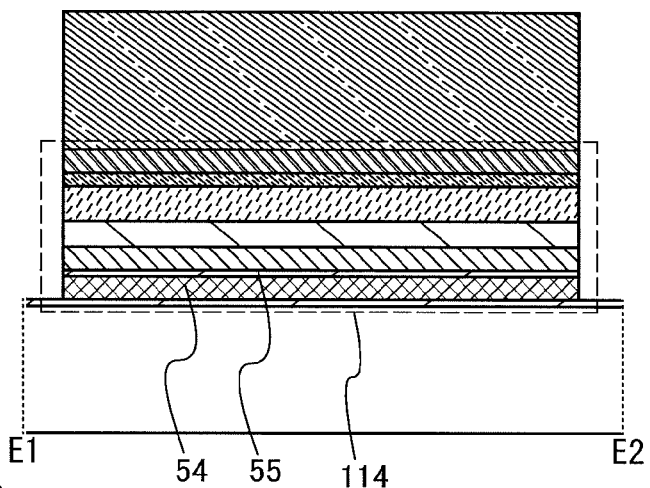
Figure 13C:
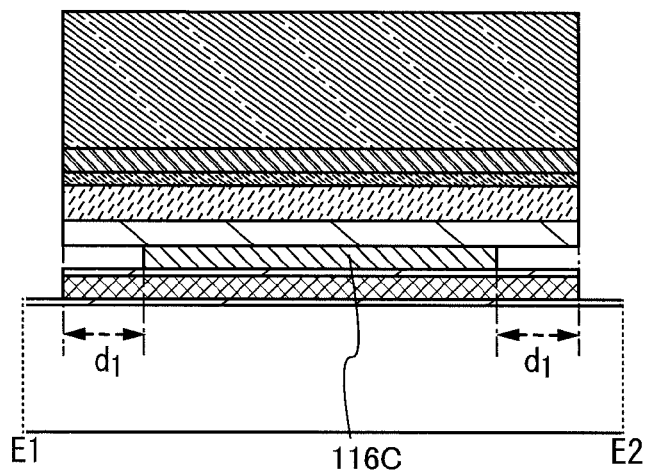
Figure 14A:
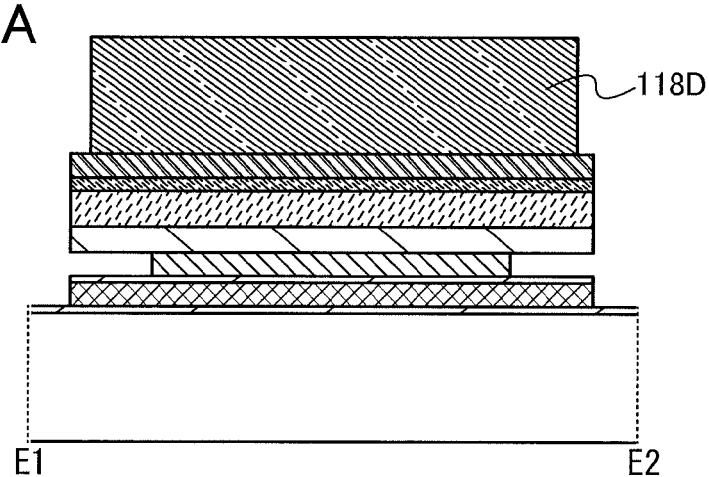
FIGS. 14A to 14C illustrate an example of a method for manufacturing the thin film transistor and the display device.
Figure 14B:
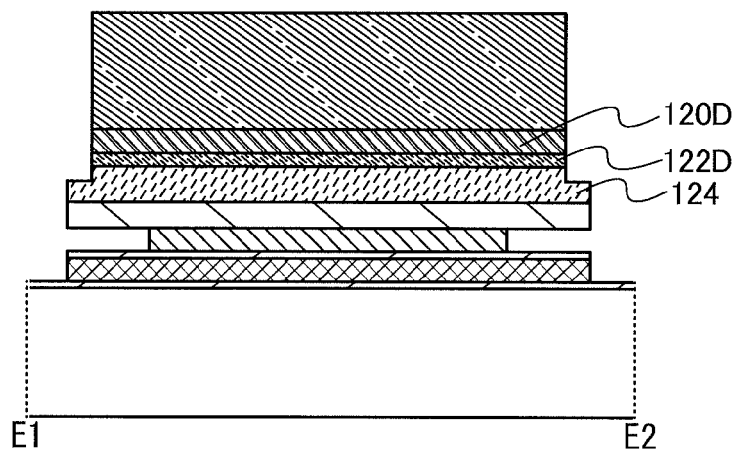
Figure 14C:
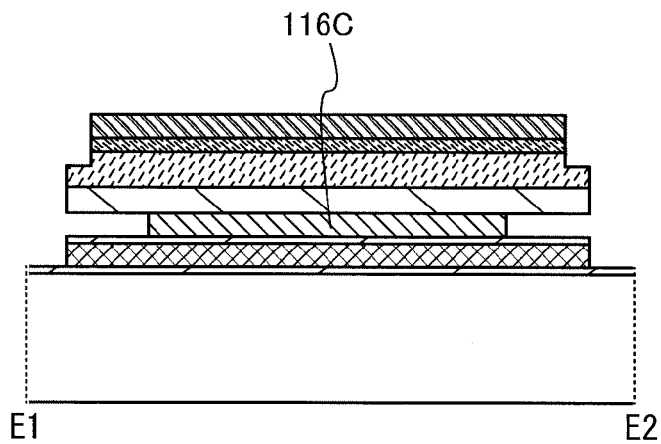

Next, the pixel electrode layer 132 is formed over the second insulating film (see FIG. 3C, FIG. 6C, FIG. 9C, FIG.

Figure 15A:
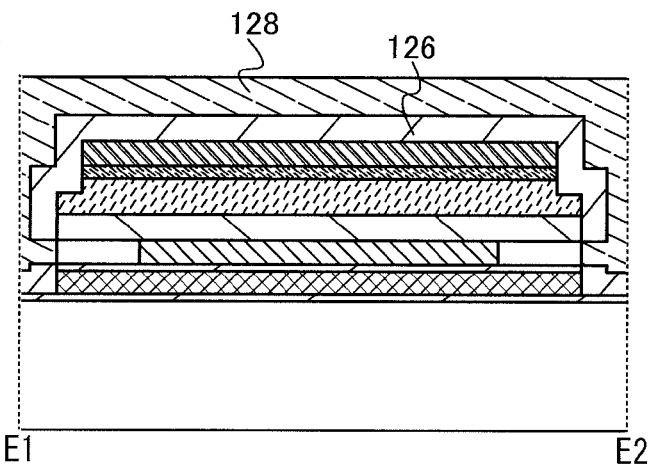
FIGS. 15A to 15C illustrate an example of a method for manufacturing the thin film transistor and the display device.
Figure 15B:
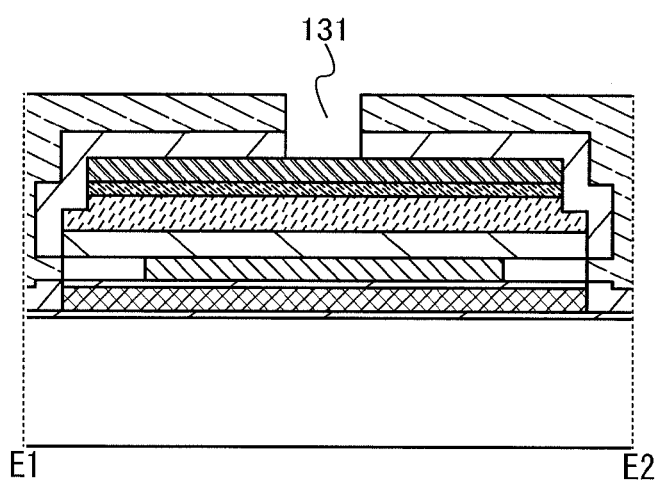
Figure 15C:
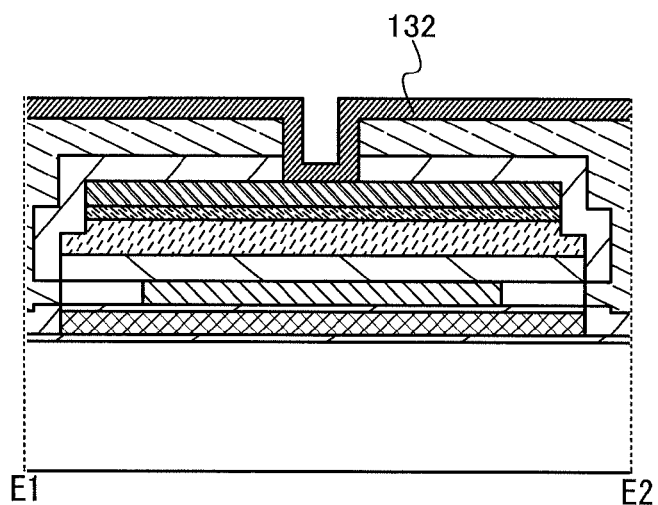
Figure 16:
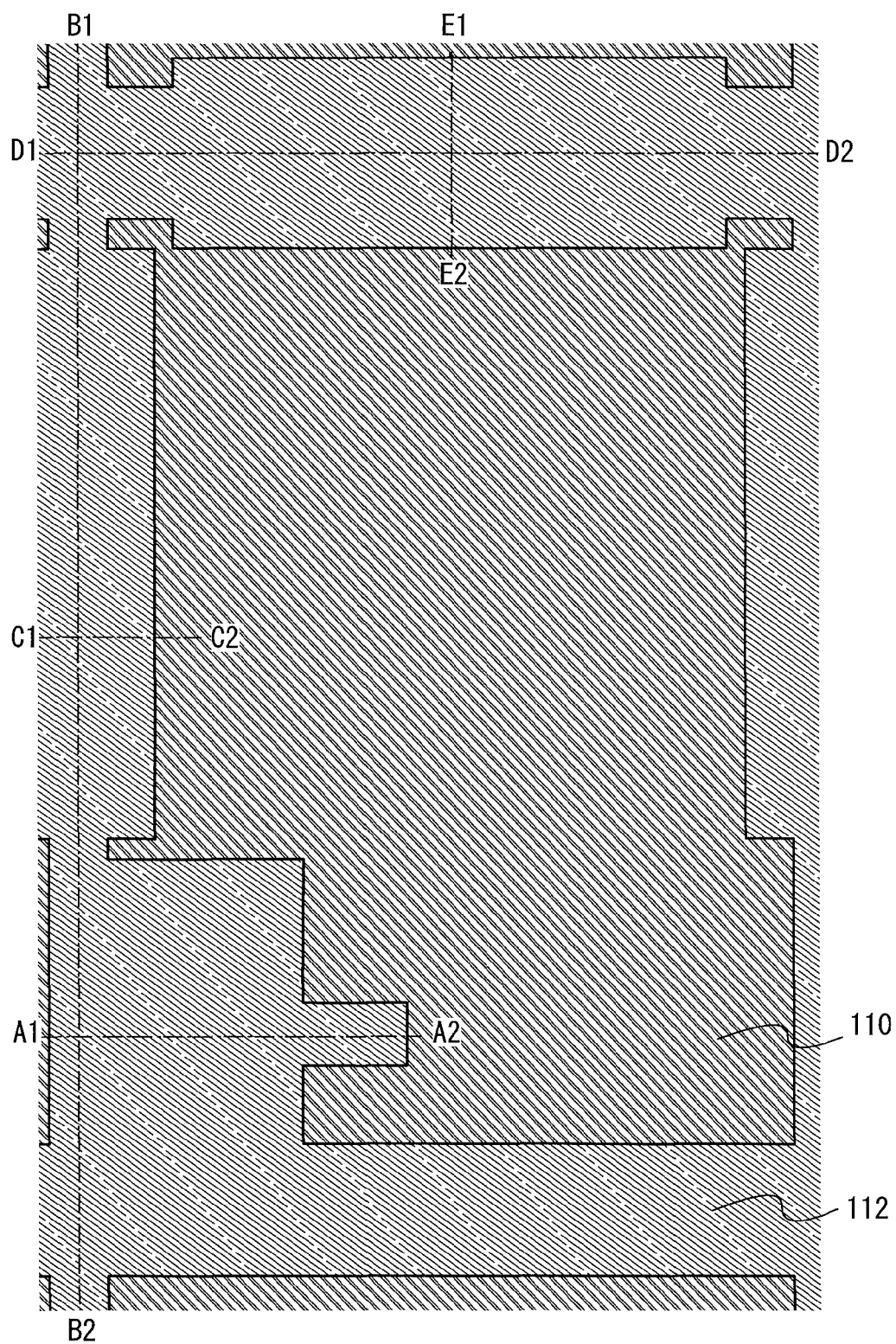
FIG. 16 illustrates an example of a method for manufacturing the thin film transistor and the display device.
Figure 17:
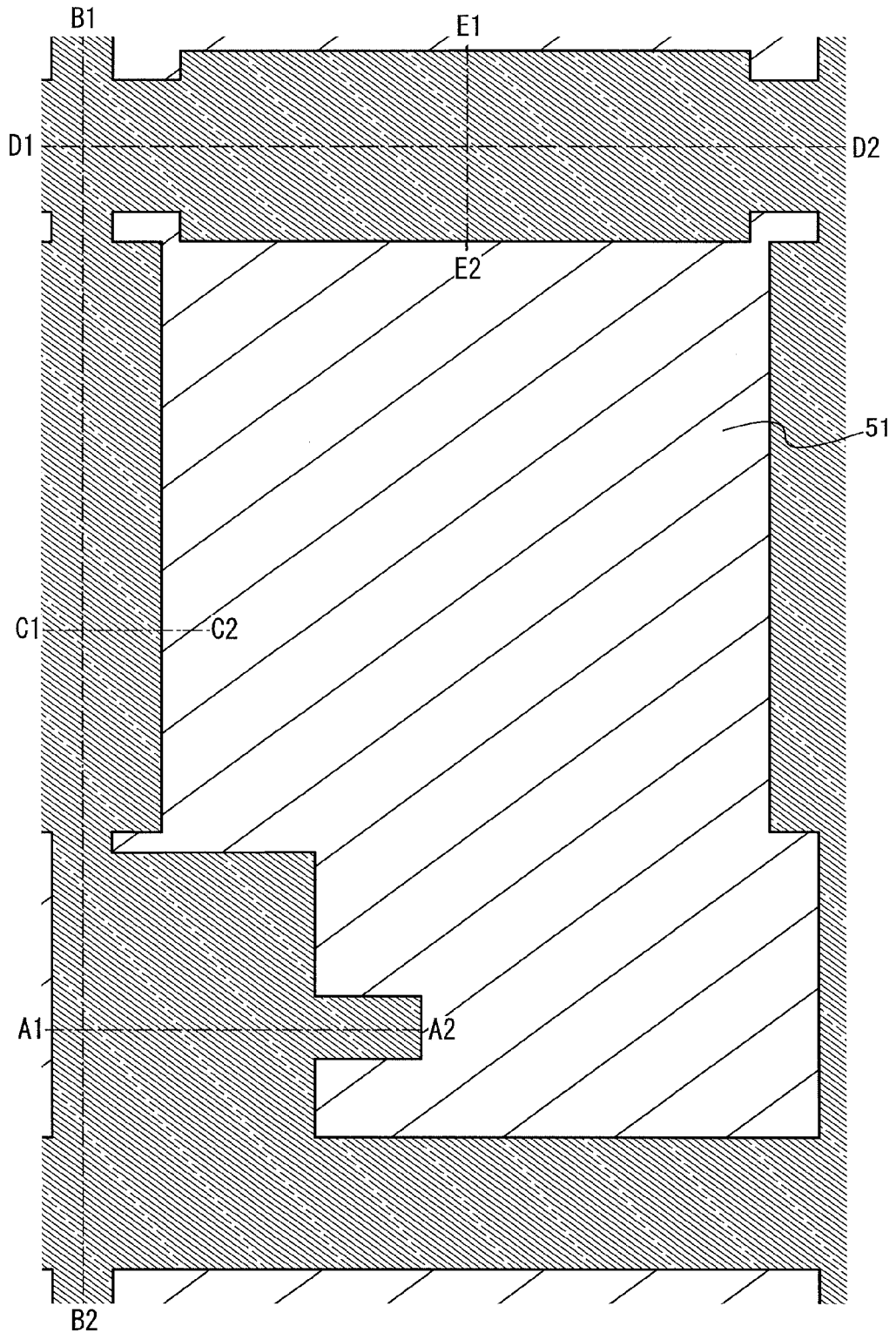
FIG. 17 illustrates an example of a method for manufacturing the thin film transistor and the display device.

12C, FIG. 15C, and FIG. 21). The pixel electrode layer 132 is formed so as to be connected to the source and drain electrode layer 120 through the opening portions. Specifically, the pixel electrode layer 132 is formed so as to be connected to the source and drain electrode layer 120B through the first opening portion 130 and connected to the source and drain electrode layer 120D through the second opening portion 131. The pixel electrode layer 132 is preferably formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of the conductive material having a light-transmitting property may be formed by a sputtering method, a CVD method, or the like; however, the formation method is not limited to a particular method. In addition, the pixel electrode layer 132 may be a single layer or a stacked film including a plurality of films.

In Embodiment 1, only the pixel electrode layer 132 is formed using a conductive material having a light-transmitting property; however, there is no limitation. As materials of the first conductive film 102 and the second conductive film 110, conductive materials having a light-transmitting property can also be used.

Note that in the case of forming the pixel electrode layer 132 by photolithography, one photomask is used.

In the above-described manner, manufacture of an active matrix substrate (so-called array process) is completed. As described in Embodiment 1, a gate electrode layer is formed utilizing side-etching; accordingly, a thin film transistor can be manufactured using the number of photomasks reduced by one compared to that in a conventional process. Further, a light-blocking layer can be formed without an additional photomask.

The aforementioned thin film transistor includes a base layer over a light-blocking layer, a gate electrode layer over the base layer, a gate insulating film over the gate electrode layer, a semiconductor layer over the gate insulating film, a source and drain region (an impurity semiconductor layer) over the semiconductor layer, a source and drain electrode layer over the source and drain region, and a cavity in contact with a side surface of the gate electrode layer. In addition, the gate insulating film is provided over only the gate electrode layer, so that the side surface of the gate electrode is not covered with the gate insulating film (see FIG. 3C). Since such a thin film transistor has a cavity in contact with a side surface of a gate electrode layer, leakage current at an end portion of the gate electrode layer is low. Further, since the light-blocking layer is included, a thin film transistor with low light leakage current can be manufactured.

Here, a terminal connection portion of the active matrix substrate manufactured in the above-described steps will be described with reference to FIG. 23, FIG. 24, and FIGS. 25A to 25C.

Figure 23:
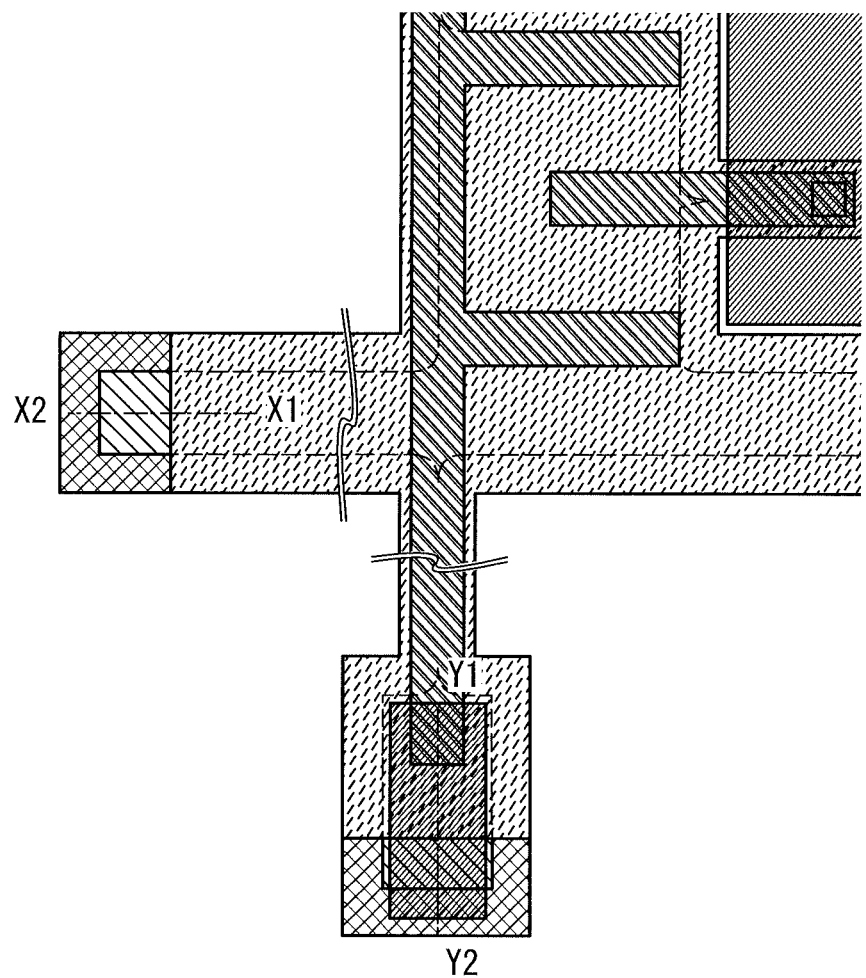
FIG. 23 illustrates a connection portion of an active matrix substrate.

FIG. 23 is a top view and FIG. 24 and FIGS. 25A to 25C are cross-sectional views of a terminal connection portion on the gate wiring side and a terminal connection portion on the source wiring side of the active matrix substrate manufactured in the above-described steps.

FIG. 23 is a top view of the gate wiring and the source wiring extended from the pixel portion in the terminal connection portion on the gate wiring side and in the terminal connection portion on the source wiring side.

Figure 24:
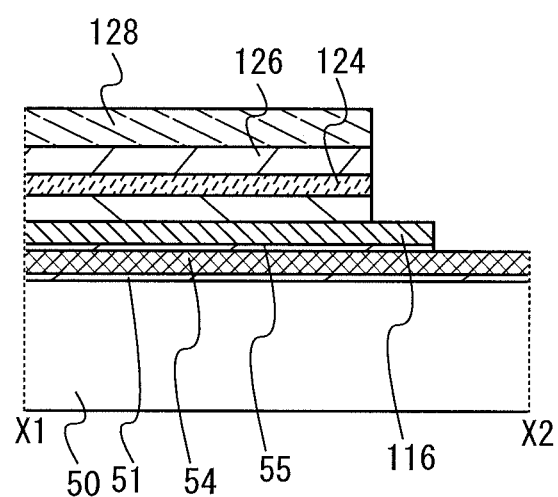
FIG. 24 illustrates a connection portion of the active matrix substrate.

FIG. 24 is a cross-sectional view taken along the line X1-X2 in FIG. 23. That is, FIG. 24 is a cross-sectional view of the terminal connection portion on the gate wiring side. In FIG. 24, a top surface of the gate electrode layer 116 and that of the light-blocking layer 54 are exposed. A terminal portion of an external input terminal is connected to the regions.

Figure 25A:
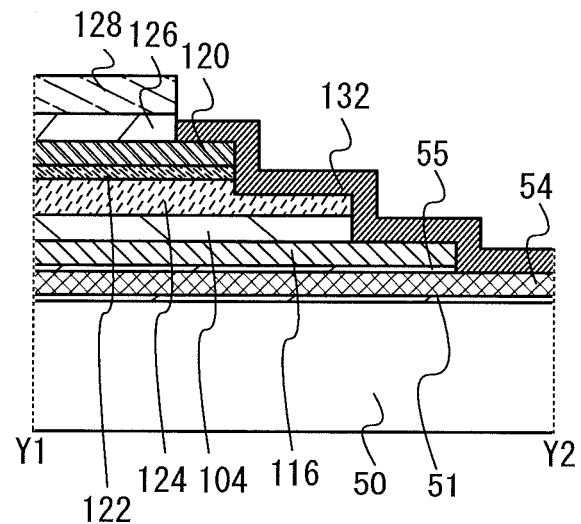
FIGS. 25A to 25C each illustrate a connection portion of the active matrix substrate.
Figure 25B:
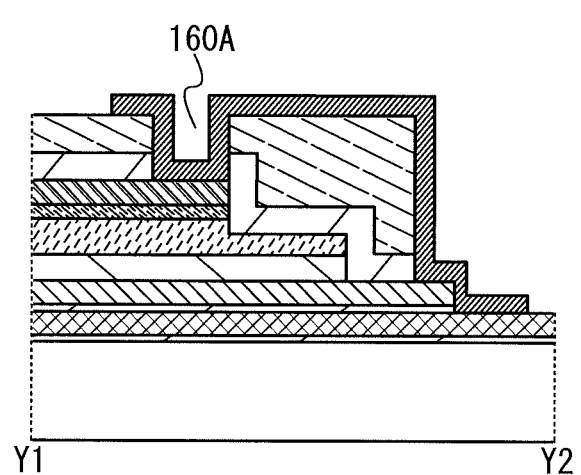
Figure 25C:
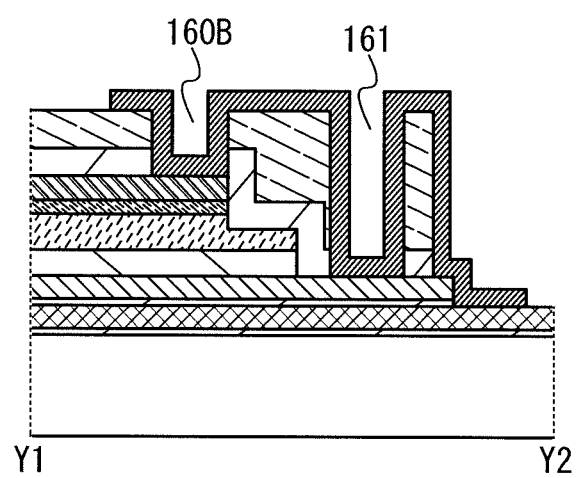

FIGS. 25A to 25C are cross-sectional views of the terminal connection portion on the source wiring side. In FIGS. 25A to 25C, the light-blocking layer 54, the gate electrode layer 116, and the source and drain electrode layer 120 are connected to one another through the pixel electrode layer 132. FIGS. 25A to 25C illustrate various connection modes between the gate electrode layer 116 and the source and drain electrode layer 120. Any of these modes or modes other than those illustrated in FIGS. 25A to 25C may be used for the terminal connection portion of a display device which is an embodiment of the present invention. The source and drain electrode layer 120 is connected to the light-blocking layer 54 and the gate electrode layer 116, whereby the height of a terminal connection surface in the source wiring side and that in the gate wiring side can be made roughly uniform.

In FIG. 25A, electrical connection can be realized in such a manner that end portions of the first protective film 126 and the second protective film 128 are removed by etching or the like to expose the light-blocking layer 54, the gate electrode layer 116, and the source and drain electrode layer 120, and the pixel electrode layer 132 is formed over the exposed region. FIG. 25A corresponds to the cross-sectional view taken along the line Y1-Y2 of FIG. 23.

Note that the formation of the region in which the light-blocking layer 54, the gate electrode layer 116, and the source and drain electrode layer 120 are exposed can be performed at the same time as the formation of the first opening portion 130 and the second opening portion 131. That is, the formation of the first opening portion 130 and the second opening portion 131 is performed under conditions such that the etching rate with respect to the light-blocking layer 54 and the gate electrode layer 116 are low and the etching rate with respect to the base film 53, the first insulating film 104, the semiconductor layer 124, the source and drain region 122, the first protective film 126, and the second protective film 128 are high.

In FIG. 25B, electrical connection can be realized in such a manner that a third opening portion 160A is provided in the first protective film 126 and the second protective film 128, end portions of the first protective film 126 and the second protective film 128 are removed by etching or the like to expose the light-blocking layer 54, the gate electrode layer 116, and the source and drain electrode layer 120, and the pixel electrode layer 132 is formed over the exposed region. Here, as in FIG. 25A, the end portions of the first protective film 126 and the second protective film 128 are removed by etching or the like and this region is used as a terminal connection portion.

Note that the formation of the third opening portion 160A and the formation of the region in which the light-blocking layer 54 and the gate electrode layer 116 are exposed can be performed at the same time as the formation of the first opening portion 130 and the second opening portion 131.

In FIG. 25C, electric connection can be realized in such a manner that a third opening portion 160B and a fourth opening portion 161 are provided in the first protective film 126 and the second protective film 128 to expose the light-blocking layer 54, the gate electrode layer 116, and the source and drain electrode layer 120, and the pixel electrode layer 132 is formed over the exposed region. Here, as in FIGS. 25A and 25B, end portions of the first protective film 126 and the second protective film 128 are removed by etching or the like and this region is used as a terminal connection portion.

Note that the formation of the third opening portion 160B and the fourth opening portion 161 and the formation of the region in which the gate electrode layer 116 and the light-blocking layer 54 are exposed can be performed at the same time as the formation of the first opening portion 130 and the second opening portion 131.

Note that there is no particular limitation on the number of opening portions. Either one opening portion or a plurality of opening portions may be provided for one terminal. In the case where a plurality of opening portions is provided for one terminal, even when some opening portions are not formed favorably due to insufficient etching for forming the opening portions, electric connection can be realized at the other opening portion and a fabrication yield is increased. Further, even in the case where all the opening portions are formed without any problems, the contact area can be increased and contact resistance can be reduced; therefore, it is preferable to provide a plurality of opening portions.

Next, a method for manufacturing a liquid crystal display device using the active matrix substrate for a display device, which is manufactured in the above-described steps, will be described. That is, a cell process and a module process will be described. Note that the cell process and the module process are not limited to the following description in the method for manufacturing a display device which is one embodiment of the present invention.

In the cell process, the active matrix substrate manufactured in the above-described steps and a substrate counter to the active matrix substrate (hereinafter referred to as a counter substrate) are attached to each other and liquid crystals are injected. First, a method for manufacturing the counter substrate will be briefly described below. Note that a film formed over the counter substrate may have a single layer structure or a stacked structure.

First, a light-blocking layer is formed over a substrate, a color filter layer of any of red, green, and blue is formed over the light-blocking layer, a pixel electrode layer is selectively formed over the color filter layer, and a rib is formed over the pixel electrode layer. Here, as the substrate, a substrate similar to the substrate 50 may be used. That is, for example, a glass substrate may be used.

As the light-blocking layer, a film of material having a light-blocking property is selectively formed. As the material having a light-blocking property, an organic resin containing a black resin (carbon black) can be used, for example. Alternatively, a stacked film which includes a film of a material containing chromium as its main component may be used. The film of a material containing chromium as its main component refers to a film of chromium, chromium oxide, or chromium nitride. The material used for the light-blocking layer is not particularly limited as long as it has a light-blocking property. The film of a material having a light-blocking property is formed by photolithography or the like.

The color filter layer may be selectively formed using an organic resin film which transmits only light of any of red, green, and blue when irradiated with white light from a backlight. The color filter layer can be selectively formed by selective formation of color materials. The arrangement of the color filter may be a stripe arrangement, a delta arrangement, or a square arrangement.

The pixel electrode layer over the counter substrate can be formed in a manner similar to the pixel electrode layer 132 included in the active matrix substrate. Since the selective formation is not necessary because the pixel electrode layer of the counter substrate has a common potential, and the pixel electrode layer may be formed over the entire surface of the counter substrate.

The rib formed over the pixel electrode is an organic resin film formed with a pattern for the purpose of widening the viewing angle. The rib does not need to be formed in the cases where it is not particularly necessary.

As the method for manufacturing the counter substrate, there are other various modes. For example, after formation of the color filter layer and before formation of the pixel electrode layer, an overcoat layer may be formed. By formation of the overcoat layer, planarity of a surface on which the pixel electrode is formed can be improved, thereby increasing a yield. In addition, part of a material included in the color filter layer can be prevented from entering a liquid crystal material. For the overcoat layer, a thermosetting material containing an acrylic resin or an epoxy resin as a base is used.

Further, before or after formation of the rib, a post spacer (columnar spacer) may be formed as a spacer. The post spacer means structural objects formed at constant intervals over the counter substrate in order to keep the gap between the active matrix substrate and the counter substrate constant. In the case of using a bead spacer (spherical spacer), the post spacer does not need to be formed.

Next, an alignment film is formed over the active matrix substrate and the counter substrate. Formation of the alignment film is performed, for example, in such a manner that a polyimide resin or the like is dissolved in an organic solvent, this solution is applied by a printing method, a spin coating method, or the like, and then the organic solvent is evaporated and the substrates are subjected to baking. The thickness of the formed alignment film is generally approximately greater than or equal to 50 nm and less than or equal to 100 nm. Rubbing treatment is performed on the alignment film to align liquid crystal molecules with a certain pretilt angle. The rubbing treatment is performed, for example, by rubbing the alignment film with a cloth having long fibers such as velvet.

Then, the active matrix substrate and the counter substrate are attached to each other with a sealant. In the case where the post spacer is not provided on the counter substrate, the bead spacer may be dispersed in a desired region and attachment may be performed.

Next, a liquid crystal material is injected in a space between the active matrix substrate and the counter substrate, which are attached to each other. After injection of the liquid crystal material, an inlet for injection is sealed with an ultraviolet curing resin or the like. Alternatively, after dropping a liquid crystal material on either one of the active matrix substrate and the counter substrate, these substrates may be attached to each other.

Next, a polarizing plate is attached to both surfaces of a liquid crystal cell, which is formed by attachment of the active matrix substrate and the counter substrate. Then, the cell process is finished.

Next, as the module process, a flexible printed circuit (FPC) is connected to an input terminal (in FIG. 25, the region in which the gate electrode layer 116 is exposed) of the terminal portion. The FPC has a wiring formed of a conductive film over an organic resin film such as polyimide, and is connected to the input terminal through an anisotropic conductive paste (hereinafter referred to as an ACP). The ACP includes a paste functioning as an adhesive and particles plated with gold or the like to have a conductive surface, which have a diameter of several tens of micrometers to several hundreds of micrometers. When the particles mixed in the paste are in contact with the conductive layer over the input terminal and the conductive layer over the terminal connected to the wiring formed in the FPC, electric connection therebetween can be achieved. In addition, after connection of the FPC, a polarizing plate may be attached to the active matrix substrate and the counter substrate. In the above-described manner, a liquid crystal panel used for a display device can be manufactured.

Note that the first etching is used in formation of the light-blocking layer in Embodiment 1; however, this embodiment is not limited thereto and the first etching is performed to etch films up to the first insulating film, films up to the first conductive film, or films up to the base film, the second etching is performed, then the light-blocking layer and the like may be etched.

As described in Embodiment 1, the gate electrode can be formed without an additional photomask. The pixel transistor of the display device can be manufactured using two photomasks, and the active matrix substrate can be manufactured using four photomasks. Accordingly, the number of steps for manufacturing a thin film transistor and a display device can be significantly reduced.

In addition, a complicated step such as back light exposure, resist reflow, or a lift-off method is not required to be performed unlike the conventional technique aimed at reduction of the number of photomasks.

Further, the number of steps of manufacturing a thin film transistor can be significantly reduced while electric characteristics of the thin film transistor are maintained.

Moreover, since the semiconductor layer can be shielded from light, a thin film transistor having favorable electric characteristics, in which light leakage current is reduced, and a display device having favorable display quality can be manufactured. Further, the light-blocking layer which shields the semiconductor layer from light can be formed using a photomask that is used for formation of the thin film transistor. Accordingly, the thin film transistor having favorable electric characteristics, in which light leakage current is reduced, and the display device having favorable display quality can be manufactured without increasing the number of masks.

Furthermore, since a thin film transistor in which leakage current generated at an end portion of the gate electrode layer is small can be manufactured, a display device with a high contrast ratio and favorable display quality can be obtained.

The pixel structure of the display device is not limited to the one described above and can be applied to a variety of liquid crystal display devices.

Embodiment 2

In Embodiment 2, a method for manufacturing a thin film transistor and a method for manufacturing a display device, which are one embodiment of the present invention and are different from those of Embodiment 1, will be described with reference to FIGS. 26A1, 26A2, 26B1, and 26B2, FIGS. 27A to 27C, FIGS. 28A to 28C, FIG. 29, FIG. 30, and FIG. 31. Specifically, a method for manufacturing a thin film transistor which is similar to that of Embodiment 1, using a multi-tone mask will be described.

Figure 27A:
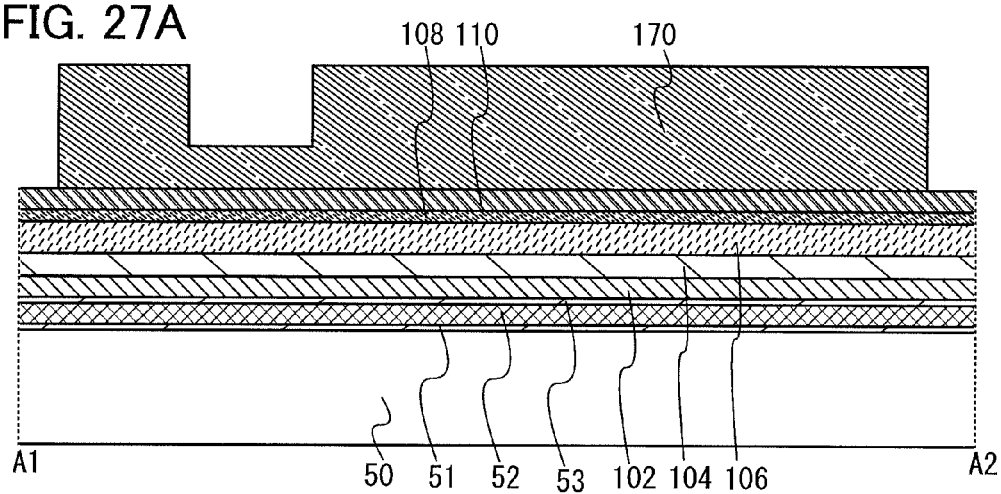
FIGS. 27A to 27C illustrate an example of a method for manufacturing a thin film transistor and a display device.
Figure 27B:
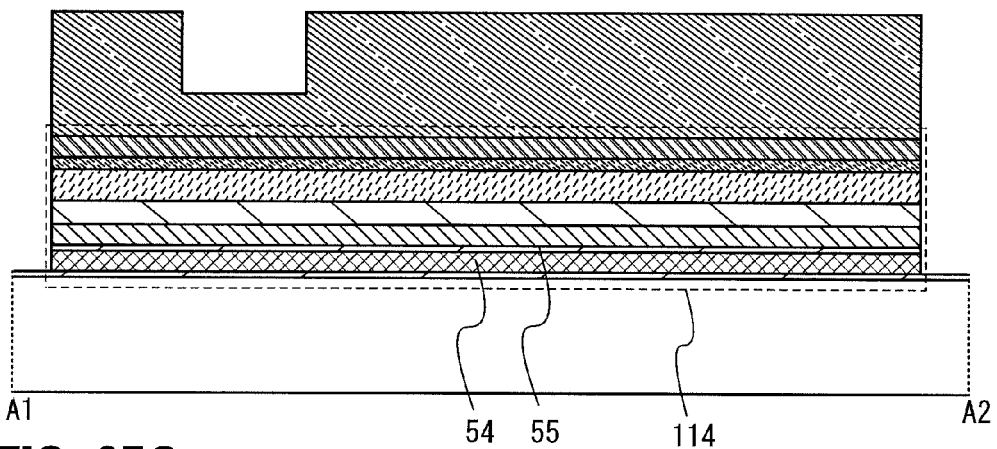
Figure 27C:
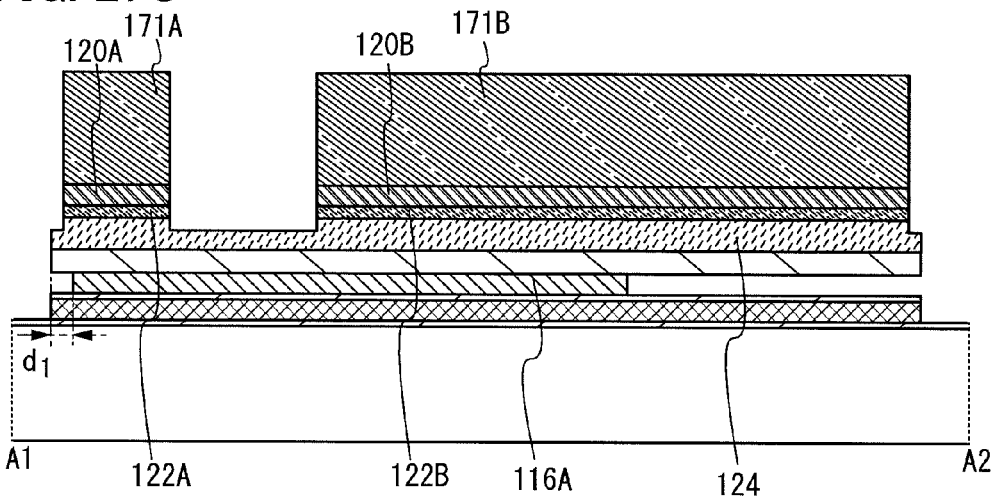
Figure 28A:
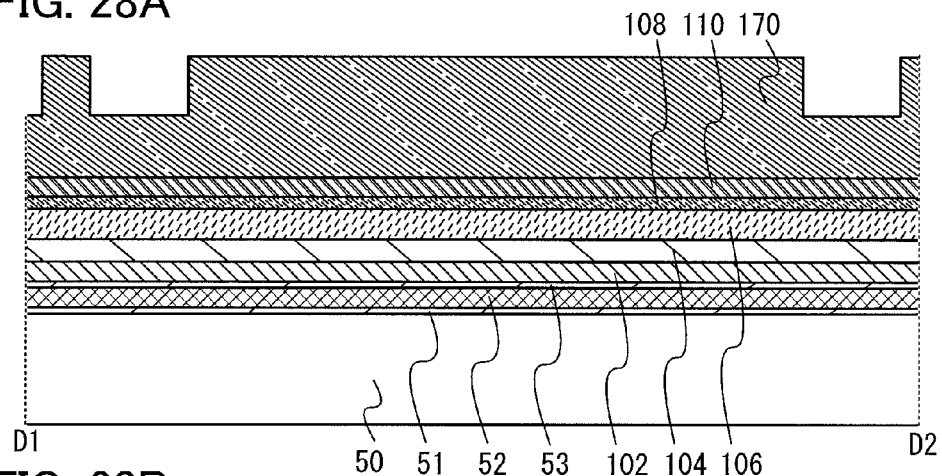
FIGS. 28A to 28C illustrate an example of a method for manufacturing the thin film transistor and the display device.
Figure 28B:
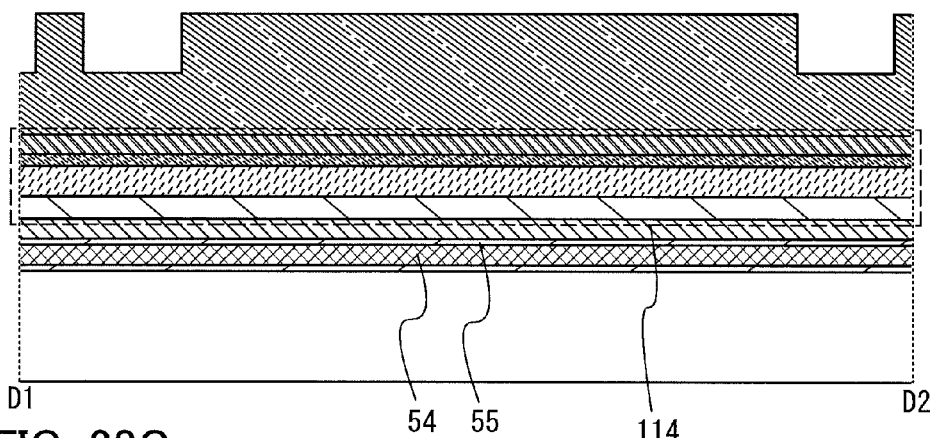
Figure 28C:
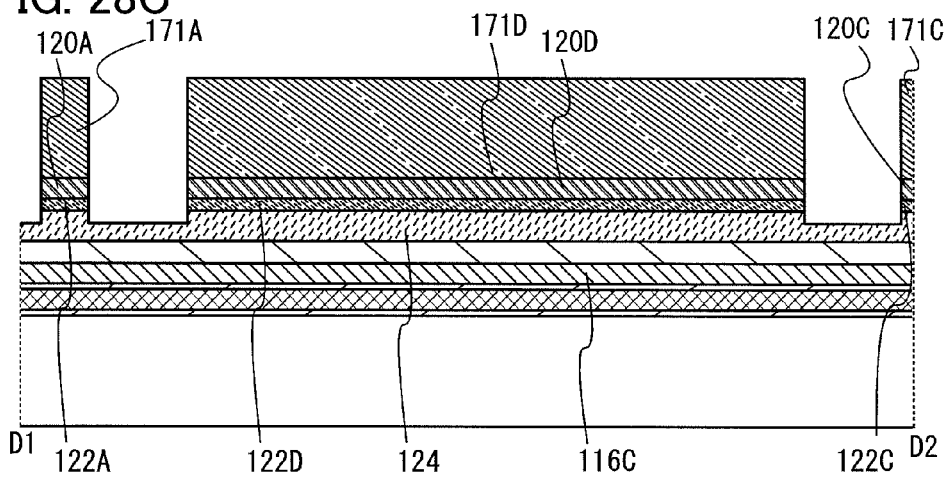
Figure 29:
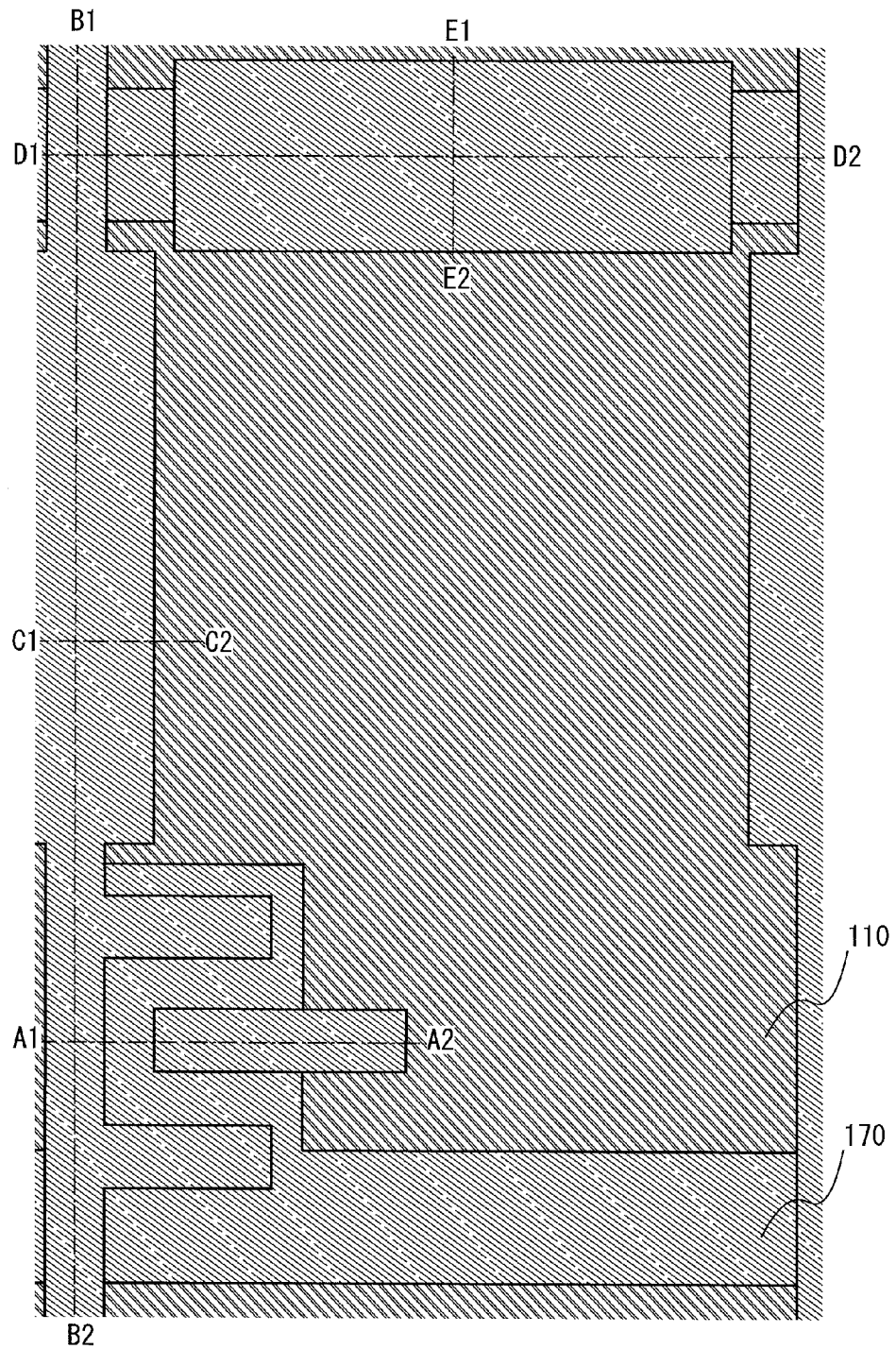
FIG. 29 illustrates an example of a method for manufacturing the thin film transistor and the display device.
Figure 30:
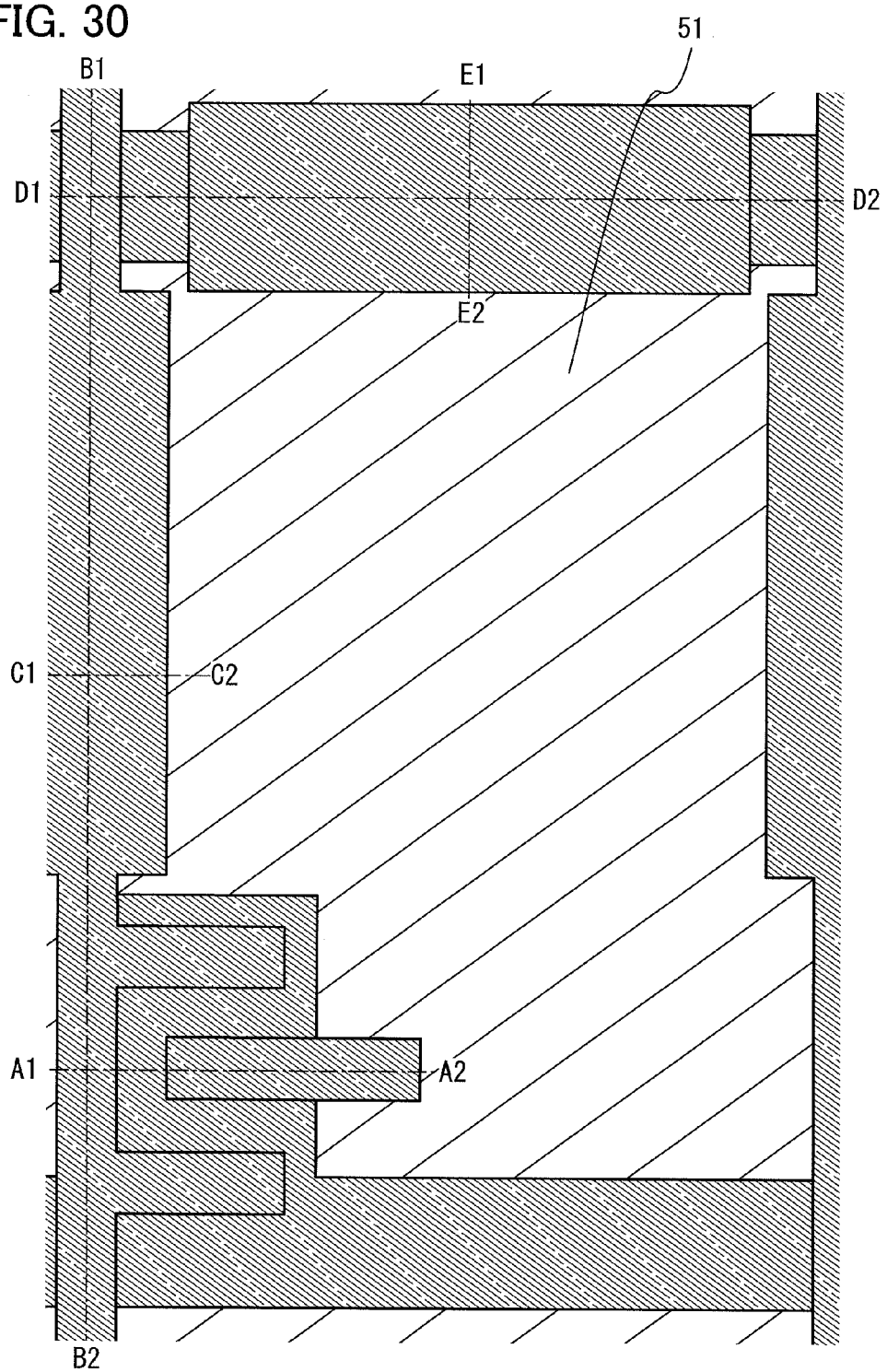
FIG. 30 illustrates an example of a method for manufacturing the thin film transistor and the display device.
Figure 31:
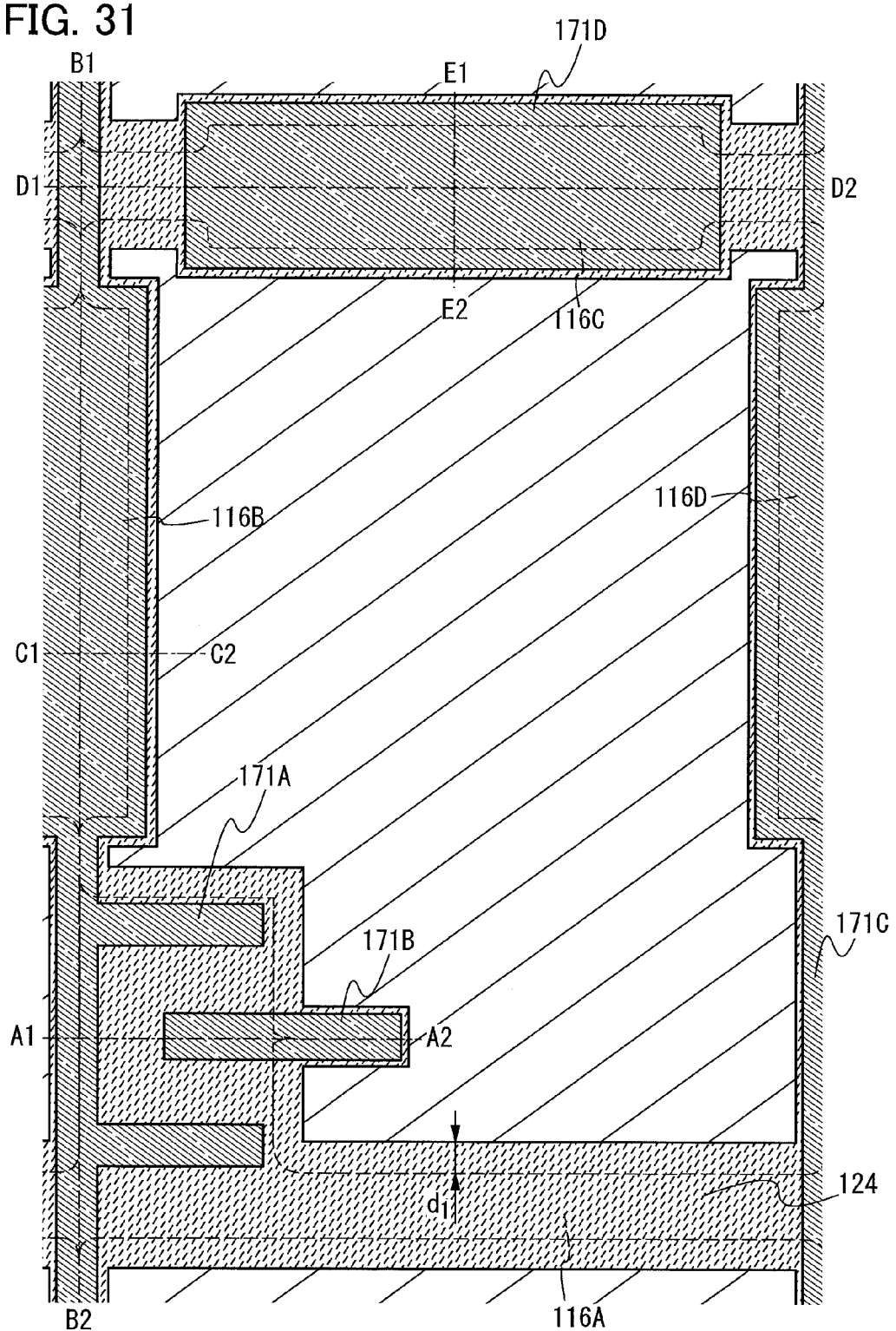
FIG. 31 illustrates an example of a method for manufacturing the thin film transistor and the display device.

Note that FIGS. 27A to 27C correspond to FIGS. 1A to 1C and FIGS. 2A to 2C in Embodiment 1. FIGS. 28A to 28C correspond to FIGS. 10A to 10C and FIGS. 11A to 11C in Embodiment 1. FIG. 29, FIG. 30, and FIG. 31 correspond to FIG. 16, FIG. 17, and FIG. 20 in Embodiment 1. Cross-sectional views taken along the line A1-A2 in FIG. 29, FIG. 30, and FIG. 31 correspond to FIGS. 27A to 27C, and cross-sectional views taken along the line D1-D2 in FIG. 29, FIG. 30, and FIG. 31 correspond to FIGS. 28A to 28C.

First, in a manner similar to Embodiment 1, steps up to formation of a second conductive film 110 are performed (see FIGS. 27A and 28A and FIG. 29). Materials which can be used in the formation and formation methods thereof are similar to those in Embodiment 1. Further, a base film 51 is preferably provided between a substrate 50 and a light-blocking film 52. In the case where a region capable of an ohmic contact with a source and drain electrode layer is provided in part of the semiconductor layer, which is formed using a semiconductor film 106, by doping or the like, an impurity semiconductor film 108 need not be provided.

Next, a first resist mask 170 is formed over the second conductive film 110 (see FIG. 27A, FIG. 28A, and FIG. 29). The first resist mask 170 in Embodiment 2 is a resist mask having a depressed portion and a projected portion. In other words, the first resist mask 170 can also be referred to as a resist mask including a plurality of regions (here, two regions) having different thicknesses. In the first resist mask 170, the thick region is called a projected portion of the first resist mask 170 and the thin region is called a depressed portion of the first resist mask 170.

In the first resist mask 170, the projected portion is formed in a region where a source and drain electrode layer 120 is formed, and the depressed portion is formed in a region where a semiconductor layer is exposed without presence of the source and drain electrode layer 120.

The first resist mask 170 can be formed using a multi-tone mask. Here, description is made on multi-tone photomasks with reference to FIGS. 26A1, 26A2, 26B1, and 26B2.

A multi-tone mask is a mask capable of light exposure with multi-level light intensity, typically, light exposure with three levels of light intensity to provide an exposed region, a half-exposed region, and an unexposed region. When using the multi-tone mask, one-time light exposure and development process allows a resist mask with plural thicknesses (typically, two levels of thicknesses) to be formed. Therefore, by the usage of a multi-tone mask, the number of photomasks can be reduced.

Figure 26A:
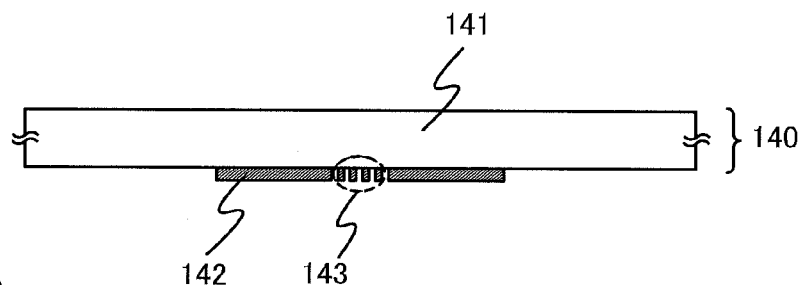
FIGS. 26A, 26B, 26C, and 26D illustrate multi-tone masks.
Figure 26B:
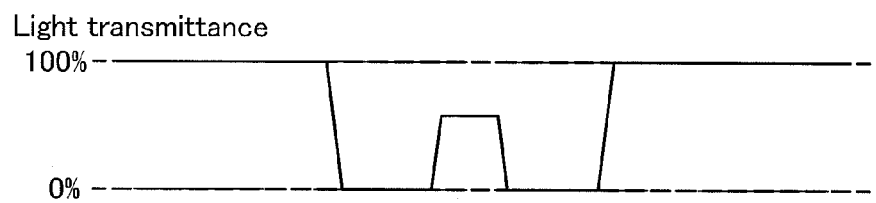
Figure 26C:
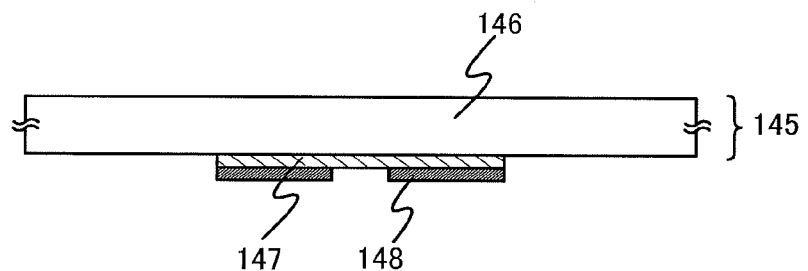

FIG. 26A and FIG. 26C are cross-sectional views of typical multi-tone masks. A gray-tone mask 140 is illustrated in FIG. 26A and a half-tone mask 145 is illustrated in FIG. 26C.

The gray-tone mask 140 illustrated in FIG. 26A includes a light-blocking portion 142 formed using a light-blocking layer on a substrate 141 having a light-transmitting property, and a diffraction grating portion 143 provided with a pattern of the light-blocking layer.

The diffraction grating portion 143 has slits, dots, mesh, or the like that are provided at an interval equal to or less than the resolution limit of light used for light exposure, whereby the amount of light transmitted through the diffraction grating portion 143 is controlled. Note that the slits, dots, or mesh provided at the diffraction grating portion 143 may be provided at regular or irregular intervals.

As the substrate 141 having a light-transmitting property, quartz or the like can be used. The light-blocking layer for forming the light-blocking portion 142 and the diffraction grating portion 143 may be formed using a metal film and preferably provided using chromium, chromium oxide, or the like.

In the case where the gray-tone mask 140 is irradiated with light for light exposure, as illustrated in FIG. 26B, the transmittance in the region overlapping with the light-blocking portion 142 is 0%, and the transmittance in the region where neither the light-blocking portion 142 nor the diffraction grating portion 143 is provided is 100%. Further, the transmittance at the diffraction grating portion 143 is basically in the range of 10% to 70%, which can be adjusted by the interval of slits, dots, mesh, or the like of the diffraction grating.

The half-tone mask 145 illustrated in FIG. 26C includes a semi-light-transmitting portion 147 formed using a semi-light-transmitting film on a substrate 146 having a light-transmitting property, and a light-blocking portion 148 formed using a light-blocking layer.

The semi-light-transmitting portion 147 can be formed using a film of MoSiN, MoSi, MoSiO, MoSiON, CrSi, or the like. The light-blocking portion 148 may be formed using a metal film in a manner similar to the light-blocking layer of the gray-tone mask and preferably provided using chromium, chromium oxide, or the like.

Figure 26D:
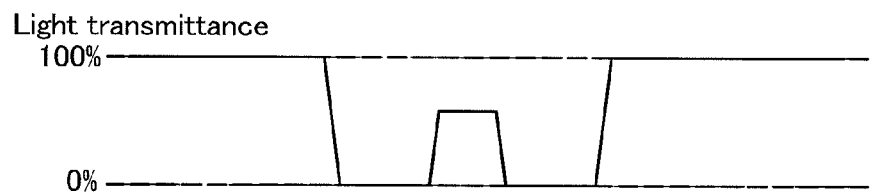

In the case where the half-tone mask 145 is irradiated with light for light exposure, as illustrated in FIG. 26D, the transmittance in the region overlapping with the light-blocking portion 148 is 0%, and the transmittance in the region where neither the light-blocking portion 148 nor the semi-light-transmitting portion 147 is provided is 100%. Further, the transmittance in the semi-light-transmitting portion 147 is basically in the range of 10% to 70%, which can be adjusted by the kind, the thickness, or the like of the material to be formed.

By light exposure using the multi-tone mask and development, the first resist mask 170 which includes regions having different thicknesses can be formed.

Next, first etching is performed using the first resist mask 170. That is, the light-blocking film 52, a base film 53, a first conductive film 102, a first insulating film 104, a semiconductor film 106, an impurity semiconductor film 108, and a second conductive film 110 are patterned by etching to form a light-blocking layer 54, a base layer 55, and a thin-film stack body 114 (see FIG. 27B, FIG. 28B, and FIG. 30).

Then, second etching is performed in a manner similar to Embodiment 1; accordingly, a gate electrode layer 116 is formed.

Here, the conditions of the second etching are similar to those of the second etching in Embodiment 1.

Next, the first resist mask 170 is made to recede (reduce), so that a second resist mask 171 is formed over the thin-film stack body 114. A source and drain electrode layer 120, a source and drain region 122, and a semiconductor layer 124 are formed using the second resist mask 171 (see FIG. 27C, FIG. 28C, and FIG. 31). In order to make the first resist mask 170 recede (reduce), ashing using oxygen plasma or the like may be performed. The etching conditions or the like are similar to those in Embodiment 1. In addition, the subsequent steps are similar to those in Embodiment 1.

Note that the second resist mask 171A overlaps with the source and drain electrode layer 120A, the second resist mask 171B overlaps with the source and drain electrode layer 120B, the second resist mask 171C overlaps with the source and drain electrode layer 120C, and the second resist mask 171D overlaps with the source and drain electrode layer 120D. These second resist masks are collectively referred to as the second resist mask 171.

Note that the case where the second resist mask 171 is formed after the second etching has been described here; however, the present invention is not limited to this and the second etching may be performed after formation of the second resist mask 171. The subsequent steps are similar to those in Embodiment 1. Accordingly, effects similar to those of the methods for manufacturing a thin film transistor and a display device in accordance with those in Embodiment 1 can be naturally obtained.

As described in Embodiment 2, a thin film transistor can be manufactured using a multi-tone mask. When the multi-tone mask is used, the number of photomasks to be used can be further reduced.

According to Embodiment 2, a thin film transistor can be manufactured using one photomask. In addition, an active matrix substrate including a pixel transistor can be manufactured using three photomasks. Therefore, as compared to a conventional technique in which a multi-tone mask is not used, the number of photomasks to be used is reduced, so that the number of steps of manufacturing a thin film transistor and a display device can be significantly reduced. Furthermore, since a thin film transistor can be formed using one photomask, misalignment can be prevented in aligning a photomask.

Moreover, similarly to Embodiment 1, the number of steps of manufacturing a thin film transistor can be significantly reduced while electric characteristics of the thin film transistor are maintained.

Note that the thin film transistor manufactured using a manufacturing method of Embodiment 2 also has a cavity in contact with a side surface of a gate electrode layer, in a manner similar to the thin film transistor described in Embodiment 1. Thanks to the cavity formed in contact with the side surface of the gate electrode layer, a thin film transistor with small leakage current at an end portion of the gate electrode layer can be manufactured. Accordingly, the display device with a high contrast ratio and favorable display quality can be obtained.

Moreover, since the semiconductor layer can be shielded from light in a manner similar to the thin film transistor described in Embodiment 1, a thin film transistor having favorable electric characteristics, in which light leakage current is reduced, and a display device having favorable display quality can be manufactured. Further, the light-blocking layer which shields the semiconductor layer from light can be formed using a photomask that is used for formation of the thin film transistor. Accordingly, the thin film transistor having favorable electric characteristics, in which light leakage current is reduced, and the display device having favorable display quality can be manufactured without increasing the number of masks.

Embodiment 3

In Embodiment 3, an example of a method for manufacturing a thin film transistor and an EL display device in which the transistors are arranged in matrix will be described with reference to FIG. 32, FIG. 33, FIG. 34, FIG. 35, FIG. 36, FIG. 37, FIG. 38, FIGS. 39A to 39C, FIGS. 40A to 40C, FIGS. 41A to 41C, and FIG. 42.

Figure 32:
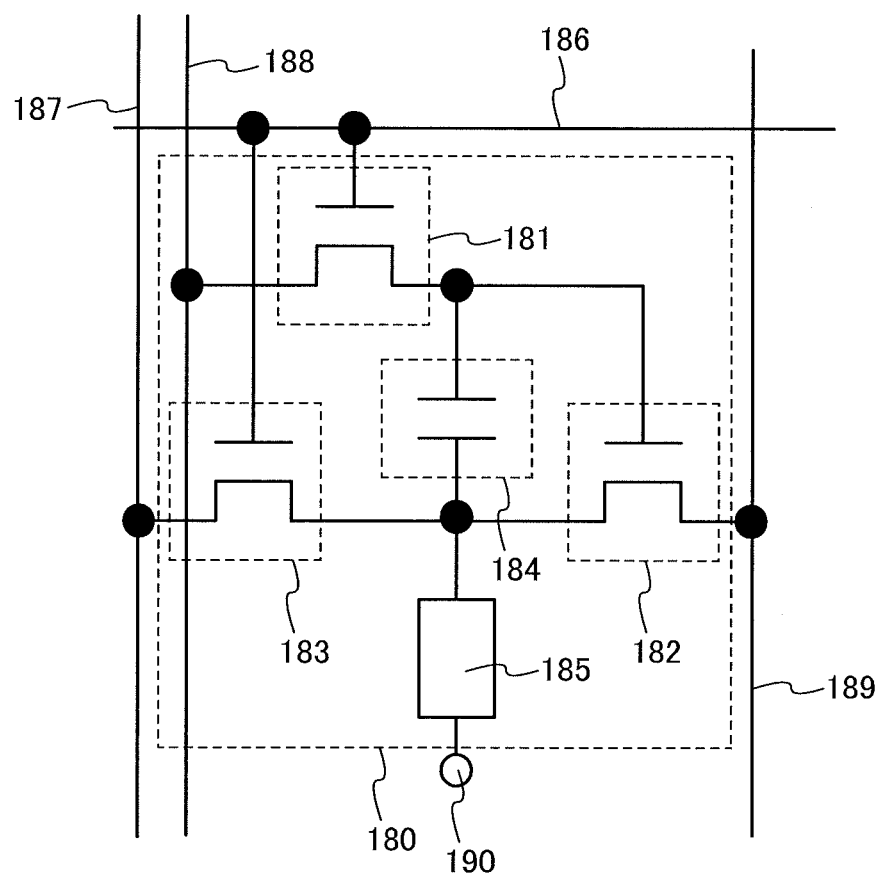
FIG. 32 illustrates an example of a pixel circuit of a display device.

Various pixel circuits for EL display devices (active EL display devices) which use thin film transistors as switching elements are considered. FIG. 32 illustrates an example of a simple pixel circuit, and a manufacturing method of a pixel structure using this pixel circuit will be described in Embodiment 3. However, the pixel circuit of the EL display device is not limited to the one having the configuration illustrated in FIG. 32.

In the pixel structure of the EL display device illustrated in FIG. 32, a pixel 180 includes a first transistor 181, a second transistor 182, a third transistor 183, a capacitor 184, and a light-emitting element 185. The first, second, and third transistors are n-channel transistors. A gate electrode of the first transistor 181 is connected to a gate wiring 186, one of a source electrode and a drain electrode (referred to as a first electrode) is connected to a source wiring 188, and the other of the source electrode and the drain electrode (referred to as a second electrode) is connected to a gate electrode of the second transistor 182 and one electrode (referred to as a first electrode) of the capacitor 184. The other electrode (referred to as a second electrode) of the capacitor 184 is connected to one of a source electrode and a drain electrode (referred to as a first electrode) of the second transistor 182, one of a source electrode and a drain electrode (referred to as a first electrode) of the third transistor 183, and one electrode (referred to as a first electrode) of the light-emitting element 185. The other of the source electrode and the drain electrode (referred to as a second electrode) of the second transistor 182 is connected to a second power supply line 189. The other of the source electrode and the drain electrode (referred to as a second electrode) of the third transistor 183 is connected to a first power supply line 187, and a gate electrode of the third transistor 183 is connected to the gate wiring 186. The other electrode (referred to as a second electrode) of the light-emitting element 185 is connected to a common electrode 190. Note that the potential of the first power supply line 187 is different from that of the second power supply line 189.

Operation of the pixel 180 will be described. When the third transistor 183 is turned on by a signal input to the gate wiring 186, the first electrode of the second transistor 182, the first electrode of the light-emitting element 185, and the second electrode of the capacitor 184 each have a potential equal to that of the first power supply line 187 ($V_{187}$). Here, since the potential of the first power supply line 187 ($V_{187}$) is constant, the potential of the first electrode of the second transistor 182 and the like is constant ($V_{187}$).

When the first transistor 181 is selected and turned on by the signal input to the gate wiring 186, a potential of the signal from the source wiring 188 ($V_{188}$) is input to the gate electrode of the second transistor 182 through the first transistor 181. At this time, when a potential of the second power supply line 189 ($V_{189}$) is higher than the potential of the first power supply line 187 ($V_{187}$), the relation, $V_{gs}=V_{188}-V_{187}$, is obtained. When $V_{gs}$ is higher than the threshold voltage of the second transistor 182, the second transistor 182 is turned on.

Accordingly, in the case where the second transistor 182 operates in a linear region, the potential of the source wiring 188 ($V_{188}$) is changed (e.g., binary values), so that on and off of the second transistor 182 can be controlled. That is, it can be controlled whether voltage is applied to the EL layer included in the light-emitting element 185.

In the case where the second transistor 182 operates in a saturation region, the potential of the source wiring 188 ($V_{188}$) is changed, so that the amount of current flowing through the light-emitting element 185 can be controlled.

Figure 42:
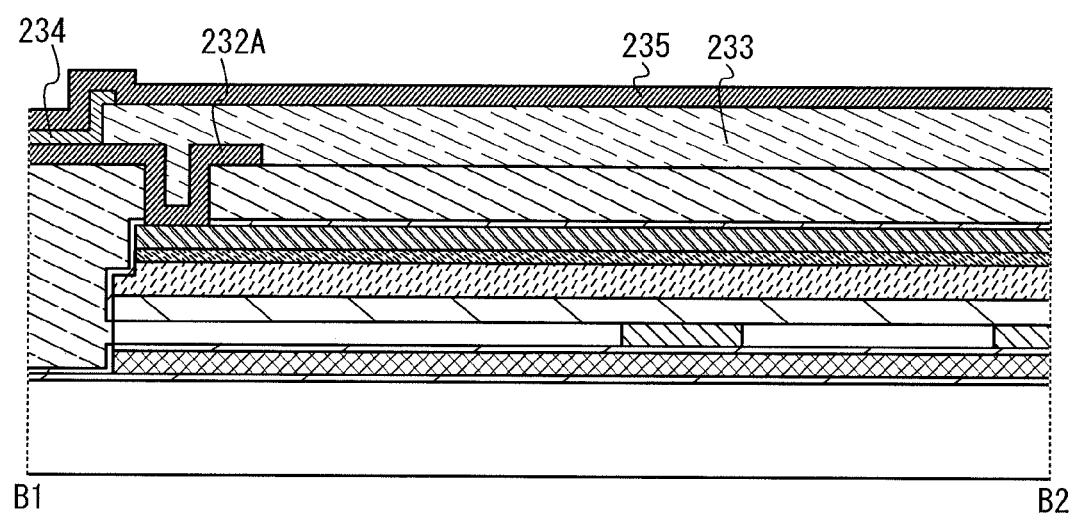
FIG. 42 illustrates an example of a method for manufacturing the thin film transistor and the display device.

In the above-described manner, in the case where the second transistor 182 operates in a linear region, it can be controlled whether voltage is applied to the light-emitting element 185. Thus, the light-emitting state and the non-light-emitting state of the light-emitting element 185 can be controlled. Such a driving method can be used for digital time grayscale driving, for example. The digital time grayscale driving is a driving method in which one frame is divided into a plurality of subframes and the light-emitting state and the non-light-emitting state of the light-emitting element 185 are controlled in each subframe. In addition, in the case where the second transistor 182 operates in a saturation region, the amount of current flowing through the light-emitting element 185 can be controlled and luminance of the light-emitting element 185 can be adjusted. FIG. 42 is a cross-sectional view taken along the line B1-B2 in FIG. 38.

Next, a pixel structure to which the pixel circuit illustrated in FIG. 32 is applied and a manufacturing method thereof will be described below.

Figure 36:
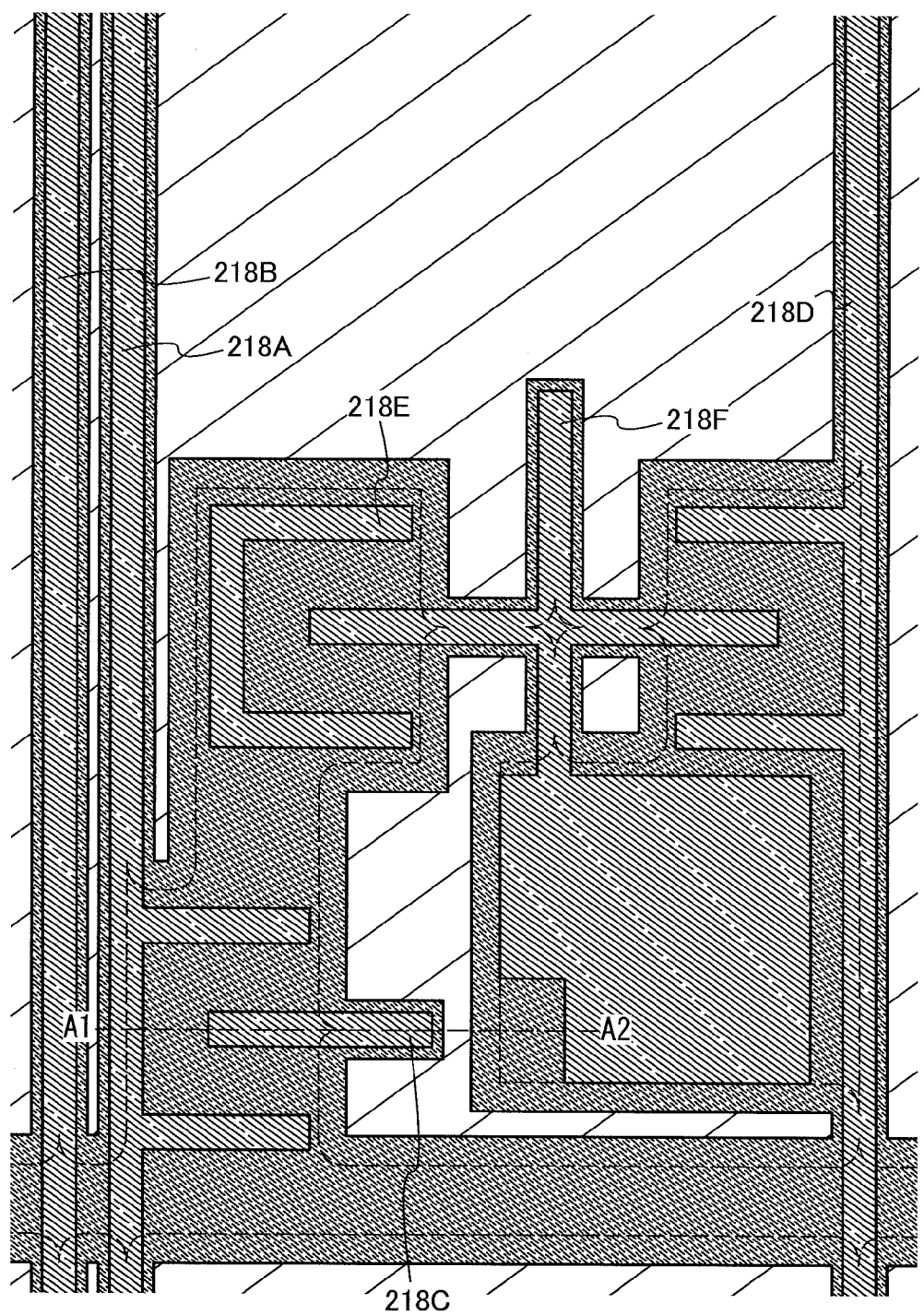
FIG. 36 illustrates an example of a method for manufacturing the thin film transistor and the display device.
Figure 37:
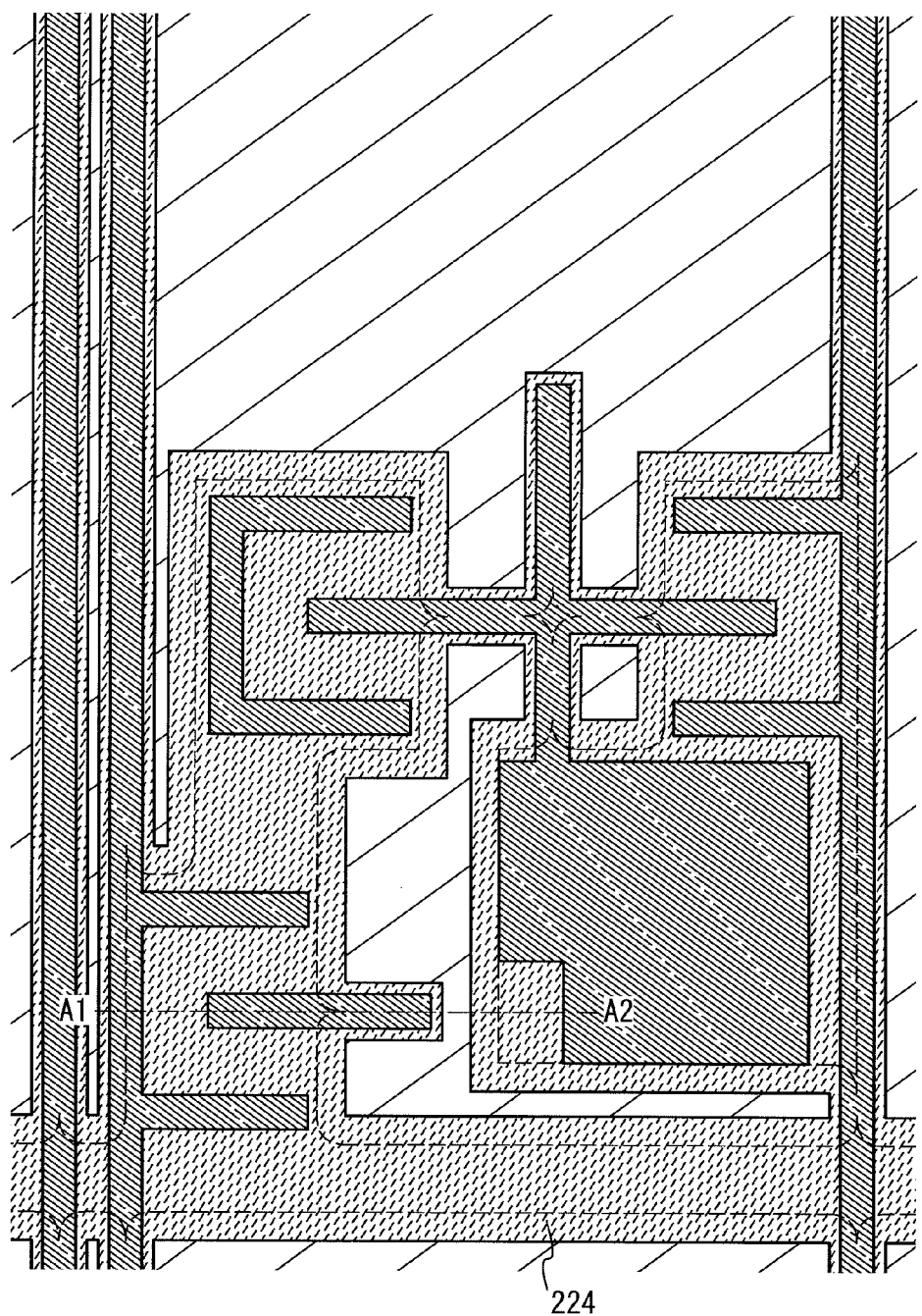
FIG. 37 illustrates an example of a method for manufacturing the thin film transistor and the display device.
Figure 38:
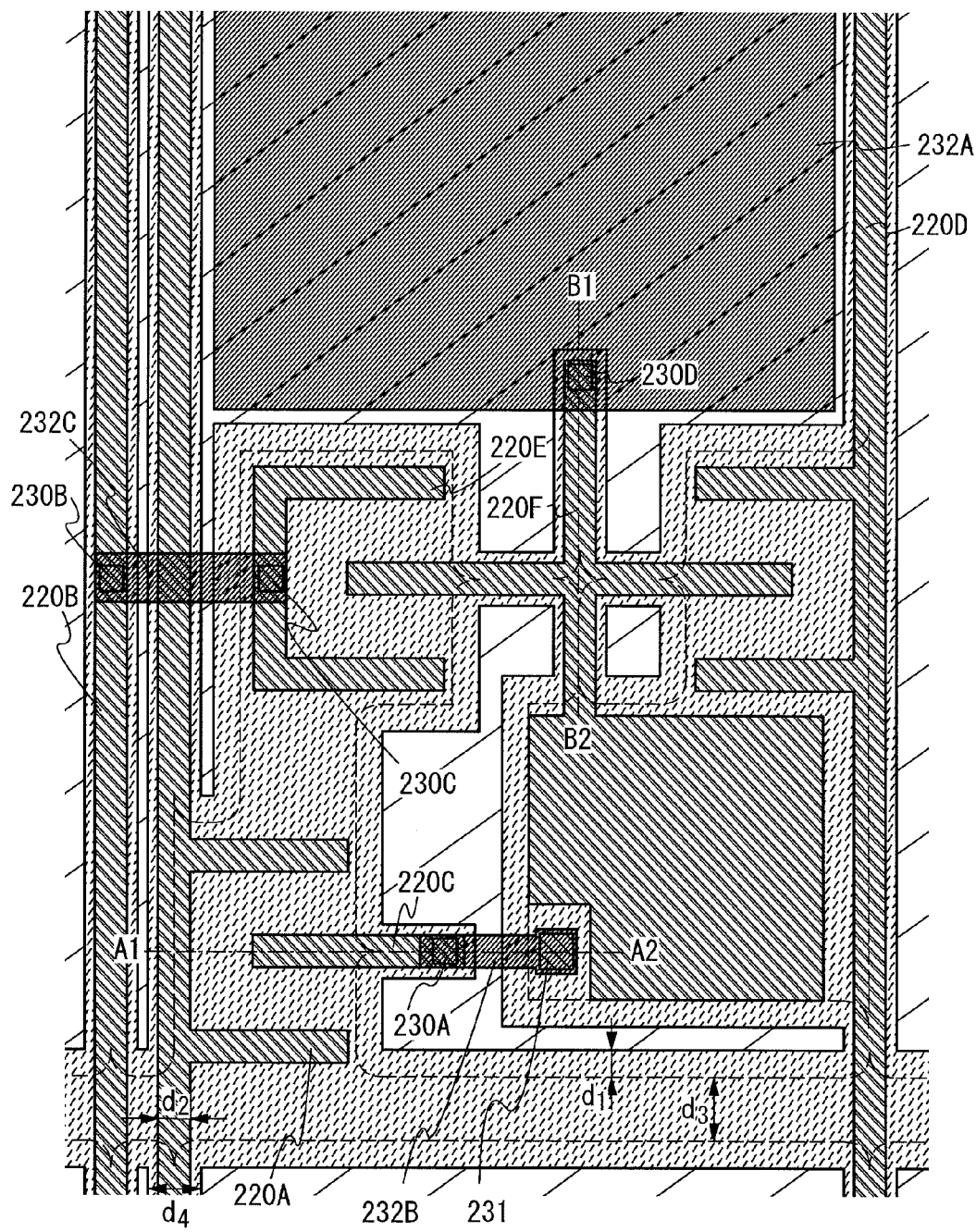
FIG. 38 illustrates an example of a method for manufacturing the thin film transistor and the display device.

FIG. 33, FIG. 34, FIG. 35, FIG. 36, FIG. 37, and FIG. 38 are top views of thin film transistors according to Embodiment 3. FIG. 38 is a completion drawing in the situation that formation of a first pixel electrode is finished. FIGS. 39A to 39C, FIGS. 40A to 40C, and FIGS. 41A to 41C are cross-sectional views taken along the line A1-A2 in FIG. 33, FIG. 34, FIG. 35, FIG. 36, FIG. 37, and FIG. 38.

First, as in the case of Embodiment 1, a light-blocking film 192, a base film 193, a first conductive film 202, a first insulating film 204, a semiconductor film 206, an impurity semiconductor film 208, and a second conductive film 210 are stacked in this order over a substrate 200. These films may be formed using a single layer or a stacked film including a plurality of films. The substrate 200 corresponds to the substrate 50 in Embodiment 1. The light-blocking film 192 corresponds to the light-blocking film 52. The base film 193 corresponds to the base film 53. The first conductive film 202 corresponds to the first conductive film 102. The first insulating film 204 corresponds to the first insulating film 104. The semiconductor film 206 corresponds to the semiconductor film 106. The impurity semiconductor film 208 corresponds to the impurity semiconductor film 108. The second conductive film 210 corresponds to the second conductive film 110. Accordingly, these materials and formation methods thereof are similar to those in Embodiment 1.

Note that as in the case of Embodiment 1, it is preferable that an additional base film 191 be provided between the light-blocking film 192 and the substrate 200.

As the semiconductor film 206, a stacked film of a crystalline semiconductor film and an amorphous semiconductor film is preferably used. As the crystalline semiconductor film, a polycrystalline semiconductor film, a microcrystalline semiconductor film, and the like can be used.

The polycrystalline semiconductor film means a semiconductor film which includes crystal grains and many grain boundaries between the crystal grains. The polycrystalline semiconductor film is formed by, for example, a thermal crystallization method or a laser crystallization method. Here, the thermal crystallization method is a crystallization method in which an amorphous semiconductor film is formed over a substrate and the amorphous semiconductor is crystallized by heating the substrate. The laser crystallization method is a crystallization method in which an amorphous semiconductor film is formed over a substrate and the amorphous semiconductor film is irradiated with a laser beam to crystallize the amorphous semiconductor. Alternatively, a crystallization method in which an element which promotes crystallization such as nickel is added to cause crystallization may be used. In the case where crystallization is performed by adding the element which promotes crystallization, the semiconductor film is preferably subjected to laser irradiation.

The polycrystalline semiconductor is classified into low temperature polysilicon (LTPS), which is obtained by crystallization at such a temperature and for such time as not to cause distortion in a glass substrate, and high temperature polysilicon (HTPS), which is obtained by crystallization at higher temperature.

A microcrystalline semiconductor film means a semiconductor film including a crystal grain whose diameter is within the range approximately from 2 nm to 100 nm, inclusive, and includes a film entirely formed of crystal grains and a film which includes an amorphous semiconductor between crystal grains. As a method for forming the microcrystalline semiconductor film, a method in which a crystal nucleus is formed and grows, a method in which an amorphous semiconductor film is formed, an insulating film and a metal film are formed in contact with the amorphous semiconductor film, and the amorphous semiconductor is crystallized by heat generated in the metal film by irradiation of laser on the metal film, or the like may be used. Note that a crystalline semiconductor film formed by a thermal crystallization method or a laser crystalline method on an amorphous semiconductor film is not included.

As the semiconductor film 206, for example, a staked film in which an amorphous semiconductor film is stacked over a crystalline semiconductor film is used, whereby a transistor included in a pixel circuit of an EL display device can operate at high speed. Here, as the crystalline semiconductor film, a polycrystalline semiconductor film (including LTPS and HTPS) or a microcrystalline semiconductor film may be applied. Note that the amorphous semiconductor film is formed over the crystalline semiconductor film, whereby oxidation of a surface of the microcrystalline semiconductor film can be prevented. In addition, a withstand voltage can be improved, and off current can be reduced.

Note that crystallinity of the semiconductor film 206 is not particularly limited as long as a pixel circuit of an EL display device can normally operate.

Note that the impurity semiconductor film 208 includes an impurity element imparting one conductivity, such as phosphorus to form an n-channel transistor. However, there is no limitation, and a p-channel transistor may be formed.

Figure 33:
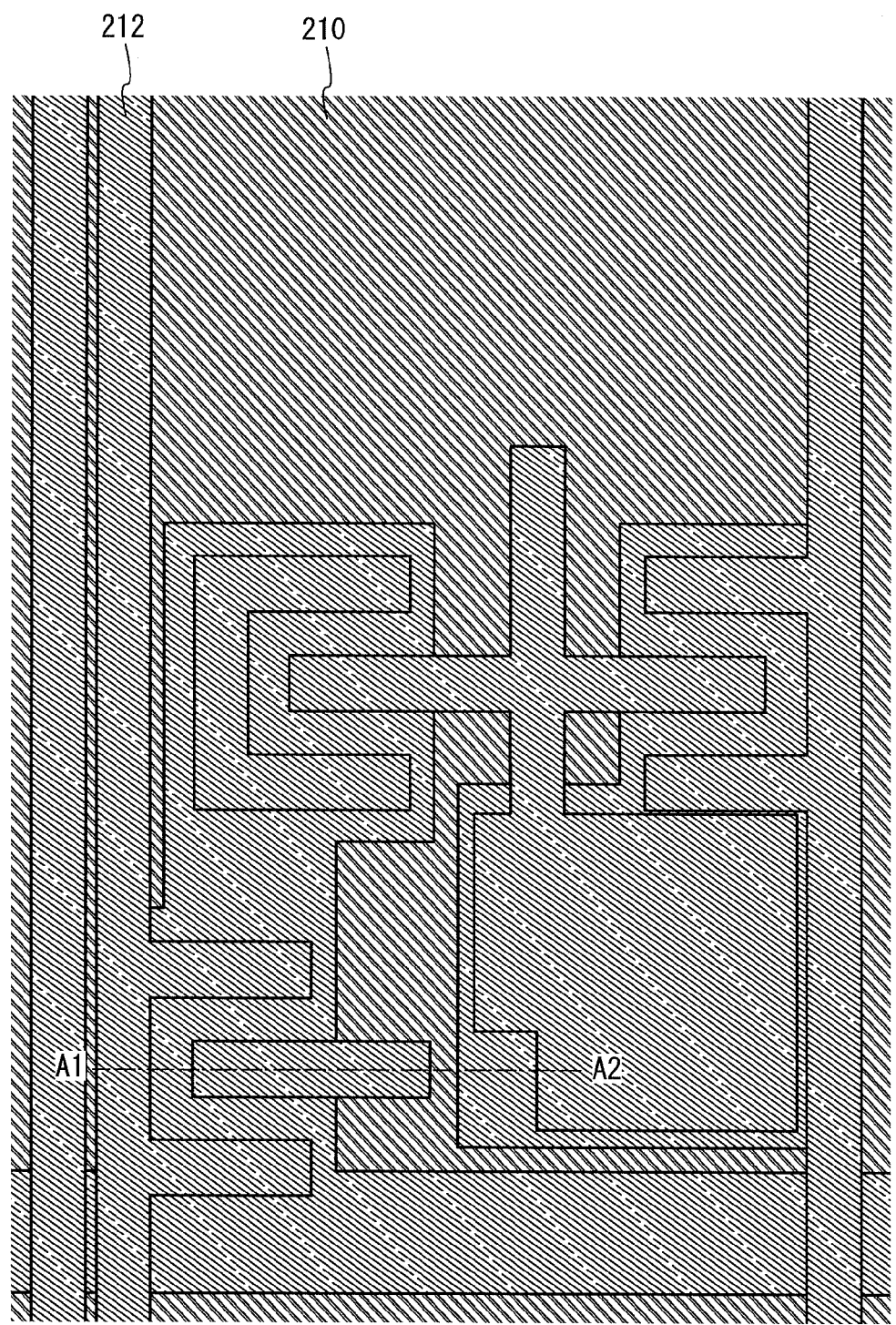
FIG. 33 illustrates an example of a method for manufacturing a thin film transistor and the display device.
Figure 34:
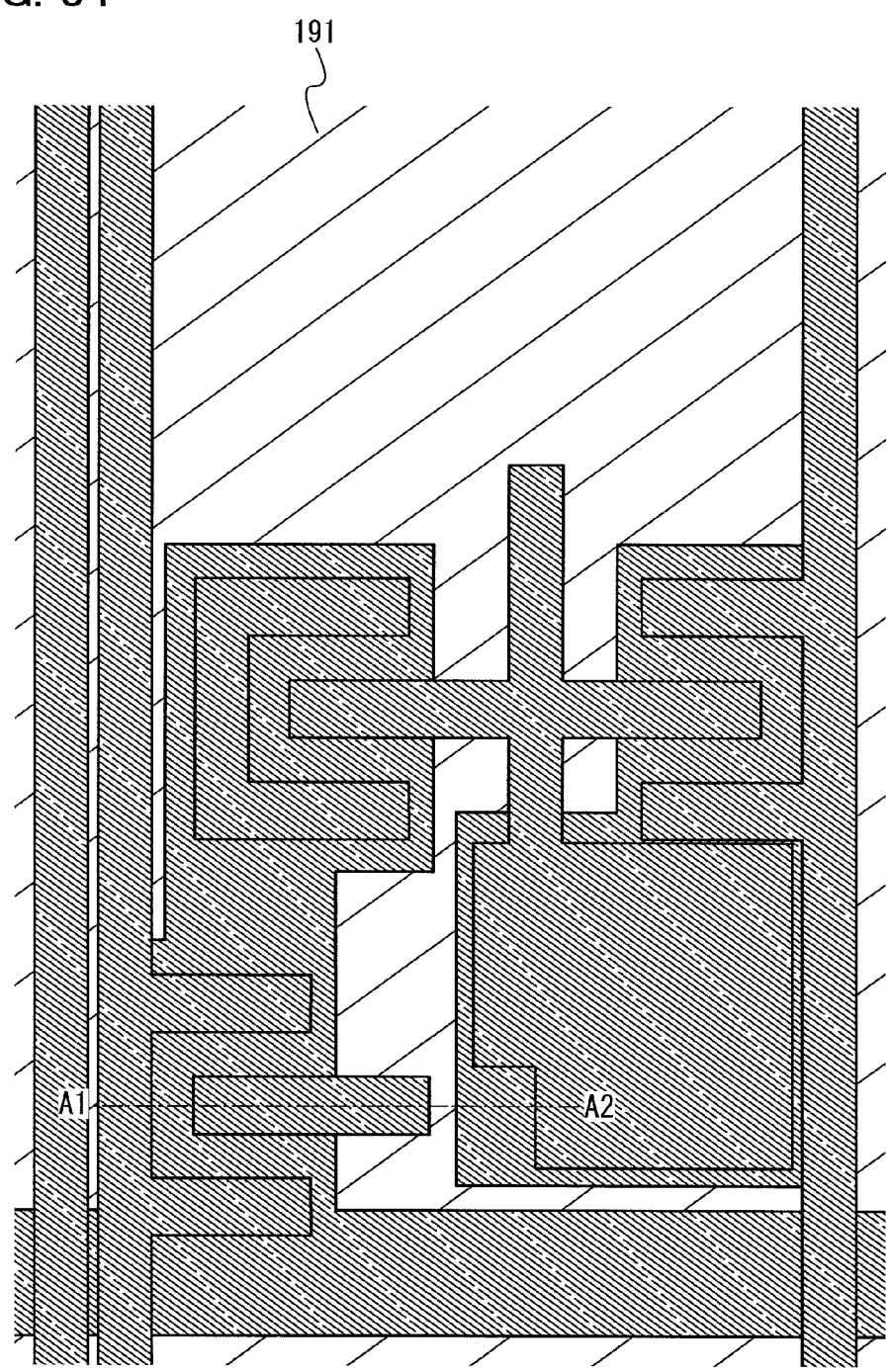
FIG. 34 illustrates an example of a method for manufacturing the thin film transistor and the display device.
Figure 39A:
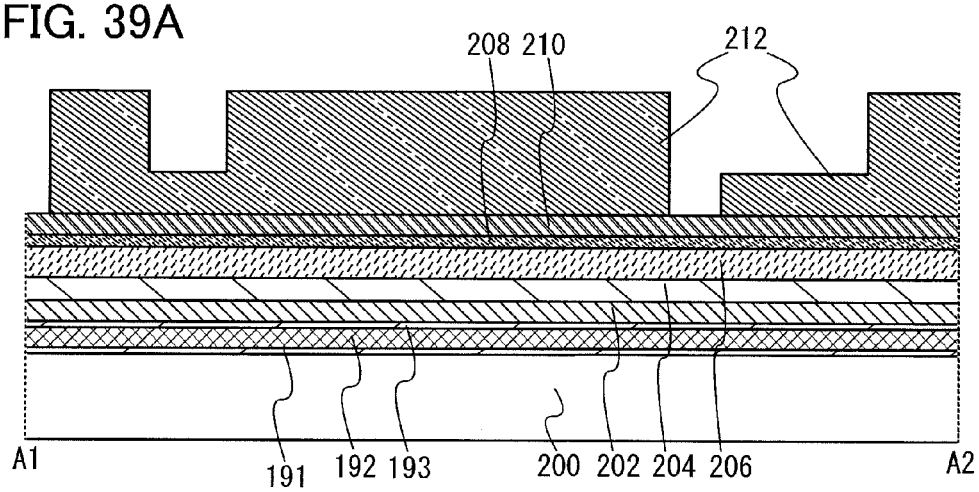
FIGS. 39A to 39C illustrate an example of a method for manufacturing the thin film transistor and the display device.
Figure 39B:
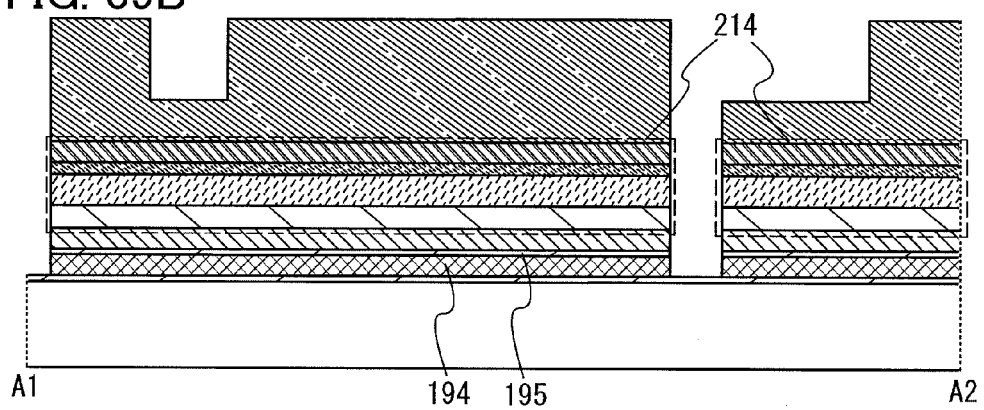

Next, a first resist mask 212 is formed over the second conductive film 210 (see FIG. 33 and FIG. 39A). Here, as the first resist mask 212, as in the case of Embodiment 2, a resist mask having a depressed portion and a projected portion is preferably used; however, a resist mask similar to Embodiment 1 may also be formed. The projected portion is formed in a region where a source or drain electrode layer 220 is formed, and the depressed portion is formed in a region where the semiconductor layer 224 is exposed without existence of the source or drain electrode layer 220.

Next, first etching is performed using the first resist mask 212 in a manner similar to Embodiment 1. That is, the light-blocking film 192, the base film 193, the first conductive film 202, the first insulating film 204, the semiconductor film 206, the impurity semiconductor film 208, and the second conductive film 210 are patterned by etching, so that a light-blocking layer 194, a base layer 195, and a thin-film stack body 214 are formed (see FIG. 34 and FIG. 39B).

Then, second etching is performed using the first resist mask 212. That is, the first conductive film 202 is patterned by etching, so that a gate electrode layer 216 is formed (see FIG. 35 and FIG. 39C).

Note that the gate electrode layer 216 forms a gate electrode of a thin film transistor, a gate wiring, one electrode of a capacitor, and a supporting portion. When a gate electrode layer is referred to as a gate electrode layer 216A, the gate electrode layer forms the gate wiring 186, the gate electrode of the first transistor 181, and the gate electrode of the third transistor 183. When a gate electrode layer is referred to as a gate electrode layer 216B, the gate electrode layer forms the gate electrode of the second transistor 182 and one electrode of the capacitor 184. When a gate electrode layer is referred to as a gate electrode layer 216C, the gate electrode layer forms the supporting portion. These gate electrode layers are collectively referred to as the gate electrode layer 216.

The second etching is performed under such conditions that a side surface of the gate electrode layer 216 which is formed using the first conductive film 202 is provided more on the inside than a side surface of the thin-film stacked body 214. In other words, the second etching is performed so that the side surface of the gate electrode layer 216 is in contact with a bottom surface of the thin-film stack body 214 (so that the width of the gate electrode layer 216 is narrower than that of the thin-film stack body 214 in the cross section along the line A1-A2). Further, the second etching is performed under such conditions that the etching rate with respect to the second conductive film 210 is low and the etching rate with respect to the first conductive film 202 is high. In other words, the second etching is performed under the conditions such that the etching selectivity of the first conductive film 202 with respect to the second conductive film 210 is high. By performing the second etching under such conditions, the gate electrode layer 216 can be formed.

Note that there is no particular limitation on a shape of the side surface of the gate electrode layer 216. For example, the side surface of the gate electrode layer 216 may be tapered. The shape of the side surface of the gate electrode layer 216 is determined depending on the conditions such as a chemical used in the second etching.

Here, the phrase "the conditions that the etching rate with respect to the second conductive film 210 is low and the etching rate with respect to the first conductive film 202 is high" or "the conditions that the etching selectivity of the first conductive film 202 with respect to the second conductive film 210 is high" means conditions satisfying the following first requirement and second requirement.

Figure 35:
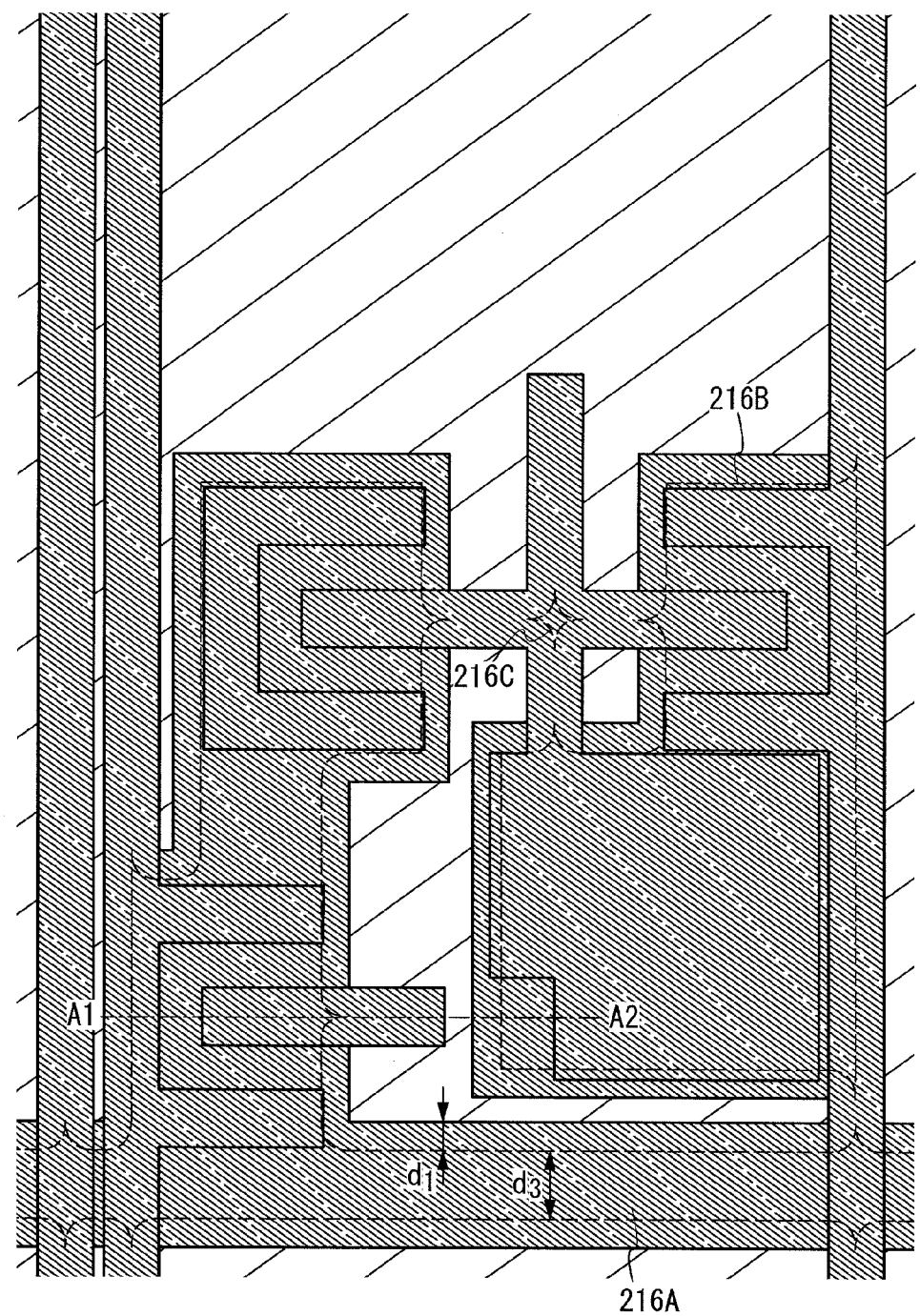
FIG. 35 illustrates an example of a method for manufacturing the thin film transistor and the display device.
Figure 39C:
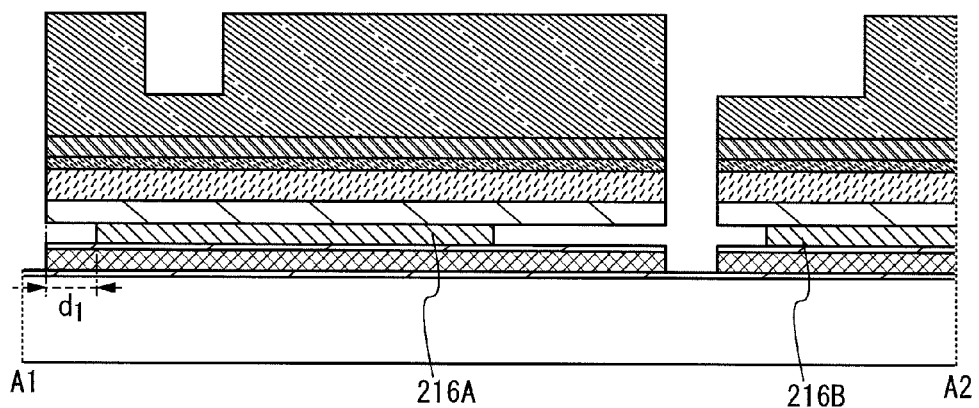

The first requirement is that the gate electrode layer 216 has to be left in places where its presence is necessary. The places necessarily provided with the gate electrode layer 216 are regions indicated by dotted lines in FIG. 35, FIG. 36, FIG. 37, and FIG. 38. That is, it is necessary that the gate electrode layer 216 is left so as to form a gate wiring, a gate electrode included in a transistor, and one electrode included in a capacitor after the second etching. In order that the gate electrode layer forms the gate wiring and the capacitor wiring, the second etching needs to be performed so as not to cut these wirings. As illustrated in FIG. 35 and FIG. 39C, the side surface of the gate electrode layer 216 is preferably more on the inside than the side surface of the thin-film stack body 214 by a distance $d_1$, and the distance $d_1$ may be set as appropriate by a practitioner according to the layout.

The second requirement is that a minimum width $d_3$ of the gate wiring or the capacitor wiring formed using the gate electrode layer 216 and a minimum width $d_2$ of a source wiring or a power supply line formed using a source and drain electrode layer 220 have appropriate values (see FIG. 38). This is because as the source and drain electrode layer 220 is etched by the second etching, the minimum width $d_2$ of the source wiring or the power supply line is reduced; accordingly, the current density of the source wiring or the power supply line becomes excessive and electric characteristics are degraded. Therefore, the second etching is performed under the conditions such that the etching rate of the first conductive film 202 is not too high and the etching rate of the second conductive film 210 is as low as possible.

Note portion where the width of the semiconductor layer overlapping with the source wiring or the power supply line is the minimum width $d_4$ may be provided at appropriate places for dividing the gate electrode layer into separate elements. By the second etching, a pattern in which the gate electrode layer 216 is not left in a region which overlaps with the portion where the width of the semiconductor layer is $d_4$ can be formed. Note that the minimum width $d_4$ of the semiconductor layer is set smaller than about twice the distance $d_1$. In other words, the distance $d_1$ is set larger than about half the minimum width of $d_4$ of the semiconductor layer.

In addition, it is preferable that the width of the electrode in a portion connected to a pixel electrode layer, which is formed using the source and drain electrode layer, be equal to the minimum width $d_2$ of the source wiring or the power supply line.

As described above, it is fundamental that the second etching is performed under the condition in which side-etching is performed. This is because by the second etching in which the first conductive film 202 is side-etched, a pattern which enables a desired connection between not only the gate wirings, which are adjacent to each other and are formed using the gate electrode layer 216, but also elements in the pixel circuit can be formed. Since the second etching is an etching in which side-etching is performed, the second etching proceeds in a substantially isotropic manner.

Here, "side-etching" means etching in which a film is etched in not only a thickness direction of the film (a direction perpendicular to the substrate surface or a direction perpendicular to the surface of a base film of the film to be formed) but also in a direction perpendicular to the thickness direction (a direction parallel to the substrate surface or a direction parallel to the surface of the base film of the film to be formed). An end portion of the film subjected to side-etching can have various shapes depending on the etching rate of an etching gas or a chemical used for the etching with respect to the film. The end portion of the film is, in many cases, formed with a curved surface.

The gate electrode layer 216C illustrated in FIG. 35 serves as a supporting portion which supports the thin-film stack body 214. By the existence of the supporting portion, peeling of a film such as the first insulating film 204 formed over the gate electrode layer can be prevented. Further, by provision of the supporting portion, a cavity region formed in contact with the gate electrode layer 216 by the second etching can be prevented from being larger than necessary. Furthermore, it is preferable to provide the supporting portion because the thin-film stack body 214 can be prevented from being broken or damaged due to its own weight during the manufacturing process and, accordingly, a fabrication yield is increased. However, there is no limitation thereto, and the supporting portion is not necessarily provided.

Note that a combination of an etchant which can be used in the second etching, the light-blocking film 192, the first conductive film 202, and the second conductive film 210 are the same as described in Embodiment 1.

As in the gate electrode layer 116 in Embodiment 1, the gate electrode layer 216 exhibits "horns" when seen from above (see FIG. 35). This is because since the second etching for forming the gate electrode layer 216 proceeds roughly isotropically, etching is performed so that the distance $d_1$ between the side surface of the gate electrode layer 216 and the side surface of the thin-film stack body 214 is roughly uniform.

Next, the first resist mask 212 is made to recede (reduce); accordingly, the second conductive film 210 is exposed and a second resist mask 218 is formed. As a method for forming the second resist mask 218 by making the first resist mask 212 recede (reduce), for example, ashing using oxygen plasma can be given. However, the method for forming the second resist mask 218 by making the first resist mask 212 recede (reduce) is not limited thereto. The region where the second resist mask 218 is formed roughly corresponds to the region where the projected portion of the first resist mask 212 is formed. Note that the case where the second resist mask 218 is formed after the second etching has been described here; however, there is no limitation and the second etching may be performed after formation of the second resist mask 218.

In the case where a multi-tone mask is not used to form the first resist mask 212, the second resist mask 218 may be separately formed using a different photomask.

Figure 40A:
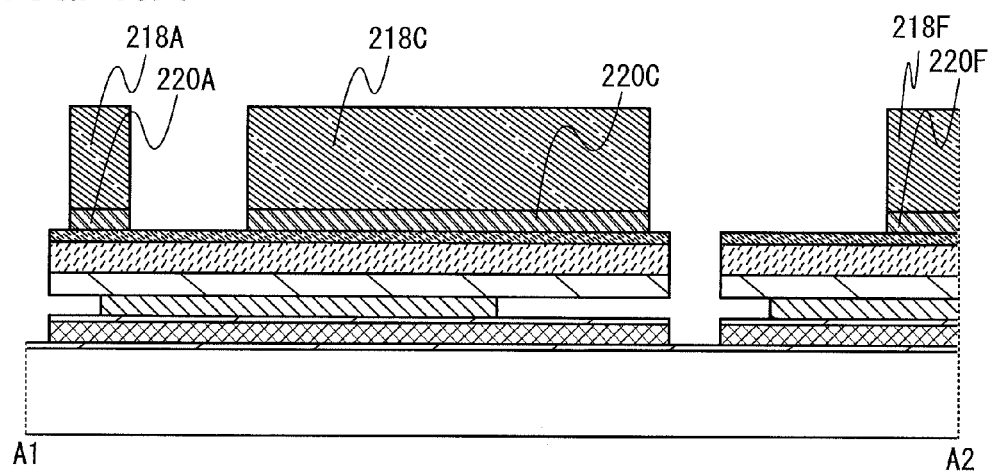
FIGS. 40A to 40C illustrate an example of a method for manufacturing the thin film transistor and the display device.

Next, the second conductive film 210 of the thin-film stack body 214 is etched using the second resist mask 218, so that the source and drain electrode layer 220 is formed (see FIG. 36 and FIG. 40A). Here, as the etching conditions, the conditions under which films other than the second conductive film 210 are not easily unintentionally etched or eroded are selected. In particular, it is important that etching be performed under the conditions such that the gate electrode layer 216 is not easily unintentionally etched or eroded.

Note that the source and drain electrode layer 220 forms the source electrode and the drain electrode of a thin film transistor, the source wiring, the first power supply line, the second power supply line, the other electrode of the capacitor, and an electrode which connects the thin film transistor and one electrode of a light-emitting element to each other. When a source and drain electrode layer is referred to as a source and drain electrode layer 220A, the source and drain electrode layer forms the source wiring 188 or one of a source electrode and a drain electrode of the first transistor 181. When a source and drain electrode layer is referred to as a source and drain electrode layer 220B, the source and drain electrode layer forms the first power supply line 187. When a source and drain electrode layer is referred to as a source and drain electrode layer 220C, the source and drain electrode layer forms the other of the source electrode and the drain electrode of the first transistor 181 or an electrode which connects the first transistor 181 and the pixel electrode to each other. When a source and drain electrode layer is referred to as a source and drain electrode layer 220D, the source and drain electrode layer forms the second power supply line 189 or one of a source electrode and a drain electrode of the second transistor 182. When a source and drain electrode layer is referred to as a source and drain electrode layer 220E, the source and drain electrode layer forms one of a source electrode and a drain electrode of the third transistor 183. When a source and drain electrode layer is referred to as a source and drain electrode layer 220F, the source and drain electrode layer forms the other electrode of the capacitor 184, the other of the source electrode and the drain electrode of the second transistor 182, the other of the source electrode and the drain electrode of the third transistor 183, or an electrode which connects any of these electrodes and one electrode of the light-emitting element to each other.

Note that the second resist mask 218A overlaps with the source and drain electrode layer 220A, the second resist mask 218B overlaps with the source and drain electrode layer 220B, the second resist mask 218C overlaps with the source and drain electrode layer 220C, the second resist mask 218D overlaps with the source and drain electrode layer 220D, the second resist mask 218E overlaps with the source and drain electrode layer 220E, and the second resist mask 218F overlaps with the source and drain electrode layer 220F. These second resist masks are collectively referred to as the second resist mask 218.

Note that for etching the second conductive film 210, either wet etching or dry etching may be performed.

Figure 40B:
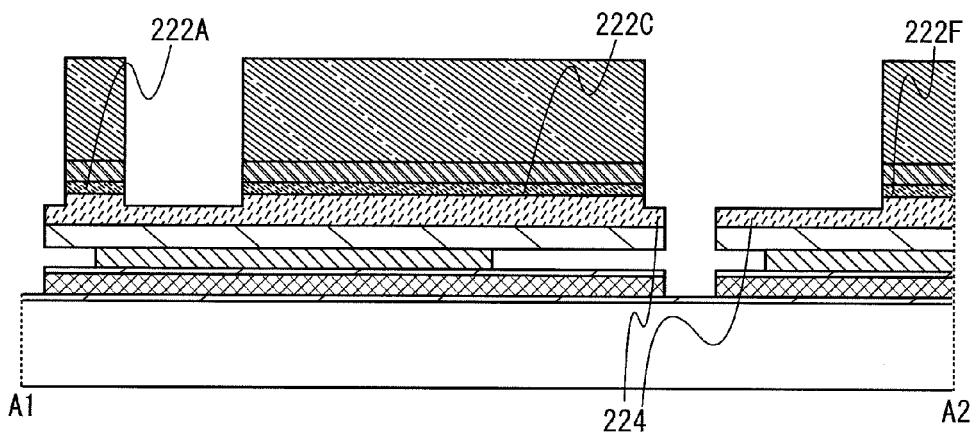

Then, the impurity semiconductor film 208 and an upper portion (back channel portion) of the semiconductor film 206 in the thin-film stack body 214 are etched to form a source and drain region 222 and a semiconductor layer 224 (see FIG. 37 and FIG. 40B). Here, as the etching conditions, the conditions under which films other than the impurity semiconductor film 208 and the semiconductor film 206 are not easily unintentionally etched or eroded are selected. In particular, it is important that etching be performed under the conditions such that the gate electrode layer 216 is not easily unintentionally etched or eroded.

Note that the source and drain region 222A refers to the region overlapping with the source and drain electrode layer 220A, and the same can be applied to other source and drain regions. These regions are collectively referred to as source and drain regions 222.

Note that the etching of the impurity semiconductor film 208 and the upper portion (back channel portion) of the semiconductor film 206 in the thin-film stack body 214 can be performed by dry etching or wet etching.

Figure 40C:
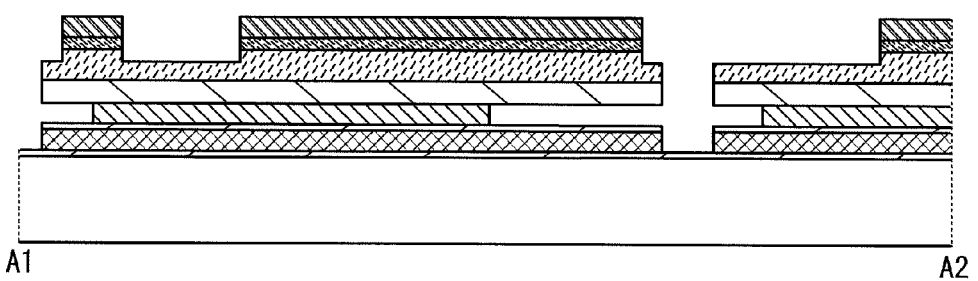

Then, the second resist mask 218 is removed; accordingly, a thin film transistor is completed (see FIG. 40C). In the above-described manner, a light-blocking layer and a thin film transistor which can be used for an EL display device can be manufactured using one photomask (multi-tone mask). Alternatively, when a multi-tone mask is not used, a light-blocking layer and a thin film transistor can be formed using two photomasks.

Note that the steps described with reference to FIG. 40B and FIG. 40C are collectively referred to as "third etching." The third etching may be performed in plural steps as described above or may be performed in a single step.

A second insulating film is formed to cover the thin film transistor which is formed in the above-described manner. Although the second insulating film may be formed using only a first protective film 226, here, the second insulating film is formed using the first protective film 226 and a second protective film 228 (see FIG. 41A). The first protective film 226 may be formed in a manner similar to the first insulating film 204. Preferably, the first protective film 226 is formed using silicon nitride containing hydrogen or silicon oxynitride containing hydrogen to prevent a semiconductor layer 224 from being contaminated by entry and diffusion of impurities such as metal.

The second protective film 228 is formed by a method by which the surface thereof becomes roughly planar. This is because when the surface of the second protective film 228 is roughly planar, defective formation or the like of a first pixel electrode layer 232 formed over the second protective film 228 can be prevented. Accordingly, the phrase "roughly planar" means planar in such an extent that the aforementioned aim can be achieved, and does not mean that high planarity is required.

The second protective film 228 can be formed, for example, by a spin coating method or the like using photosensitive polyimide, acrylic, epoxy resin, or the like. Note that the material and the formation method of the second protective film 228 are not limited to the above-described materials and formation method.

The second protective film 228 is preferably formed by stacking the above-described protective film formed by a method by which the surface thereof becomes roughly planar and a protective film which covers the protective film and prevents entry and release of moisture. Specifically, the protective film which prevents entry and release of moisture is preferably formed using silicon nitride, silicon oxynitride, aluminum oxynitride, aluminum nitride, or the like. As a formation method of the second protective film 228, a sputtering method is preferably used; however, there is no limitation.

Figure 41A:
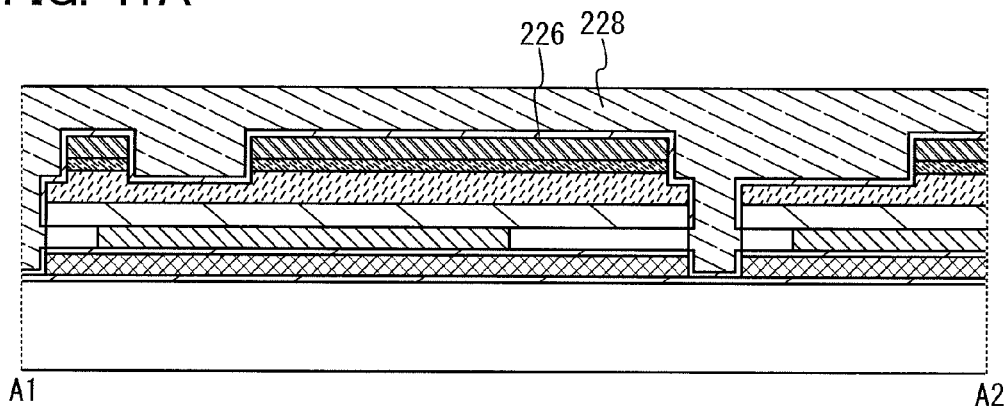
FIGS. 41A to 41C illustrate an example of a method for manufacturing the thin film transistor and the display device.
Figure 41B:
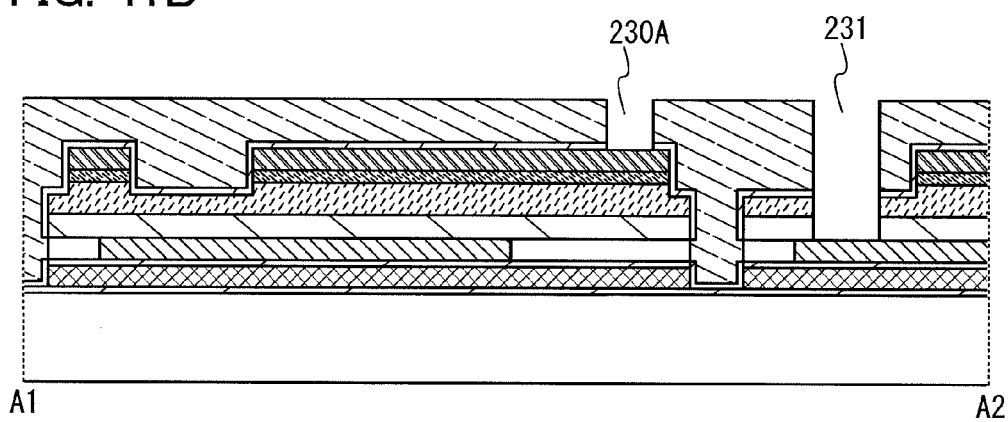

Next, a first opening portion 230 and a second opening portion 231 are formed in the second insulating film (see FIG. 41B). The first opening portion 230 is formed so as to reach at least the surface of the source and drain electrode layer 220. The second opening portion 231 is formed so as to reach at least the surface of the gate electrode layer 216. The formation method of the first opening portion 230 and the second opening portion 231 is not limited to a particular method and may be determined as appropriate by a practitioner in accordance with the diameter of the first opening portion 230 or the like. For example, the first opening portion 230 and the second opening portion 231 can be formed by dry etching using photolithography.

The first opening portions 230 are provided so as to reach the source and drain electrode layer 220, and several first opening portions 230 are provided in appropriate places as illustrated in FIG. 38. A first opening portion 230A is provided on the source and drain electrode layer 220C, a first opening portion 230B is provided on the source and drain electrode layer 220B, and a first opening portion 230C is provided on the source and drain electrode layer 220E.

The second opening portion 231 is provided so as to reach the gate electrode layer 216. In other words, not only the second insulating film but also desired regions of the first insulating film 204 and the semiconductor layer 224 are removed to provide the second opening portion 231.

Note that in the case of forming the opening portions by photolithography, one photomask is used.

Figure 41C:
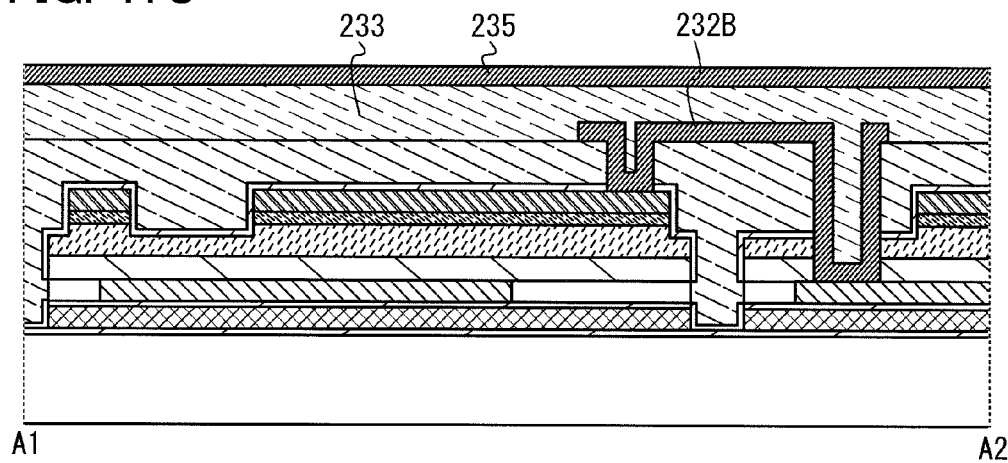

Next, the first pixel electrode layer 232 is formed over the second insulating film (see FIG. 38 and FIG. 41C). The first pixel electrode layer 232 is formed so as to be connected to the source and drain electrode layer 220 or the gate electrode layer 216 through the first opening portion 230 or the second opening portion 231, respectively. Specifically, the first pixel electrode layer 232A is formed so as to be connected to the source and drain electrode layer 220F through the first opening portion 230D. The first pixel electrode layer 232B is formed so as to be connected to the source and drain electrode layer 220C through the first opening portion 230A and to be connected to the gate electrode layer 216B through the second opening portion 231. The first pixel electrode layer 232C is connected to the source and drain electrode layer 220B through the first opening portion 230B and to be connected to the source and drain electrode layer 220E through the first opening portion 230C. The first pixel electrode layer 232 may have a single layer structure or a stacked structure.

Note that in the case of forming the first pixel electrode layer 232 by photolithography, one photomask is used.

As described above, a transistor which can be applied to a pixel of an EL display device and one of pixel electrodes to be connected to the transistor can be formed. An EL layer is formed over the pixel electrode and the other pixel electrode is formed over the EL layer, whereby an EL display device can be manufactured. Hereinafter, steps following this will be briefly described.

Since the thin film transistor included in the pixel is an n-channel transistor, the first pixel electrode layer 232 may be formed using a material which forms a cathode. As the material which forms a cathode, a material having a low work function such as Ca, Al, MgAg, AlLi, or the like can be given. However, a material is not limited thereto. The first pixel electrode layer 232 may be formed using a single layer, or a stacked film of plural films may be used.

Next, a partition wall 233 is formed on the side surface (end portion) of the first pixel electrode layer 232 and over the second insulating film (see FIG. 42). The partition wall 233 has an opening portion, and the first pixel electrode layer 232 is exposed through the opening portion. The partition wall 233 is formed using an organic resin film, an inorganic insulating film, or organic polysiloxane. Specifically, the partition wall 233 may be formed using polyimide, polyamide, polyimide amide, acrylic, or benzocyclobutene-based resin. It is particularly preferable that the partition wall 233 be formed using a photosensitive material to have an opening portion over the first pixel electrode layer 232 and a sidewall of the opening portion have a tilted surface with continuous curvature.

Next, an EL layer 234 is formed to be in contact with the first pixel electrode layer 232 at the opening portion of the partition wall 233 (see FIG. 42). The EL layer 234 may be formed using a single layer or a stacked film including a plurality of layers. The EL layer 234 includes at least a light-emitting layer. It is preferable that the light-emitting layer be connected to a second pixel electrode layer 235 through a hole transporting layer.

Then, a second pixel electrode layer 235 is formed using a material which forms an anode, to cover the EL layer 234 (see FIG. 42). The second pixel electrode layer 235 corresponds to the common electrode 190 in FIG. 32. The second pixel electrode layer 235 can be formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of the conductive material having a light-transmitting property may be formed by a sputtering method, a CVD method, or the like; however, the formation method is not limited to a particular method. In addition, the second pixel electrode layer 235 may be formed using a single layer structure or a stacked structure.

Here, ITO is used for the second pixel electrode layer 235. In the opening portion of the partition wall 233, the first pixel electrode layer 232, the EL layer 234, and the second pixel electrode layer 235 overlap with one another to form a light-emitting element 236. The light-emitting element 236 corresponds to the light-emitting element 185 in FIG. 32. Then, a third protective film (not shown) is preferably formed over the second pixel electrode layer 235 and the partition wall 233 so that oxygen, hydrogen, moisture, carbon dioxide, or the like does not enter the light-emitting element 236. As a material of the third protective film, a material having a function of preventing entry and release of moisture is selected from materials which are similar to those of the first protective film 226. The third protective film is preferably formed using silicon nitride, silicon oxynitride, aluminum oxynitride, aluminum nitride, or the like. Further, a silicon nitride film, a DLC film, or the like is preferably provided to cover the third protective film.

Then, it is preferable to further perform packaging (sealing) with a protective film (e.g., a bonding film or an ultraviolet curable resin film) or a covering material in order to prevent exposure to air. The protective film or the covering material is preferably formed using a material which has low gas-permeability and exhibits low degassing.

In the above-described manner, a light-emitting element of an EL display device can be formed (see FIGS. 41A to 41C and FIG. 42. FIG. 42 corresponds to a cross-sectional view taken along line B1-B2 in FIG. 38 when formation of the light-emitting element is completed.).

Note that, in the case where the first pixel electrode layer 232 is formed using a material functioning as an anode, the first pixel electrode layer 232 may be formed using ITO, for example. With the use of such a structure for the first pixel electrode layer 232, an EL display device with bottom emission structure can be manufactured. In this case, the second pixel electrode layer 235 may be formed using a material functioning as a cathode so as to cover the EL layer 234. The second pixel electrode layer 235 corresponds to the common electrode 190 in FIG. 32. As the material functioning as the cathode, a material with low work function such as Ca, Al, MgAg, and AlLi can be given. Note that the EL layer 234 and the second pixel electrode layer 235 are preferably formed by vapor deposition using a mask. Thus, it is preferred to form the second pixel electrode layer 235 using a material which can be formed by vapor deposition. Note that when a pixel of an EL display device is formed using the circuit illustrating in FIG. 32, it is preferable that the first pixel electrode layer 232 be an anode and the second pixel electrode layer 235 be a cathode.

An EL display device of Embodiment 3 can have any of a top emission structure, a bottom emission structure, and a dual emission structure.

Note that the materials and the formation methods of the protective film and the like described above are not limited to those described above as long as light emission of the EL layer is not interfered and deterioration and the like can be prevented.

Further, in the top emission structure, the first pixel electrode layer 232A may be formed so as to include the region where the pixel circuit is formed. In this case, first, only the conductive layers corresponding to the first pixel electrode layer 232B and the first pixel electrode layer 232C are formed, insulating films each having the first opening portion 230D are formed over the conductive layers, and then, the first pixel electrode layer 232A is formed so as to be connected to the source and drain electrode layer 220F through the first opening portions 230D. By forming the first pixel electrode layer 232A so as to include the region where the pixel circuit is formed, the light-emitting region can be enlarged and higher definition display can be performed.

Note that although an organic EL element is described here as a light-emitting element, an inorganic EL element can also be used as a light-emitting element.

Note that the terminal connection portion is similar to that described in Embodiment 1.

Note that the first etching is used in formation of the light-blocking layer in Embodiment 3; however, there is no limitation and the first etching is performed to etch films up to the first insulating film, films up to the first conductive film, or films up to the base film, the second etching is performed, then the light-blocking layer and the like may be etched.

In the above-described manner, an EL display device can be manufactured.

As described in Embodiment 3, a pixel transistor of a display device can be manufactured with one photomask without an additional photomask in formation of a gate electrode, and an active matrix substrate can be manufactured with three photomasks. Accordingly, the number of steps of manufacturing a thin film transistor and an EL display device can be significantly reduced.

In addition, the number of manufacturing steps of a thin film transistor and a display device can be significantly reduced without a complicated step using backside light exposure, resist reflow, a lift-off method, or the like. Therefore, the number of manufacturing steps of a display device can be significantly reduced without a complicated step. Thus, the number of manufacturing steps of a thin film transistor and a display device can be significantly reduced while reduction in yield is suppressed. In addition, manufacturing cost can be significantly reduced while decrease in the electric characteristics of a thin film transistor is suppressed.

Moreover, since the semiconductor layer can be shielded from light, a thin film transistor having favorable electric characteristics, in which light leakage current is reduced, and an EL display device having favorable display quality can be manufactured. Further, the light-blocking layer which shields the semiconductor layer from light can be formed using a photomask that is used for formation of the thin film transistor. Accordingly, the thin film transistor having favorable electric characteristics, in which light leakage current is reduced, and the EL display device having favorable display quality can be manufactured without increasing the number of masks.

Furthermore, in the bottom emission EL display device, the optical design can be performed by adjustment of the thickness of the additional base film 191.

Furthermore, since a thin film transistor in which leakage current generated at an end portion of the gate electrode layer is small can be manufactured, an EL display device with a high contrast ratio and favorable display quality can be obtained.

Note that the pixel structure of the display device is not limited to the one described above and can be applied to a variety of EL display devices.

Embodiment 4

In Embodiment 4, electronic devices in which a display panel or a display device manufactured by any of the methods described in Embodiments 1 to 3 is incorporated as a display portion will be described with reference to FIGS. 43A and 43B, FIG. 44, and FIGS. 45A to 45C. As such electronic devices, for example, cameras such as video cameras or digital cameras; head mounted displays (goggle type displays); car navigation systems; projectors; car stereos; personal computers; and portable information terminals (such as mobile computers, mobile phones, and e-book readers) can be given. Examples of the electronic devices are illustrated in FIGS. 43A and 43B.

Figure 43A:
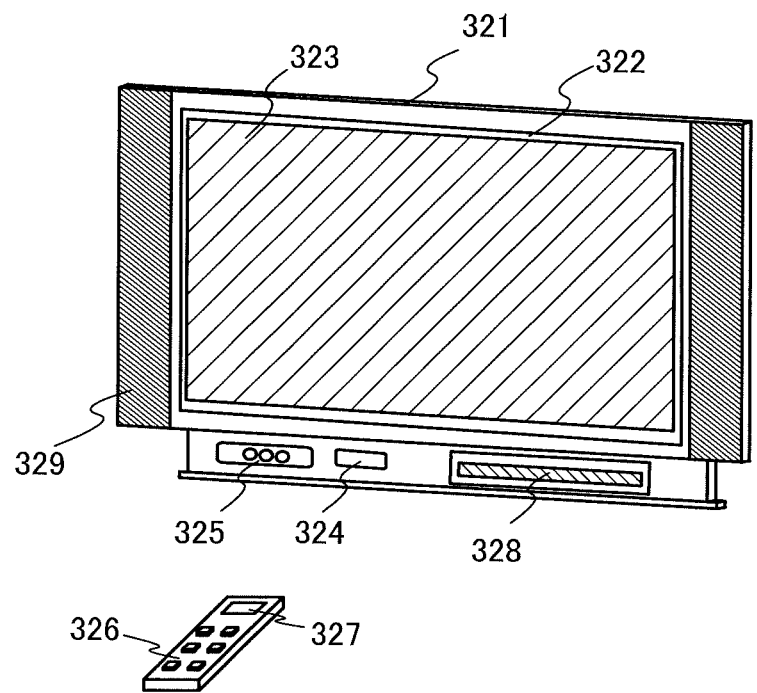
FIGS. 43A and 43B each illustrate an electronic device.
Figure 43B:
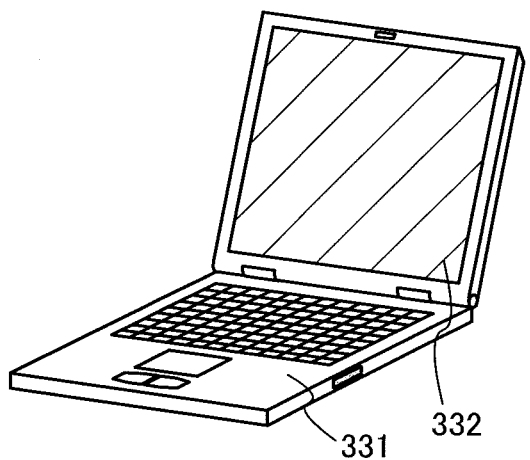

FIG. 43A illustrates a television device. A television device illustrated in FIG. 43A can be completed by incorporating a display panel into a housing. A main screen 323 is formed using the display panel manufactured by any of the manufacturing methods described in Embodiments 1 to 3, and a speaker portion 329, operation switches, and the like are provided as its accessory equipment.

As illustrated in FIG. 43A, a display panel 322 manufactured by any of the manufacturing methods described in Embodiments 1 to 3 is incorporated into a housing 321, and general TV broadcast can be received by a receiver 325. When the television device is connected to a communication network by wired or wireless connections via a modem 324, one-way (from a sender to a receiver) or two-way (between a sender and a receiver or between receivers) information communication can be performed. The television device can be operated using switches incorporated into the housing or by a remote control device 326 provided separately. A display portion 327 which displays output information may be provided for the remote control device 326.

Further, the television device may include a sub-screen 328 formed using a second display panel for displaying channels, volume, and the like, in addition to the main screen 323.

Figure 44:
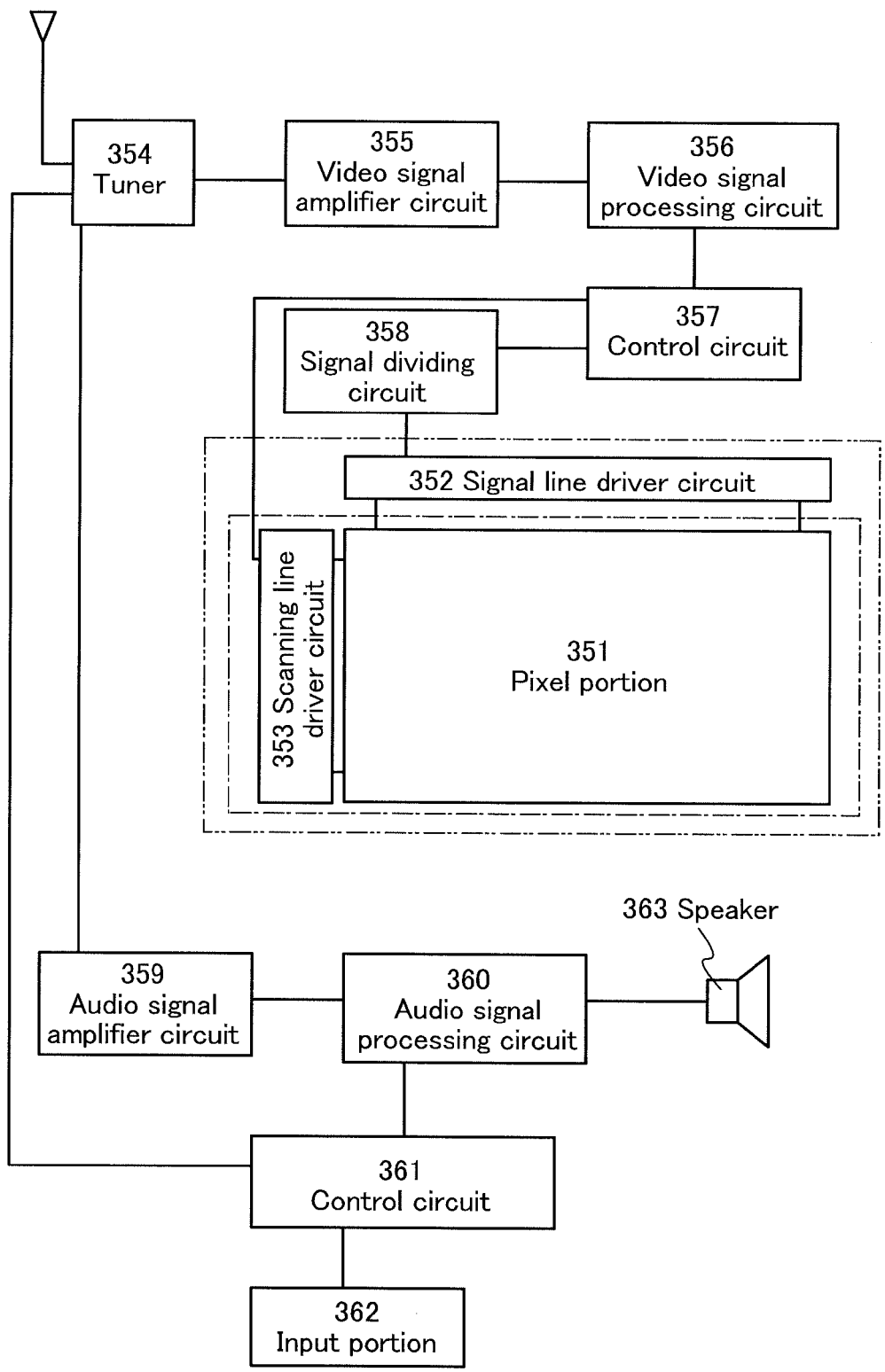
FIG. 44 illustrates an electronic device.

FIG. 44 is a block diagram of a main structure of a television device. A pixel portion 351 is formed in a display panel. A signal line driver circuit 352 and a scanning line driver circuit 353 may be mounted on the display panel by a COG method.

As structures of other external circuits, a video signal amplifier circuit 355 amplifying a video signal among signals received by a tuner 354, a video signal processing circuit 356 converting signals output from the video signal amplifier circuit 355 into chrominance signals corresponding to respective colors of red, green, and blue, a control circuit 357 for converting the video signal into a signal which meets input specifications, and the like are provided on the input side of the video signal. The control circuit 357 outputs signals to each of the scanning line driver circuit 353 and the signal line driver circuit 352. In the case of digital drive, a signal dividing circuit 358 may be provided on the signal line side and an input digital signal may be divided into m (m is an integer) pieces and supplied.

Among the signals received by the tuner 354, audio signals are transmitted to an audio signal amplifier circuit 359, and an output thereof is supplied to a speaker 363 through an audio signal processing circuit 360. A control circuit 361 receives control information on receiving station (receiving frequency) and volume from an input portion 362 and transmits signals to the tuner 354 and the audio signal processing circuit 360.

Needless to say, the display device which is one embodiment of the present invention is not limited to the television device and can also be applied to a large-size display medium such as an information display board at a train station, an airport, and the like, or an advertisement display board on the street, as well as a monitor of a personal computer. Therefore, by application of the method for manufacturing a display device, which is one of the above-described embodiments, productivity of these display media can be improved.

When the display panel or display device manufactured by any of the manufacturing methods described in Embodiments 1 to 3 is applied to one or both of the main screen 323 and the sub screen 328, productivity in fabrication of television devices can be increased.

A mobile computer illustrated in FIG. 43B includes a main body 331, a display portion 332, and the like. When the display panel or display device manufactured by any of the manufacturing methods of a display device described in Embodiments 1 to 3 is applied to the display portion 332, productivity in fabrication of computers can be increased.

Figure 45A:
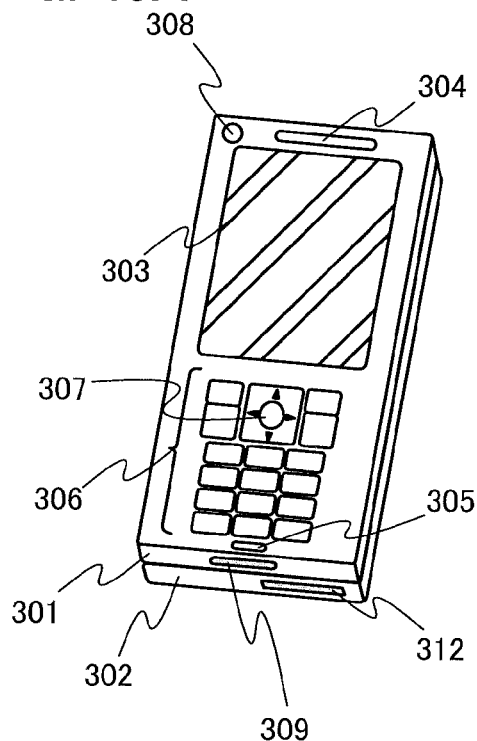
FIGS. 45A to 45C each illustrate an electronic device.
Figure 45B:
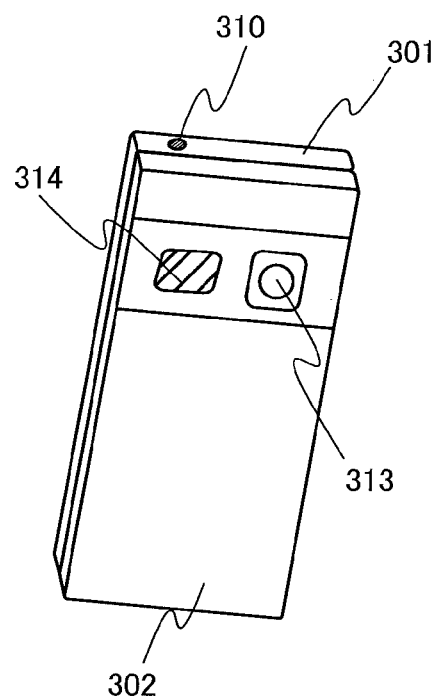
Figure 45C:
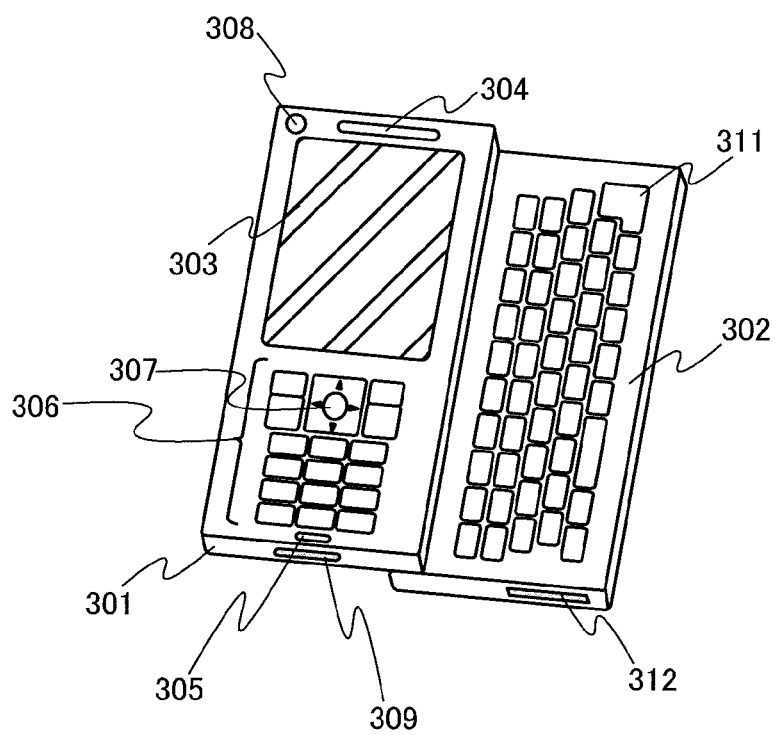

FIGS. 45A to 45C illustrate an example of a mobile phone. FIG. 45A is a front view, FIG. 45B is a rear view, and FIG. 45C is a development view when two housing are slid. The mobile phone illustrated in FIGS. 45A to 45C includes two housings 301 and 302. The mobile phone illustrated in FIGS. 45A to 45C is a so-called smartphone which has both functions of a mobile phone and a portable information terminal and which incorporates a computer, and can process a variety of data processing in addition to voice calls.

The housing 301 includes a display portion 303, a speaker 304, a microphone 305, operation keys 306, a pointing device 307, a front camera lens 308, a jack 309 for an external connection terminal, an earphone terminal 310, and the like, while the housing 302 includes a keyboard 311, an external memory slot 312, a rear camera 313, a light 314, and the like. In addition, an antenna is incorporated in the housing 301.

In addition to the above-described structure, a wireless IC chip, a small size memory device, or the like may be incorporated in the mobile phone illustrated in FIGS. 45A to 45C.

The housings 301 and 302 overlapped with each other (illustrated in FIG. 45A) can be slid and are developed by being slid as illustrated in FIG. 45C. The display panel or display device manufactured by any of the manufacturing methods of a display device described in Embodiments 1 to 3 can be incorporated in the display portion 303. Since the display portion 303 and the front camera lens 308 are provided in the same plane, the mobile phone can be used as a videophone. A still image and a moving image can be taken by the rear camera 313 and the light 314 by using the display portion 303 as a viewfinder.

By using the speaker 304 and the microphone 305, the mobile phone illustrated in FIGS. 45A to 45C can be used as an audio recording device (sound recorder) or an audio reproducing device. With use of the operation keys 306, operation of incoming and outgoing calls, simple information input for e-mail or the like, scrolling of a screen displayed on the display portion, cursor motion for selecting information to be displayed on the display portion, and the like are possible.

When much information needs to be handled, such as the case of creating documents and using the mobile phone as a portable information terminal, the use of the keyboard 311 is convenient. The housings 301 and 302 overlapped with each other (FIG. 45A) slide and can be developed as illustrated in FIG. 45C. In the case where the mobile phone is used as a portable information terminal, smooth operation can be performed with the keyboard 311 and the pointing device 307. The jack 309 for an external connection terminal can be connected to various cables such as an AC adapter or a USB cable, whereby the mobile phone can be charged or can perform data communication with a personal computer or the like. Moreover, by inserting a recording medium into the external memory slot 312, the mobile phone can deal with storing and moving a large capacity of data.

In the rear surface of the housing 302 (FIG. 45B), the rear camera 313 and the light 314 are provided, and a still image and a moving image can be taken by using the display portion 303 as a viewfinder.

Further, the mobile phone may have an infrared communication function, a USB port, a function of receiving one segment television broadcast, a wireless IC chip, an earphone jack, or the like, in addition to the above-described functions and structures.

Since various electronic devices described in Embodiment 4 can be manufactured by any of the manufacturing methods of the thin film transistor and the display device described in Embodiments 1 to 3, productivity of these electronic devices can be increased. Accordingly, manufacturing cost of these electronic devices can be significantly reduced. Furthermore, an electronic device including a display portion having high display quality can be manufactured.

This application is based on Japanese Patent Application serial no. 2009-032939 filed with Japan Patent Office on Feb. 16, 2009, the entire contents of which are hereby incorporated by reference.

What is claimed is:

1. A method for manufacturing a display device, comprising the steps of:

stacking a light-blocking film, a base film, a first conductive film, a first insulating film, a semiconductor film, an impurity semiconductor film, and a second conductive film in this order;

forming a first resist mask over the second conductive film;

performing a first etching on the second conductive film, the impurity semiconductor film, the semiconductor film, the first insulating film, the first conductive film, the base film, and the light-blocking film using the first resist mask;

performing a second etching in which part of the first conductive film is side-etched to form a gate electrode layer of a thin film transistor;

forming a second resist mask over the second conductive film;

completing the thin film transistor by performing a third etching on the second conductive film, the impurity semiconductor film, and part of the semiconductor film using the second resist mask to form a source and drain electrode layer in the second conductive film, a source and drain region in the impurity semiconductor film, and a semiconductor layer in the semiconductor film;

removing the second resist mask;

forming a second insulating film so as to cover the thin film transistor;

forming an opening portion in the second insulating film so that part of the source and drain electrode layer is exposed; and selectively forming a pixel electrode layer, thereby forming a pixel electrode over the opening portion and the second insulating film and electrically connecting a portion a the second conductive film to a portion of the second conductive film.

2. A method for manufacturing a display device, comprising the steps of:

stacking a light-blocking film, a base film, a first conductive film, a first insulating film, a semiconductor film, an impurity semiconductor film, and a second conductive film in this order;

forming a first resist mask having a depressed portion over the second conductive film;

performing a first etching on the second conductive film, the impurity semiconductor film, the semiconductor film, the first insulating film, the first conductive film, the base film, and the light-blocking film using the first resist mask;

performing a second etching in which part of the first conductive film is side-etched to form a gate electrode layer of a thin film transistor;

making the first resist mask reduce to expose a part of the second conductive film, which corresponds to the depressed portion of the first resist mask, and to form a second resist mask;

completing the thin film transistor in a manner in which a third etching is performed on the second conductive film, the impurity semiconductor film, and part of the semiconductor film using the second resist mask to form a source and drain electrode layer in the second conductive film, a source and drain region in the impurity semiconductor film, and a semiconductor layer in the semiconductor film;

removing the second resist mask;

forming a second insulating film so as to cover the thin film transistor;

forming an opening portion in the second insulating film so that part of the source and drain electrode layer is exposed; and selectively forming a pixel electrode layer, thereby forming a pixel electrode over the opening portion and the second insulating film and electrically connecting a portion a the second conductive film to a portion of the second conductive film.

3. The method for manufacturing a display device according to claim 1, further comprising the steps of:

forming a partition wall over the second insulating film, covering a side portion the pixel electrode and having an opening portion over the pixel electrode;

forming a light emitting layer on the pixel electrode in the opening portion of the partition wall; and forming a common electrode over the light emitting layer.

4. The method for manufacturing a display device according to claim 2, further comprising the steps of:

forming a partition wall over the second insulating film, covering a side portion the pixel electrode and having an opening portion over the pixel electrode;

forming a light emitting layer on the pixel electrode in the opening portion of the partition wall; and forming a common electrode over the light emitting layer.

5. The method for manufacturing a display device according to claim 3, wherein the common electrode is formed using a light-transmitting conductive material including a metal oxide.

6. The method for manufacturing a display device according to claim 4, wherein the common electrode is formed using a light-transmitting conductive material including a metal oxide.

7. The method for manufacturing a display device, according to claim 2, wherein the first resist mask is formed using a multi-tone mask.

8. The method for manufacturing a thin film transistor, according to claim 1, wherein the light-blocking film is formed over another insulating film.

9. The method for manufacturing a thin film transistor, according to claim 2, wherein the light-blocking film is formed over another insulating film.

10. The method for manufacturing a display device, according to claim 1, wherein an element region is formed through the first etching; and wherein a side surface of the gate electrode layer is provided more on the inside than a side surface of the element region by a roughly uniform distance through the second etching.

11. The method for manufacturing a display device, according to claim 2, wherein an element region is formed through the first etching; and wherein a side surface of the gate electrode layer is provided more on the inside than a side surface of the element region by a roughly uniform distance through the second etching.

12. The method for manufacturing a display device, according to claim 1, wherein the first etching is a dry etching; and wherein the second etching is a wet etching.

13. The method for manufacturing a display device, according to claim 2, wherein the first etching is a dry etching; and wherein the second etching is a wet etching.

14. The method for manufacturing a display device, according to claim 1, wherein the second insulating film is formed by stacking an insulating film formed by a CVD method or a sputtering method and an insulating film formed by a spin coating method.

15. The method for manufacturing a display device, according to claim 2, wherein the second insulating film is formed by stacking an insulating film formed by a CVD method or a sputtering method and an insulating film formed by a spin coating method.

16. A method for fabricating a thin-film structure comprising the steps of:

forming a first stack of thin films;

forming a second stack of thin films over the first stack;

forming a first mask according to a first pattern over the second stack;

performing a first etching through the first stack and the second stack using the first mask to reproduce the first pattern in the first stack and the second stack;

performing a second etching in which part of a first thin film of the first stack is side-etched to pattern the first thin film according to a second pattern derived but distinct from the first pattern;

forming a second mask according to a third pattern over the second stack;

performing a third etching on at least some of the thin films of the second stack using the second mask to pattern the at least some of the thin films of the second stack according to a third pattern.

17. The method for fabricating a thin-film structure according to claim 16, wherein the first mask and the second mask are a first resist mask and a second resist mask, respectively.

18. The method for fabricating a thin-film structure according to claim 17, wherein the first resist mask comprises a depressed portion and is formed by using a multi-tone mask; and wherein the second resist mask is obtained by making the first resist mask reduce so a to remove the depressed portion, thereby forming the second resist mask according to the second pattern.

19. The method for fabricating a thin-film structure according to claim 16, wherein the first etching is a dry etching; and wherein the second etching is a wet etching.

* * * * *